(12) United States Patent
Matsuda et al.

(10) Patent No.: US 9,917,110 B2
(45) Date of Patent: Mar. 13, 2018

(54) SEMICONDUCTOR DEVICE

(71) Applicant: SEMICONDUCTOR ENERGY LABORATORY CO., LTD., Atsugi-shi, Kanagawa-ken (JP)

(72) Inventors: Shinpei Matsuda, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/125,845

(22) PCT Filed: Mar. 9, 2015

(86) PCT No.: PCT/IB2015/051697
§ 371 (c)(1),
(2) Date: Sep. 13, 2016

(87) PCT Pub. No.: WO2015/136427
PCT Pub. Date: Sep. 17, 2015

(65) Prior Publication Data
US 2017/0018577 A1 Jan. 19, 2017

(30) Foreign Application Priority Data

Mar. 14, 2014 (JP) .................... 2014-052500
Apr. 28, 2014 (JP) .................... 2014-092697
Jun. 23, 2014 (JP) .................... 2014-128454

(51) Int. Cl.
*H01L 27/12* (2006.01)
*H01L 29/786* (2006.01)
(Continued)

(52) U.S. Cl.
CPC ........ *H01L 27/1225* (2013.01); *H01L 27/127* (2013.01); *H01L 29/7869* (2013.01);
(Continued)

(58) Field of Classification Search
CPC ... H01L 27/12; H01L 27/127; H01L 27/1225; H01L 29/08; H01L 29/04; H01L 29/24;
(Continued)

(56) References Cited

U.S. PATENT DOCUMENTS

| 7,674,650 B2 | 3/2010 | Akimoto et al. |
| 7,732,819 B2 | 6/2010 | Akimoto et al. |

(Continued)

FOREIGN PATENT DOCUMENTS

| CN | 102484140 A | 5/2012 |
| CN | 102738206 A | 10/2012 |

(Continued)

OTHER PUBLICATIONS

Fang.F et al., "Hot Electron Effects and Saturation Velocities in Silicon Inversion Layers", J. Appl. Phys. (Journal of Applied Physics), Mar. 15, 1970, vol. 41, No. 4, pp. 1825-1831.

(Continued)

*Primary Examiner* — Chuong A Luu
(74) *Attorney, Agent, or Firm* — Fish & Richardson P.C.

(57) ABSTRACT

A semiconductor device that is suitable for miniaturization is provided. The semiconductor device has a plurality of different transistors, active layers of the plurality of transistors are each an oxide semiconductor, and in the plurality of transistors, field-effect mobility of a transistor whose channel length is maximum and field-effect mobility of a transistor whose channel length is minimum are substantially constant. Alternatively, when channel lengths ranges from 0.01 μm to 100 μm, a reduction in field-effect mobility of a transistor whose channel length is minimum with respect to field-effect mobility of a transistor whose channel length is maximum is less than or equal to 70%.

16 Claims, 66 Drawing Sheets

(51) Int. Cl.
*H01L 29/04* (2006.01)
*H01L 29/24* (2006.01)

(52) U.S. Cl.
CPC ...... *H01L 29/78696* (2013.01); *H01L 29/045* (2013.01); *H01L 29/24* (2013.01)

(58) Field of Classification Search
CPC ....... H01L 29/66; H01L 29/78; H01L 29/045; H01L 29/7869; H01L 29/78696
USPC .......................................................... 257/43
See application file for complete search history.

(56) References Cited

U.S. PATENT DOCUMENTS

| | | | |
|---|---|---|---|
| 7,910,490 | B2 | 3/2011 | Akimoto et al. |
| 7,932,521 | B2 | 4/2011 | Akimoto et al. |
| 8,236,627 | B2 | 8/2012 | Tsubuku et al. |
| 8,274,077 | B2 | 9/2012 | Akimoto et al. |
| 8,405,092 | B2 | 3/2013 | Inoue et al. |
| 8,466,014 | B2 | 6/2013 | Tsubuku et al. |
| 8,466,463 | B2 | 6/2013 | Akimoto et al. |
| 8,629,069 | B2 | 1/2014 | Akimoto et al. |
| 8,669,550 | B2 | 3/2014 | Akimoto et al. |
| 8,790,959 | B2 | 7/2014 | Akimoto et al. |
| 8,796,069 | B2 | 8/2014 | Akimoto et al. |
| 8,884,302 | B2 | 11/2014 | Inoue et al. |
| 8,889,496 | B2 | 11/2014 | Tsubuku et al. |
| 9,099,562 | B2 | 8/2015 | Akimoto et al. |
| 2011/0059575 | A1 | 3/2011 | Tsubuku et al. |
| 2012/0061666 | A1* | 3/2012 | Inoue .................. H01L 27/1225 257/43 |
| 2012/0193620 | A1 | 8/2012 | Godo et al. |
| 2012/0261657 | A1 | 10/2012 | Takahashi et al. |
| 2012/0293200 | A1* | 11/2012 | Takemura .......... H03K 19/1736 326/38 |
| 2014/0042433 | A1 | 2/2014 | Yamazaki |
| 2015/0044818 | A1 | 2/2015 | Tsubuku et al. |

FOREIGN PATENT DOCUMENTS

| | | |
|---|---|---|
| CN | 104584229 A | 4/2015 |
| JP | 2007-096055 A | 4/2007 |
| JP | 2007-123861 A | 5/2007 |
| JP | 2008-311342 A | 12/2008 |
| JP | 2011-077514 A | 4/2011 |
| JP | 2012-084864 A | 4/2012 |
| JP | 2012-231133 A | 11/2012 |
| JP | 2012-256838 A | 12/2012 |
| JP | 2013-175708 A | 9/2013 |
| JP | 2013-211536 A | 10/2013 |
| JP | 2013-232567 A | 11/2013 |
| JP | 2014-057051 A | 3/2014 |
| KR | 2012-0063506 A | 6/2012 |
| KR | 2012-0117005 A | 10/2012 |
| KR | 2013-0105856 A | 9/2013 |
| TW | 201125045 | 7/2011 |
| TW | 201230341 | 7/2012 |
| TW | 201249752 | 12/2012 |
| TW | 201411848 | 3/2014 |
| WO | WO-2011/027715 | 3/2011 |
| WO | WO-2012/035984 | 3/2012 |
| WO | WO-2014/025002 | 2/2014 |

OTHER PUBLICATIONS

Scharfetter.D et al., "Large-Signal Analysis of a Silicon Read Diode Oscillator", IEEE Transactions on Electron Devices, 1969, vol. ED-16, No. 1, pp. 64-77.
International Search Report (Application No. PCT/IB2015/051697) dated Jun. 9, 2015.
Written Opinion (Application No. PCT/IB2015/051697) dated Jun. 9, 2015.

* cited by examiner

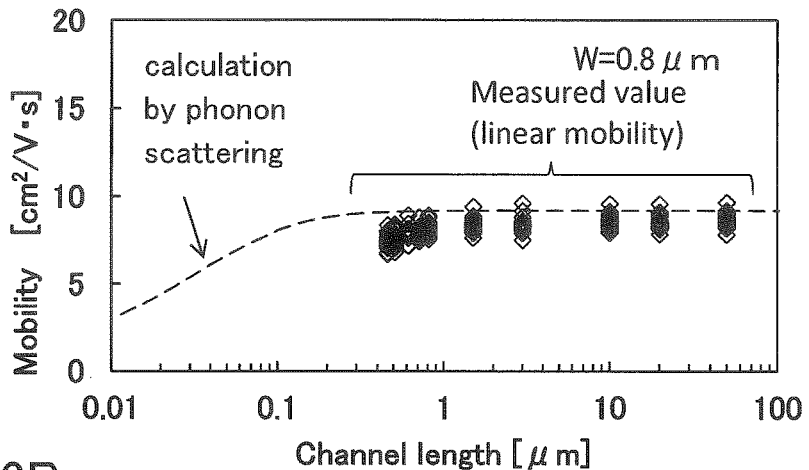
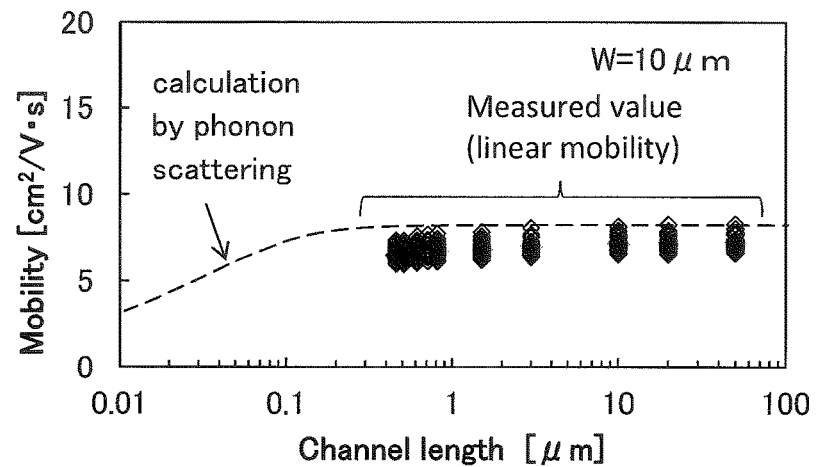
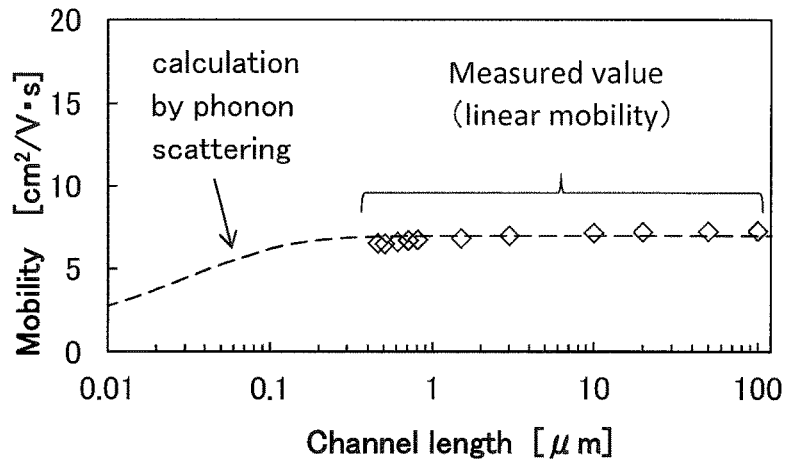

FIG. 33A
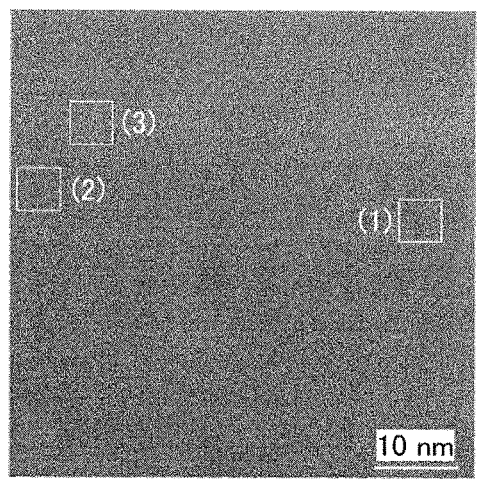
FIG. 33B        FIG. 33C        FIG. 33D
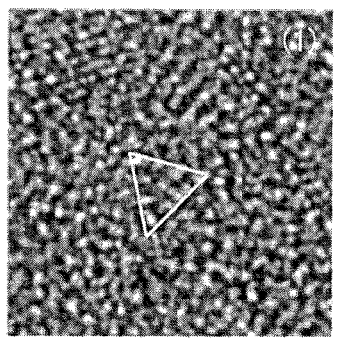   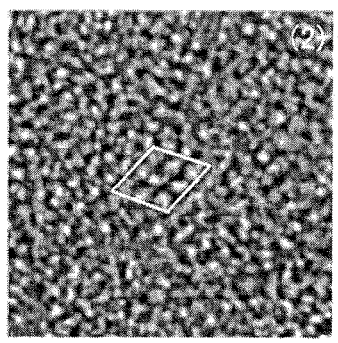   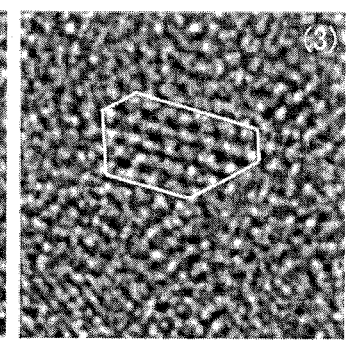

An electron beam is incident in a direction parallel to the sample surface.

An electron beam is incident in a direction perpendicular to the sample surface.

Initial state ($V_oH$)

$V_oH$

Final state ($V_o$, H-O)

$V_o$ bonding with O

Initial state ($V_oH$)

$V_oH$

Final state ($V_o$, H–O)

$V_o$ bonding with O

L/W=95nm/47nm

L/W=0.81μm/10μm

L/W=10μm/10μm

L/W=100μm/10μm

Unit cell of single crystal IGZO (In:Ga:Zn=1:1:1 (atomic ratio)) and reciprocal lattice thereof Dispersion relation of phonon in single crystal IGZO (In:Ga:Zn=1:1:1(atomic ratio))

L/W=0.3μm/8.0μm

L/W=0.45μm/8.0μm

L/W=0.75μm/8.0μm

L/W=0.95μm/8.0μm

L/W=1.95μm/8.0μm

L/W=7.95μm/8.0μm

Heated Substrate

FIG. 60A
FIG. 60B
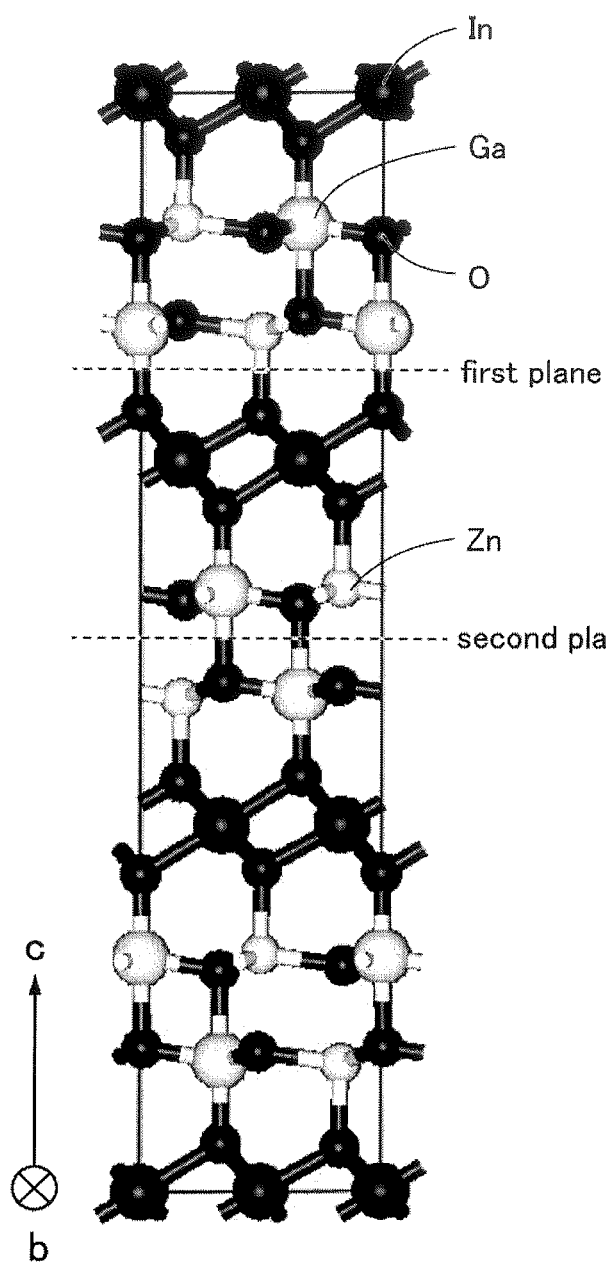
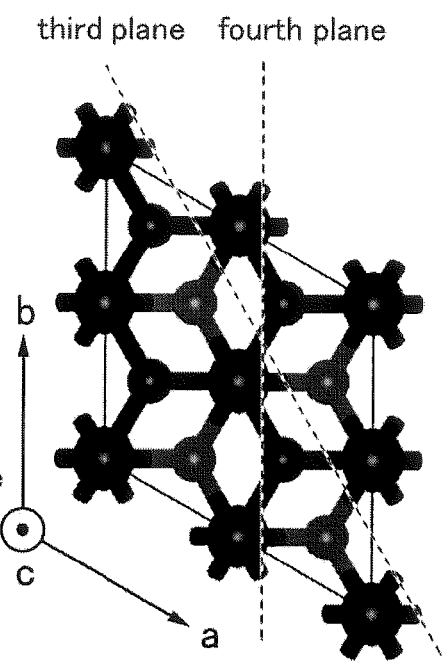
InGaZnO$_4$

FIG. 62A
FIG. 62B
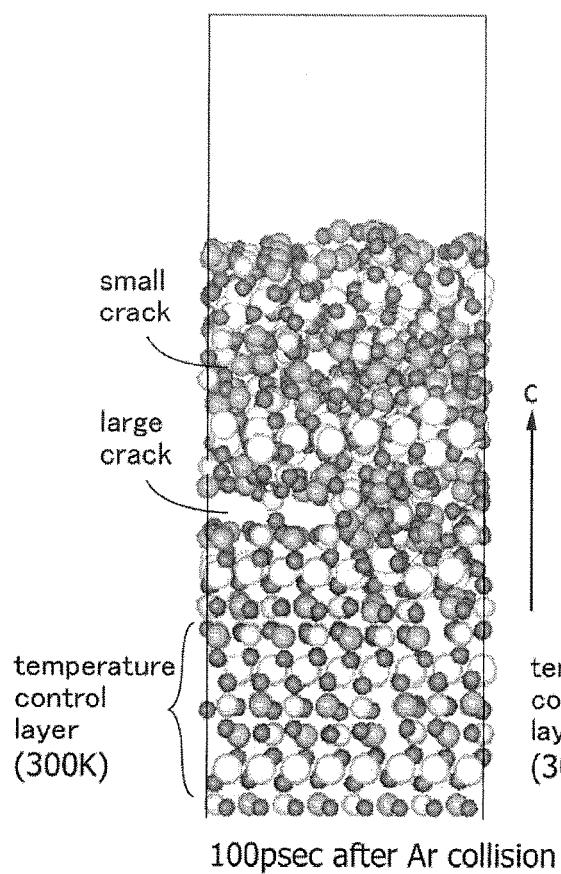
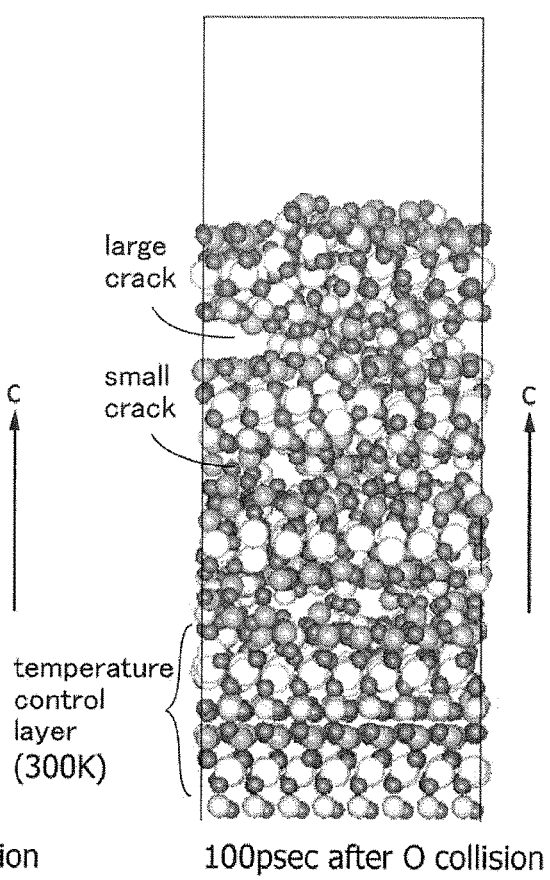
100psec after Ar collision
100psec after O collision
In : ○  Ga : ○  Zn : ◉  O : ●

Zn in the third layer (Zn-O layer) is reached to the vicinity of the sixth layer (Zn-O layer)

trajectories of atoms
0~0.3psec after Ar incidence

Zn in the third layer (Zn-O layer) is not beyond the fifth layer (In-O layer)

trajectories of atoms
0~0.3psec after O incidence

CAAC-OS film    1 nm

Target    1 nm

SEMICONDUCTOR DEVICE

TECHNICAL FIELD

One embodiment of the present invention relates to a semiconductor device using an oxide semiconductor, and a manufacturing method thereof.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Therefore, more specifically, as examples of the technical field of one embodiment of the present invention disclosed in this specification, a semiconductor device, a display device, a liquid crystal display device, a light-emitting device, a lighting device, a power storage device, a memory device, a method for driving them, or a method for manufacturing them can be given.

Note that in this specification and the like, a semiconductor device generally means a device that can function by utilizing semiconductor characteristics. A transistor and a semiconductor circuit are embodiments of semiconductor devices. In addition, a memory device, a display device, or an electronic device includes a semiconductor device in some cases.

BACKGROUND ART

A technique by which a transistor is formed using a semiconductor thin film formed over a substrate having an insulating surface has been attracting attention. The transistor is used in a wide range of electronic devices such as an integrated circuit (IC) or an image display device (also simply referred to as a display device). A silicon-based semiconductor material is widely known as a semiconductor thin film applicable to the transistor, but an oxide semiconductor has been attracting attention as an alternative material.

For example, a technique for manufacturing a transistor using zinc oxide or an In—Ga—Zn-based oxide semiconductor as an oxide semiconductor is disclosed (see Patent Documents 1 and 2).

PRIOR ART DOCUMENTS

Patent Documents

Patent Document 1: Japanese Published Patent Application No. 2007-123861
Patent Document 2: Japanese Published Patent Application No. 2007-096055

SUMMARY OF THE INVENTION

Problems to be Solved by the Invention

An object of one embodiment of the present invention is to provide a semiconductor device that is suitable for miniaturization. An object thereof is to provide favorable electrical characteristics to a semiconductor device. Alternatively, an object thereof is to provide a semiconductor device with a high on-state current. Alternatively, a problem thereof is to provide a semiconductor device that is suitable for high speed operation. Alternatively, an object thereof is to provide a highly integrated semiconductor device. Alternatively, an object thereof is to provide a semiconductor device with low power consumption. Alternatively, an object thereof is to provide a highly reliable semiconductor device. Alternatively, an object thereof is to provide a semiconductor device that can retain data even when power supply is stopped. Alternatively, an object thereof is to provide a novel semiconductor device.

Note that the descriptions of these problems do not disturb the existence of other problems. Note that in one embodiment of the present invention, there is no need to achieve all the problems. Note that other problems will be apparent from the descriptions of the specification, the drawings, the claims, and the like and can be derived from the descriptions of the specification, the drawings, the claims, and the like.

Means for Solving the Problems

One embodiment of the present invention relates to a transistor having an oxide semiconductor layer in a channel formation region.

One embodiment of the present invention disclosed in this specification is a semiconductor device having a plurality of transistors with different channel lengths, characterized in that active layers of the plurality of transistors are each an oxide semiconductor, and that in the plurality of transistors, field-effect mobility of a transistor whose channel length is maximum and field-effect mobility of a transistor whose channel length is minimum are substantially constant.

One embodiment of the present invention disclosed in this specification is a semiconductor device having a plurality of transistors with different channel lengths, characterized in that active layers of the plurality of transistors are each an oxide semiconductor, and that when channel lengths of the plurality of transistors are 0.01 μm to 100 μm, a reduction in field-effect mobility of a transistor whose channel length is minimum with respect to field-effect mobility of a transistor whose channel length is maximum is less than or equal to 70%.

In addition, one embodiment of the present invention disclosed in this specification is a semiconductor device having a plurality of transistors with different channel lengths, characterized in that active layers of the plurality of transistors are each an oxide semiconductor, and that when channel lengths of the plurality of transistors are 0.1 μm to 100 μm, a reduction in field-effect mobility of a transistor whose channel length is minimum with respect to field-effect mobility of a transistor whose channel length is maximum is less than or equal to 20%.

In addition, one embodiment of the present invention disclosed in this specification is a semiconductor device having a plurality of transistors with different channel lengths, characterized in that active layers of the plurality of transistors are each an oxide semiconductor, and that when channel lengths of the plurality of transistors are 1 μm to 100 μm, a reduction in field-effect mobility of a transistor whose channel length is minimum with respect to field-effect mobility of a transistor whose channel length is maximum is less than or equal to 10%.

In addition, another embodiment of the present invention disclosed in this specification is a semiconductor device having a plurality of transistors whose channel lengths ranges from 0.01 μm to 10 μm, characterized in that the plurality of transistors includes a plurality of transistors whose active layers are each an oxide semiconductor and a plurality of transistors whose active layers are each silicon, and a ratio of field-effect mobility of a transistor whose channel length is maximum, which is included in the plurality of transistors whose active layers are each an oxide semiconductor, to field-effect mobility of a transistor whose channel length is minimum, which is included in the plurality of transistors whose active layers are each silicon, is greater than or equal to a thirtieth.

The above oxide semiconductor preferably has In, Zn, and M (M is Al, Ti, Ga, Y, Zr, La, Ce, Nd, or Hf).

In addition, the above oxide semiconductor preferably has a region with a hydrogen concentration of lower than or equal to $2 \times 10^{20}$ atoms/cm$^3$.

In addition, the above oxide semiconductor preferably has a region with a nitrogen concentration of lower than $5 \times 10^{19}$ atoms/cm$^3$.

In addition, the above oxide semiconductor preferably has a region with a silicon concentration of lower than $1 \times 10^{19}$ atoms/cm$^3$.

Effect of the Invention

By using one embodiment of the present invention, a semiconductor device that is suitable for miniaturization can be provided. Favorable electrical characteristics can be provided to a semiconductor device. Alternatively, a semiconductor device with a high on-state current can be provided. Alternatively, a semiconductor device that is suitable for high-speed operation can be provided. Alternatively, a highly integrated semiconductor device can be provided. Alternatively, a semiconductor device with low power consumption can be provided. Alternatively, a highly reliable semiconductor device can be provided. Alternatively, a semiconductor device that can retain data even when power supply is stopped can be provided. Alternatively, a novel semiconductor device can be provided. Alternatively, a manufacturing method of the semiconductor device can be provided.

Note that the description of these effects does not disturb the existence of other effects. Note that one embodiment of the present invention does not necessarily have all of these effects. Note that the other effects will be apparent from the descriptions of the specification, the drawings, the claims, and the like and can be derived from the descriptions of the specification, the drawings, the claims, and the like.

BRIEF DESCRIPTION OF THE DRAWINGS

FIG. 6 Graphs each showing a comparison between measured values of channel length dependence of mobility and calculated values of channel length dependence of mobility due to phonon scattering, of an OS transistor.

FIG. 33 Cs-corrected high-resolution TEM images of a plane of a CAAC-OS.

FIG. 5 A graph showing channel length dependence of mobility of an OS transistor and channel length dependence of mobility of a Si transistor.

FIG. 60 Diagrams showing an $InGaZnO_4$ crystal.

FIG. 61 Diagrams showing the structure of $InGaZnO_4$ before collision of an atom, and the like.

FIG. 62 Diagrams showing the structure of $InGaZnO_4$ after collision of an atom, and the like.

MODE FOR CARRYING OUT THE INVENTION

Figure 1:
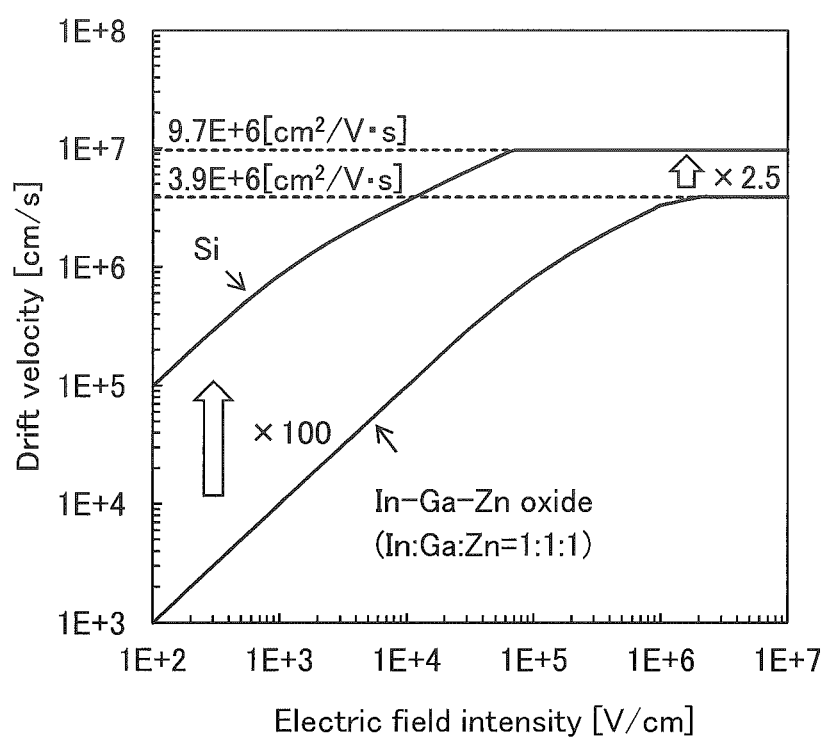
FIG. 1 A graph showing electric field intensity dependence of drift velocity.

Embodiments will be described in detail using the drawings. However, the present invention is not limited to the description below, and it is easily understood by those skilled in the art that modes and details can be modified in various ways without departing from the spirit and the scope of the present invention. Therefore, the present invention is not construed as being limited to the description of the embodiments below. Note that in structures of the present invention described below, the same portions or portions having similar functions are denoted by the same reference numerals in different drawings, and description thereof is not repeated in some cases. It is to be noted that in some cases, hatching of the same components that constitute a drawing is omitted or changed as appropriate in different drawings.

Note that in this specification and the like, when it is explicitly described that X and Y are connected, the case where X and Y are electrically connected, the case where X and Y are functionally connected, and the case where X and Y are directly connected are included therein. Here, X and Y each denote an object (e.g., a device, an element, a circuit, a wiring, an electrode, a terminal, a conductive film, a layer, or the like). Accordingly, without limiting to a predetermined connection relation, for example, a connection relation shown in drawings or texts, another element other than the connection relation shown in the drawings or the texts may be included.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that a switch has a function of being controlled to be turned on or off. That is, a switch has a function of being conducting (in an on state) or not conducting (in an off state) and controlling whether to feed current therethrough or not. Alternatively, the switch has a function of selecting and switching a current path.

For example, in the case where X and Y are functionally connected, one or more circuits that enable functional connection between X and Y (e.g., a logic circuit (an inverter, a NAND circuit, a NOR circuit, or the like); a signal converter circuit (a DA converter circuit, an AD converter circuit, a gamma correction circuit, or the like); a potential level converter circuit (a power supply circuit (a step-up circuit, a step-down circuit, and the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, and the like); a signal generation circuit; a memory circuit; a control circuit; or the like) can be connected between X and Y. When a signal output from X is transmitted to Y, it can be said as an example that X and Y are functionally connected even if another circuit is provided between X and Y.

Note that when it is explicitly described that X and Y are connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that X and Y are electrically connected, the description is the same as the case where it is explicitly only described that they are connected.

Note that even when components that are independent in a circuit diagram are illustrated as if they are electrically connected to each other, one component has functions of a plurality of components in some cases. For example, when part of a wiring also functions as an electrode, one conductive film has both functions of the components, the function of the wiring and the function of the electrode. Thus, electrical connection in this specification includes in its category such a case where one conductive film has functions of a plurality of components.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using the following expressions.

For example, it is possible to express "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it is possible to express "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it is possible to express "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this connection order". When the connection order in a circuit configuration is defined with a way of expression similar to the above examples, a source (or a first terminal or the like) and a drain (or a second terminal or the like) of a transistor can be distinguished from each other to specify the technical scope. Note that these ways of expression are examples and there is no limitation on the ways of expression. Here, X, Y, Z1, and Z2 each denote an object (e.g., a device, an element, a circuit, a wiring, an electrode, a terminal, a conductive film, and a layer).

Note that in this specification and the like, a transistor can be formed using a variety of substrates. The type of a substrate is not limited to a certain type. As an example of the substrate, there is a semiconductor substrate (e.g., a single crystal substrate or a silicon substrate), an SOI substrate, a glass substrate, a quartz substrate, a plastic substrate, a metal substrate, a stainless steel substrate, a substrate having stainless steel foil, a tungsten substrate, a substrate having tungsten foil, a flexible substrate, an attachment film, paper including a fibrous material, a base material film, or the like. As an example of the glass substrate, there is a barium borosilicate glass substrate, an aluminoborosilicate glass substrate, a soda lime glass substrate, or the like. As an example of the flexible substrate, there is a synthetic resin having flexibility such as plastic typified by polyethylene terephthalate (PET), polyethylene naphthalate (PEN), and polyether sulfone (PES), or acrylic. As an example of the attachment film, there is polypropylene, polyester, polyvinyl fluoride, polyvinyl chloride, or the like. As an example of the base material film, there is polyester, polyamide, polyimide, an inorganic vapor deposition film, paper, or the like. Specifically, when a transistor is manufactured using a semiconductor substrate, a single crystal substrate, an SOI substrate, or the like, it is possible to manufacture a transistor with few variations in characteristics, size, shape, or the like, with high current supply capability, and with a small size. By forming a circuit with the use of such a transistor, low power consumption of the circuit or high integration of the circuit can be achieved.

Alternatively, a flexible substrate may be used as the substrate, and the transistor may be formed directly on the flexible substrate. Alternatively, a separation layer may be provided between the substrate and the transistor. After part or the whole of a semiconductor device is completed over the separation layer, the separation layer can be used to transfer the semiconductor device onto another substrate by being separated from the substrate. In such a case, the transistor can be transferred to a substrate having low heat resistance or a flexible substrate as well. Note that for the above separation layer, a structure of a stacked-layer structure of inorganic films, which are a tungsten film and a silicon oxide film, a structure in which an organic resin film of polyimide or the like is formed over a substrate, or the like can be used, for example.

In other words, a transistor may be formed using one substrate, and then transferred to another substrate, so that the transistor may be provided over another substrate. As an example of a substrate to which a transistor is transferred, there is a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupra, rayon, or regenerated polyester), or the like), a leather substrate, a rubber substrate, or the like, in addition to the above-described substrates over which transistors can be formed. By using these substrates, it is possible to achieve formation of a transistor with excellent characteristics, formation of a transistor with low power consumption, manufacture of a device that hardly breaks, provision of heat resistance, or reduction in weight or thickness.

(Embodiment 1)

In this embodiment, an oxide semiconductor of one embodiment of the present invention and a transistor using the oxide semiconductor will be described.

In this embodiment, excellent switching characteristics of a field-effect transistor using an oxide semiconductor for a semiconductor layer where a channel is formed (hereinafter an OS transistor) will be described. Obtained calculation results and measurement results will be described focusing particularly on channel length dependence of electron mobility, switching speed, and frequency characteristics.

The OS transistor has smaller channel length dependence than a field-effect transistor using silicon for a semiconductor layer where a channel is formed (hereinafter a Si transistor), and there is no clear reduction in field-effect mobility even when channel length is shortened from 10 μm to 100 nm. This is due to the following reasons.

Carrier conduction mechanism can be expressed as in Formula 1 by Matthiessen's rule.

$$\frac{1}{\mu_{\mathit{eff}}} = \frac{1}{\mu_{CD}} + \frac{1}{\mu_{phonon}} + \frac{1}{\mu_{impurity}} + \frac{1}{\mu_{roughness}} \qquad [\text{Formula 1}]$$

In Formula 1, $\mu_{\mathit{eff}}$ represents effective mobility. $\mu_{CD}$ represents scattering by Cation Disorder, which corresponds to scattering or the like due to random arrangement of Ga and Zn in the case of, for example, an In—Ga—Zn oxide which is one of oxide semiconductors. In Formula 1, $\mu_{phonon}$ represents scattering by phonon (lattice vibration) (hereinafter also referred to as phonon scattering), and there are two kinds of acoustic phonon scattering and optical phonon scattering. In addition, $\mu_{impurity}$ represents scattering by a charged impurity such as a donor ion (hereinafter also referred to as impurity scattering). In addition, $\mu_{roughness}$ represents scattering by roughness of an interface between an insulating film and a semiconductor film (hereinafter also referred to as interface scattering).

It is possible to reduce interface scattering in Formula 1 with a buried channel. In addition, it is possible to reduce impurity scattering by forming a highly purified intrinsic semiconductor layer. Therefore, the major scattering factor of the effective mobility of electrons in an oxide semiconductor is scattering by Cation Disorder or phonon scattering depending on the composition of a semiconductor.

When the channel length of a transistor is shortened, it corresponds to that the electric field intensity of a drain in the channel length direction is intensified. The following calculation was performed because the electric field intensity might have an intense relationship with phonon scattering.

In the case where phonon scattering can be ignored and the intensity of drift electric field (a drain electric field) is small, drift velocity of electrons is proportional to the electric field intensity as shown in Formula 2.

$$v_d = \mu_0 E \quad \text{[Formula 2]}$$

In Formula 2, $v_d$ represents drift velocity of electrons, $\mu_0$ represents mobility of the electrons at a low electric field, and a proportionality coefficient E between the drift velocity of the electrons and the drift electric field represents electric field intensity.

When a channel length is shortened and the drain electric field intensity becomes high, the drift velocity of the electrons is accelerated, resulting in a state in which the electron temperature is higher than the lattice temperature (hot electron). Hot electrons easily dissipate energy by exciting acoustic phonon and the proportional relationship shown in Formula 2 is not applied. In consideration of energy dissipation by acoustic phonon, the relationship between the drift velocity of the electrons and the drift electric field is modified as shown in Formula 3.

$$v_d = \mu_0 E \sqrt{\frac{T}{T_e}} \quad \text{[Formula 3]}$$

In Formula 3, $T_e$ represents an electron temperature, and T represents a lattice temperature. In addition, $T_e/T$ can be expressed by Formula 4.

$$\frac{T_e}{T} = \frac{1}{2}\left\{1 + \left[1 + \frac{3\pi}{8}\left(\frac{\mu_0 E}{C_S}\right)^2\right]^{1/2}\right\} \quad \text{[Formula 4]}$$

In Formula 4, $C_s$ represents sound velocity in a solid. The process of scattering other than phonon scattering is included in $\mu_0$. Formula 3 and Formula 4 show that when the drift velocity of the electrons is accelerated to exceed the sound velocity of a crystal, the electron temperature becomes higher than the lattice temperature and the electrons easily dissipate energy.

When the electrons are further accelerated and the kinetic energy of the electrons becomes as high as energy $E_p$ of optical phonon, electrons dissipates all energy obtained from the electric field by excitation of optical phonon. Therefore, even when the electric field is strengthened, the drift velocity of the electrons does not increase any more. This is a phenomenon called velocity saturation, and the velocity of the electrons that causes velocity saturation (saturation velocity) $V_{SAT}$ can be expressed by Formula 5. In Formula 5, $m_0$ represents the mass of a free electron.

$$V_{sat} = \sqrt{\frac{8 E_P}{3\pi m_0}} \quad \text{[Formula 5]}$$

Table 1 shows the relationship between the drift velocity of the electrons and phonon scattering.

TABLE 1

| $v_d \ll C_S$ | $C_S < v_d$ | $\frac{1}{2} m_0 v_d^2 \sim E_P$ |
|---|---|---|
| proportional to an electric field | scattering by acoustic phonon (energy dissipation) | scattering by optical phonon (energy dissipation) |
| $v_d = \mu_0 E$ | $v_d = \mu_0 E \sqrt{\frac{T}{T_e}}$ | $V_{sat} = \sqrt{\frac{8 E_P}{3\pi m_0}}$ |

Calculation was performed on electric field intensity dependence of the drift velocity of electrons. FIG. 1 shows electric field intensity dependence of the drift velocity of electrons of a Si transistor and an In—Ga—Zn oxide transistor (In:Ga:Zn=1:1:1 (atomic ratio)) as a typical example of an OS transistor.

The calculation was performed using Formula 2 in the case where phonon scattering was able to be ignored ($v_d \ll C_s$) and Formula 3 in the case where acoustic phonon scattering was considered ($C_s < v_d$). In addition, Formula 5 was used in the case where optical phonon scattering was considered ($\frac{1}{2} m_0 v_d^2 \sim E_p$).

Parameters as shown in Table 2 were used in the case where calculation was performed on a Si transistor and an OS transistor. Note that $m_0$ represents the mass of an electron at rest. In this embodiment, the calculation is performed on the assumption that an oxide semiconductor used for the OS transistor is an In—Ga—Zn oxide (In:Ga:Zn=1:1:1 (atomic ratio)).

TABLE 2

|  | Si | OS: IGZO(111) | Unit |
|---|---|---|---|
| $\mu_0$ (drift mobility at a low electric field) | 1000 | 10 | cm²/Vsec |
| $C_s$ (sound velocity in a crystal) | 7E+05 | 6E+05 | cm/sec |
| $E_p$ (energy of optical phonon) | 63 | 10 | meV |

As shown in FIG. 1, in the Si transistor, the influence of scattering by acoustic phonon appears $10^3$ (V/cm), and velocity saturation by optical phonon occurs $10^5$ (V/cm).

As shown in FIG. 1, even in the case of the OS transistor, the influence of scattering by acoustic phonon appears in a manner similar to that of the Si transistor, which is about $10^5$ (V/cm) or higher, and velocity saturation by optical phonon occurs after $10^6$ (V/cm). It is found from this result that mobility of the OS transistor is less likely to be reduced owing to electric field intensity dependence even when the channel length is shortened.

Figure 2:
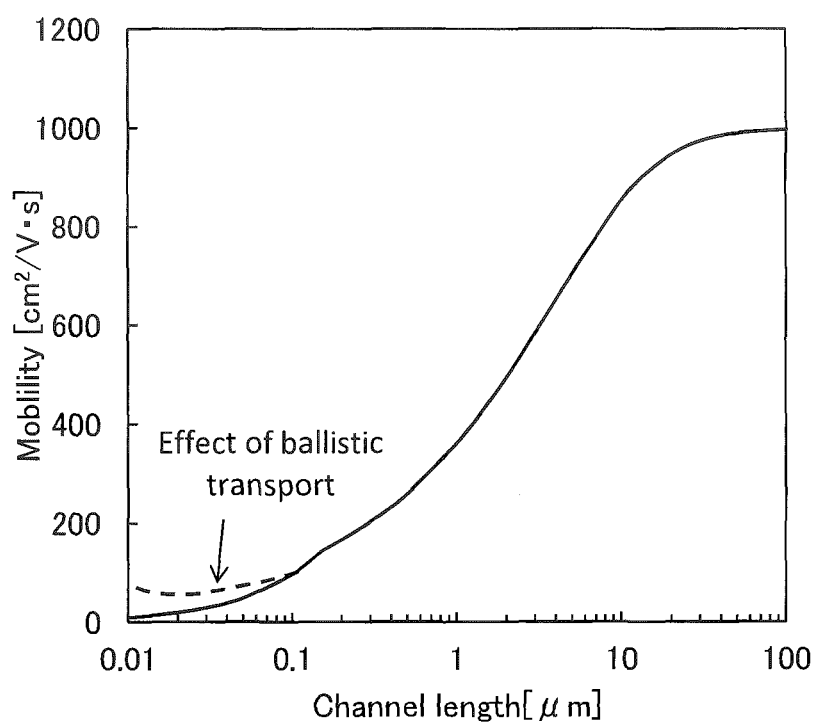
FIG. 2 A graph showing a calculated value of channel length dependence of mobility of a Si transistor.

Electric field intensity was converted into a channel length, and electron mobility was calculated as a ratio of the drift velocity of the electron to the electric field intensity. FIG. 2 shows calculation results of channel length dependence of electron mobility of a Si transistor when a drain voltage is fixed to 1 V.

It is found from FIG. 2 that in the Si transistor, electron mobility decreases by acoustic phonon scattering from when the channel length is about 10 μm or less. Note that when the channel length is about 100 nm or less in the Si transistor, a decrease in electron mobility is suppressed owing to the effect of a phenomenon called ballistic transport in which electrons injected from a source electrode reach a drain electrode without scattering. When the channel length is shortened to about 10 nm in the Si transistor, the electron mobility rises as indicated by, for example, the dashed line shown in FIG. 2 because the ballistic transport is dominant.

Figure 3:
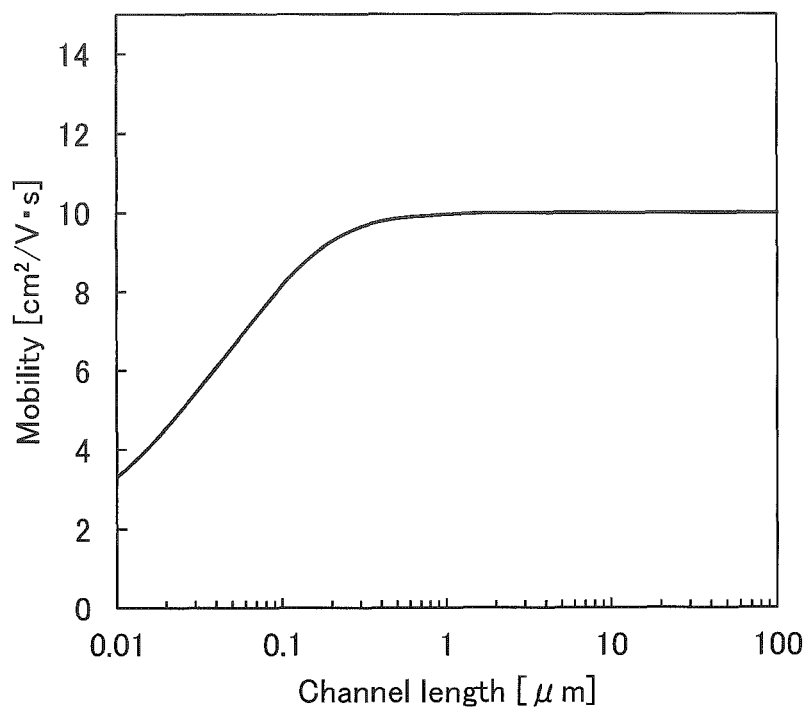
FIG. 3 A graph showing a calculated value of channel length dependence of mobility of an OS transistor.

FIG. 3 shows calculation results of channel length dependence of electron mobility of an OS transistor when a drain voltage is fixed to 1 V. A decrease in electron field-effect mobility by phonon scattering is not observed in the OS transistor down to the channel length of about 100 nm because hot carrier is less likely to occur. Therefore, with short channel lengths, a difference in electron field-effect mobility between the Si transistor and the OS transistor is to be narrowed.

In the OS transistor, even when the channel length is 1 μm, electron mobility that is almost the same as electron mobility when the channel length is 10 μm can be obtained. In the OS transistor, even when the channel length is 0.2 μm, a decrease in electron mobility is 10% or less of the electron mobility when the channel length is 10 μm. In the OS transistor, even when the channel length is 0.1 μm, a decrease in electron mobility is 20% or less of the electron mobility when the channel length is 10 μm. Even when the channel length is 0.01 μm, a decrease in electron mobility is 70% or less. In addition, the ratio of electron mobility between the OS transistor and the Si transistor, which was about a hundredth when the channel length was 10 μm, decreases to about a thirtieth when the channel length is 1 μm.

Figure 4:
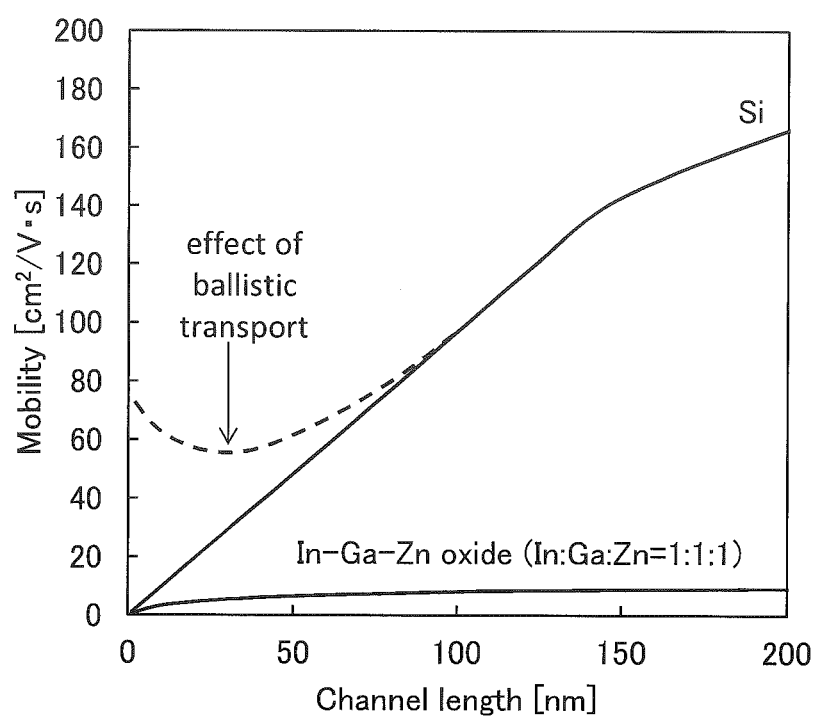
FIG. 4 A graph showing a comparison between channel length dependence of mobility of a Si transistor and channel length dependence of mobility of an OS transistor by calculation.

FIG. 4 shows channel length dependence of electron mobility in linear regions of a Si transistor and an OS transistor each with a channel length of 200 nm or less. As shown in FIG. 4, when the channel length is reduced to about 100 nm, a difference between electron mobility of the Si transistor and electron mobility of the OS transistor is narrowed. A reduction in electron mobility of the Si transistor with the channel length of 100 nm or less is suppressed owing to the effect of the ballistic transport that occurs in the Si transistor; however, the ratio of electron mobility between the OS transistor and the Si transistor, which is about a hundredth when the channel length is 10 μm, is reduced to about a tenth when the channel length is 100 nm or less.

Figure 5:
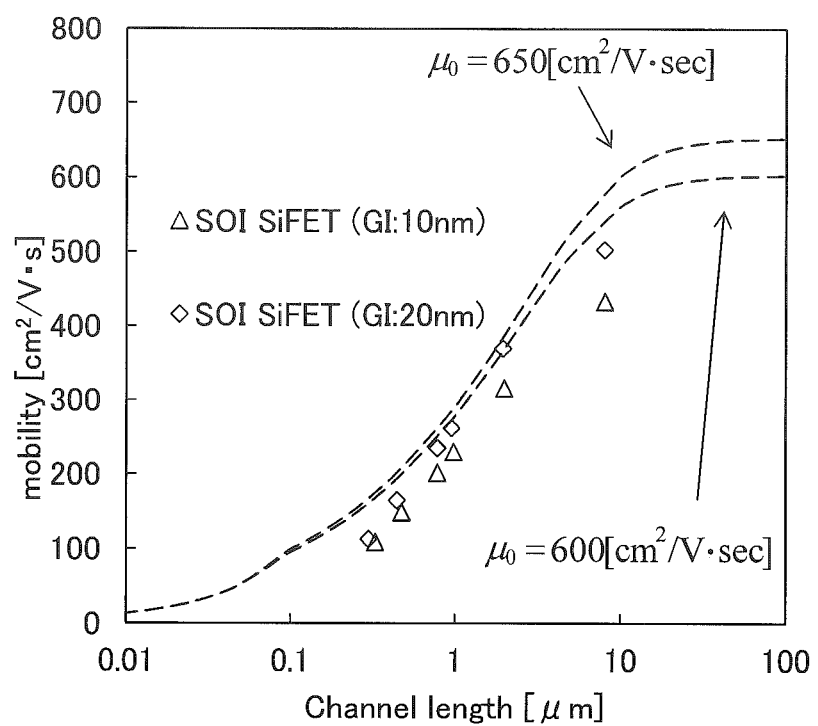
FIG. 5 A graph showing a comparison between measured values of channel length dependence of mobility and calculated values of channel length dependence of mobility due to phonon scattering, of a Si transistor.

FIG. 5 shows comparison between measured values of channel length dependence of electron field-effect mobility and calculated values of channel length dependence of electron mobility by phonon scattering in a linear region of a Si transistor (the channel width of 8 μm) using SOI (Silicon on insulator) when the drain voltage is fixed to 1 V. In FIG. 5, the channel length dependence of electron mobility was calculated by assuming that electron mobility at a low electric field is $\mu_0=650$ [cm$^2$/V·s] and $\mu_0=600$ [cm$^2$/V·s]. The tendencies toward channel length dependence of the measured values and the calculated values in FIG. 5 substantially well accord with each other, and this supports that phonon scattering due to hot carrier is a dominant factor for the channel length dependence of electron mobility.

Next, FIGS. 6(A) and (B) each show comparison between measured values of channel length dependence of electron field-effect mobility and calculated values of channel length dependence of electron mobility by phonon scattering in linear regions of OS transistors (the channel widths of 0.8 μm and 10 μm) when the drain voltages are each fixed to 0.1 V. In addition, FIG. 6(C) shows comparison between measured values of channel length dependence of electron field-effect mobility and calculated values of channel length dependence of electron mobility by phonon scattering in a linear region of an OS transistor (the channel width of 10 μm) when the drain voltage is fixed to 1 V. The tendencies toward channel length dependence of the measured values and the calculated values in FIGS. 6(A), (B), and (C) substantially well accord with each other. According to FIGS. 6(A), (B), and (C), even when the channel length is shortened to a channel length of 0.45 μm, the field-effect mobility in a linear region of an electron is almost constant and no clear defect of mobility due to acoustic phonon is observed.

It is found from these results that influence of channel length dependence of electron mobility in an OS transistor is not as large as that of channel length dependence of electron mobility in a Si transistor. Therefore, when an OS transistor is used for a transistor of 10 μm or less, a difference in field-effect mobility between the OS transistor and a Si transistor becomes smaller than the difference when the channel length of the transistor is 10 μm or more. When an OS transistor is used for a transistor with a channel length of 100 nm or less, the difference in the field-effect mobility can be reduced to about a thirtieth, preferably about a tenth and further preferably a third, of a Si transistor.

In addition, it is possible to improve the field-effect mobility of an OS transistor when scattering by Cation Disorder is reduced. Therefore, in the case where an OS transistor is used for a 100-nm-generation transistor, it is thought that field-effect mobility equivalent to that of a Si transistor can be achieved.

Note that an OS transistor has characteristics of a low off-state current. In a circuit using an OS transistor, a capacitor for holding charge can be made small because of the low off-state current. Thus, a miniaturized OS transistor can achieve switching speed and frequency characteristics that are equivalent to those of the Si transistor.

Note that this embodiment can be combined with the other embodiment and an example in this specification as appropriate.

(Embodiment 2)

In this embodiment, a transistor having an oxide semiconductor that can be used in one embodiment of the present invention will be described with reference to drawings. Note that in the drawings in this embodiment, some components are enlarged, reduced in size, or omitted for clarity.

Figure 7A:
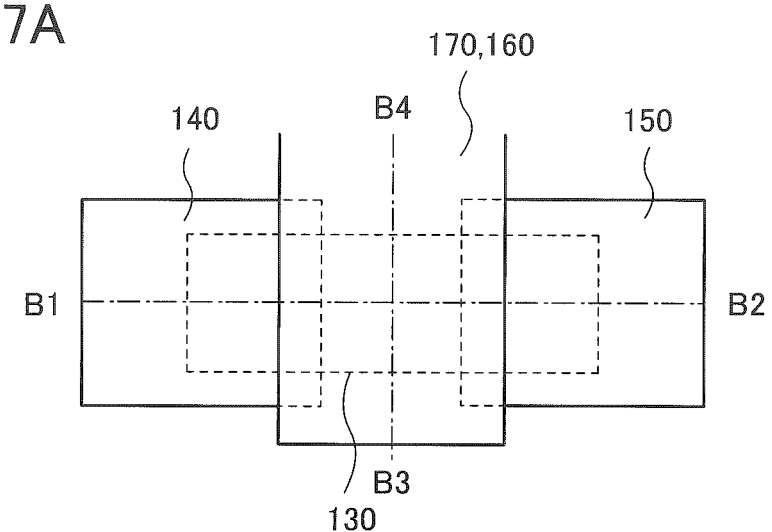
FIG. 7 A top view and a cross-sectional view illustrating a transistor.
Figure 13A:
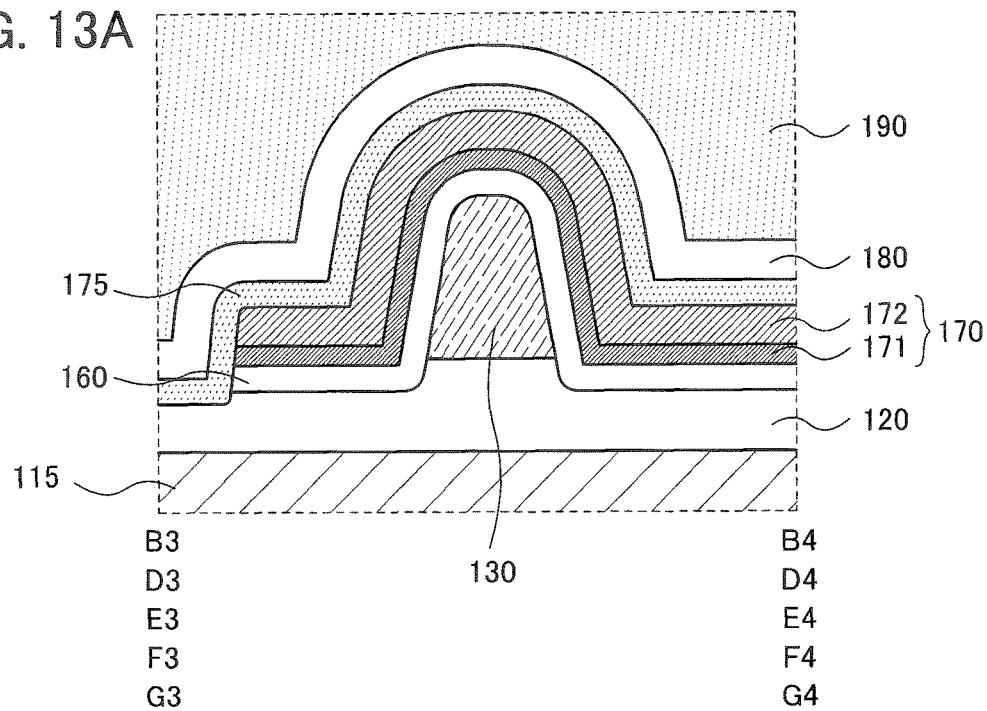
FIG. 13 Views each illustrating a cross section of a transistor in the channel width direction.

FIGS. 7(A) and (B) are a top view and a cross-sectional view illustrating a transistor 101 of one embodiment of the present invention. FIG. 7(A) is a top view, and a cross section in the direction of a dashed-dotted line B1-B2 shown in FIG. 7(A) corresponds to FIG. 7(B). In addition, a cross section in the direction of a dashed-dotted line B3-B4 shown in FIG. 7(A) corresponds to FIG. 13(A). In addition, in some cases, the direction of the dashed-dotted line B1-B2 is referred to as a channel length direction, and the direction of the dashed-dotted line B3-B4 is referred to as a channel width direction.

The transistor 101 has an insulating layer 120 in contact with a substrate 115; an oxide semiconductor layer 130 in contact with the insulating layer 120; a conductive layer 140 and a conductive layer 150 electrically connected to the oxide semiconductor layer 130; an insulating layer 160 in contact with the oxide semiconductor layer 130, the conductive layer 140, and the conductive layer 150; a conductive layer 170 in contact with the insulating layer 160; an insulating layer 175 in contact with the conductive layer 140, the conductive layer 150, the insulating layer 160, and the conductive layer 170; and an insulating layer 180 in contact with the insulating layer 175. In addition, the transistor 101 may also have an insulating layer 190 (planarization film) in contact with the insulating layer 180, or the like as necessary.

Here, the conductive layer 140, the conductive layer 150, the insulating layer 160, and the conductive layer 170 can function as a source electrode layer, a drain electrode layer, a gate insulating film, and a gate electrode layer, respectively.

Figure 7B:
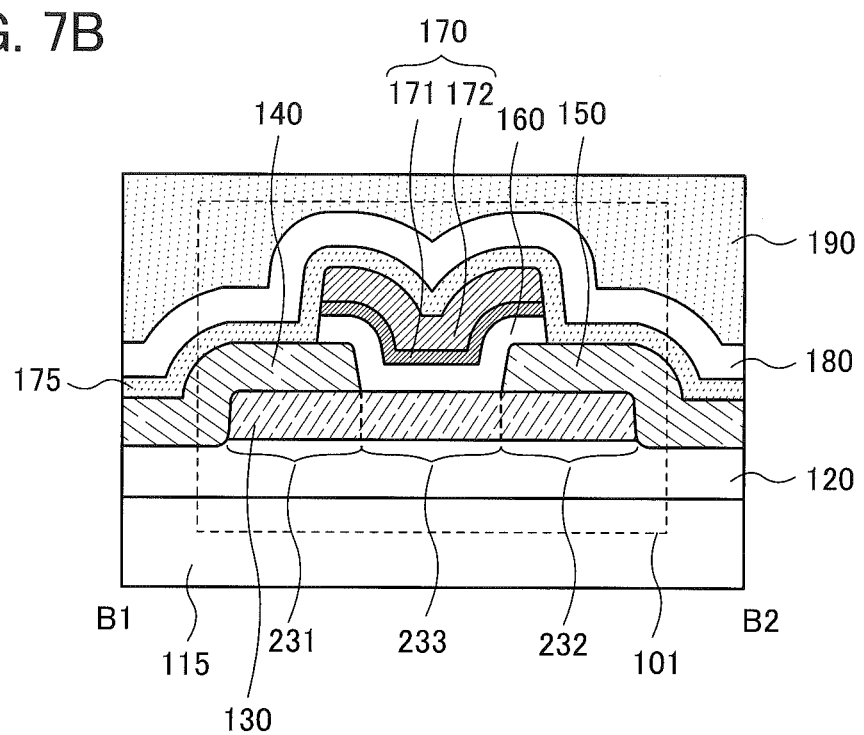

In addition, a region 231, a region 232, and a region 233 illustrated in FIG. 7(B) can function as a source region, a drain region, and a channel formation region, respectively. The region 231 and the region 232 are in contact with the conductive layer 140 and the conductive layer 150, respectively, and when a conductive material that is easily bonded to oxygen is used for the conductive layer 140 and the conductive layer 150, for example, the resistance of the region 231 and the region 232 can be reduced.

Specifically, since the oxide semiconductor layer 130 is in contact with the conductive layer 140 and the conductive layer 150, an oxygen vacancy is generated in the oxide semiconductor layer 130, and interaction between the oxygen vacancy and hydrogen that remains in the oxide semiconductor layer 130 or diffuses from the outside changes the region 231 and the region 232 to n-type regions with low resistance.

Note that functions of a "source" and a "drain" of a transistor are sometimes replaced with each other in the case where a transistor of opposite polarity is employed, the case where the direction of current flow is changed in circuit operation, or the like. Therefore, the terms "source" and "drain" can be used by being replaced with each other in this specification. In addition, "electrode layer" can be replaced with "wiring".

In addition, an example in which the conductive layer 170 is formed of two layers of a conductive layer 171 and a conductive layer 172 is illustrated; however, it may also be a single layer or a stack of three or more layers. This structure is also applicable to other transistors described in this embodiment.

In addition, an example in which each of the conductive layer 140 and the conductive layer 150 is formed of a single layer is illustrated; however, they may also be a lamination of two or more layers. This structure is also applicable to other transistors described in this embodiment.

Figure 8A:
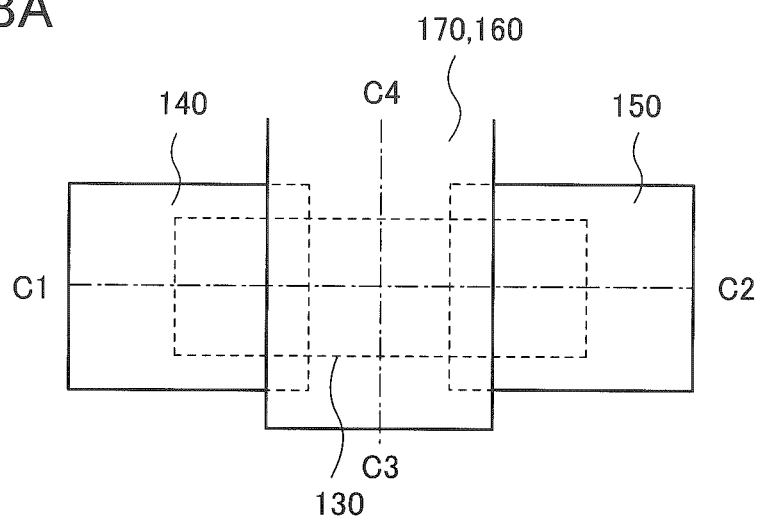
FIG. 8 A top view and a cross-sectional view illustrating a transistor.
Figure 8B:
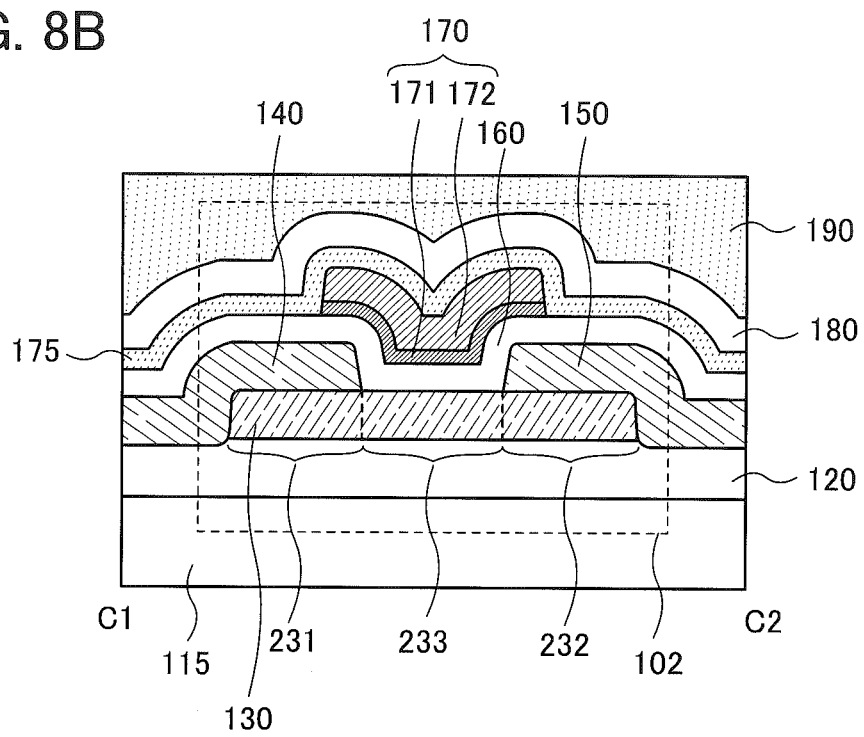
Figure 13B:
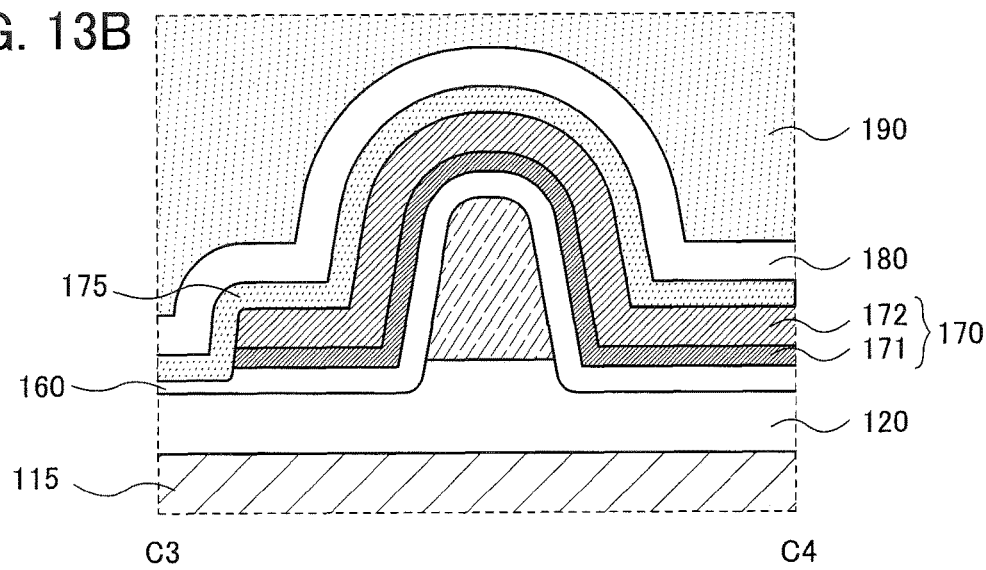

In addition, the transistor of one embodiment of the present invention may be a structure illustrated in FIGS. 8(A) and (B). FIG. 8(A) is a top view of a transistor 102, and a cross section in the direction of a dashed-dotted line C1-C2 shown in FIG. 8(A) corresponds to FIG. 8(B). In addition, a cross section in the direction of a dashed-dotted line C3-C4 shown in FIG. 8(A) corresponds to FIG. 13(B). In addition, in some cases, the direction of the dashed-dotted line C1-C2 is referred to as a channel length direction, and the direction of the dashed-dotted line C3-C4 is referred to as a channel width direction.

The transistor 102 has a similar structure to the transistor 101 except that an end portion of the insulating layer 160 operating as a gate insulating film is not aligned with an end portion of the conductive layer 170 operating as a gate electrode layer. In the structure of the transistor 102, the conductive layer 140 and the conductive layer 150 are widely covered with the insulating layer 160 and accordingly the resistance between the conductive layer 140 and the conductive layer 150, and the conductive layer 170 is high; therefore, the transistor 102 has a feature of low gate leakage current.

The transistor 101 and the transistor 102 are each a top-gate structure having a region where the conductive layer 170 and each of the conductive layer 140 and the conductive layer 150 overlap with each other. To reduce parasitic capacitance, the width of the region in the channel length direction is preferably greater than or equal to 3 nm and less than 300 nm. Meanwhile, since an offset region is not formed in the oxide semiconductor layer 130, a transistor with a high on-state current can be easily formed.

Figure 9A:
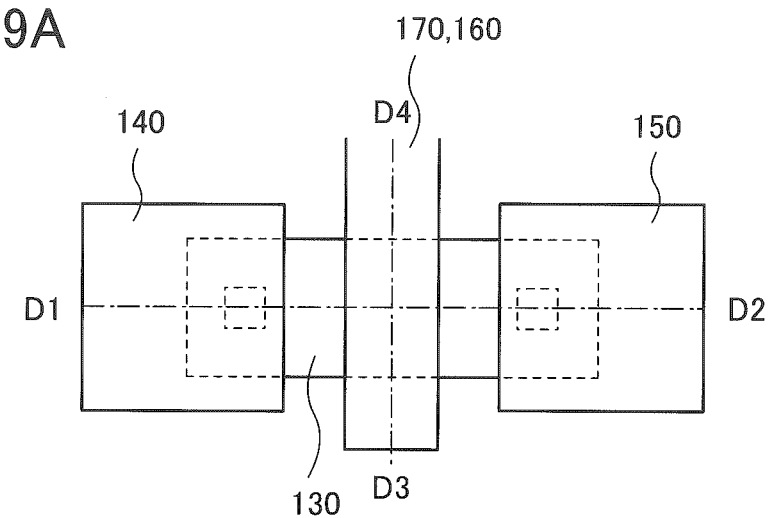
FIG. 9 A top view and a cross-sectional view illustrating a transistor.

In addition, the transistor of one embodiment of the present invention may be a structure illustrated in FIGS. 9(A) and (B). FIG. 9(A) is a top view of a transistor 103, and a cross section in the direction of a dashed-dotted line D1-D2 shown in FIG. 9(A) corresponds to FIG. 9(B). In addition, a cross section in the direction of a dashed-dotted line D3-D4 shown in FIG. 9(A) corresponds to FIG. 13(A). In addition, in some cases, the direction of the dashed-dotted line D1-D2 is referred to as a channel length direction, and the direction of the dashed-dotted line D3-D4 is referred to as a channel width direction.

The transistor 103 has the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layer 140 and the conductive layer 150 electrically connected to the oxide semiconductor layer 130 through openings provided in the insulating layer 175 and the insulating layer 180. In addition, the transistor 103 may also have the insulating layer 190 (planarization film) in contact with the insulating layer 180, the conductive layer 140, and the conductive layer 150, or the like as necessary.

Here, the conductive layer 140, the conductive layer 150, the insulating layer 160, and the conductive layer 170 can function as a source electrode layer, a drain electrode layer, a gate insulating film, and a gate electrode layer, respectively.

Figure 9B:
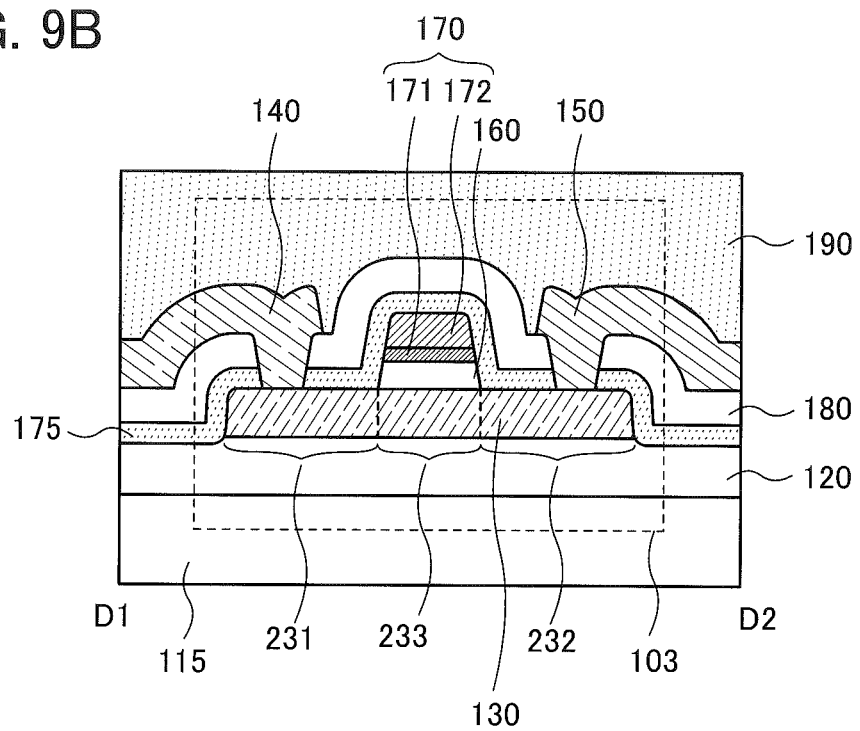

In addition, the region 231, the region 232, and the region 233 illustrated in FIG. 9(B) can function as a source region, a drain region, and a channel formation region, respectively. The region 231 and the region 232 are in contact with the insulating layer 175, and when an insulating material containing hydrogen is used for the insulating layer 175, for example, the resistance of the region 231 and the region 232 can be reduced.

Specifically, interaction between an oxygen vacancy generated in the region 231 and the region 232 by the steps up to the formation of the insulating layer 175 and hydrogen that diffuses from the insulating layer 175 into the region 231 and the region 232 changes the region 231 and the region 232 to n-type regions with low resistance. Note that as the insulating material containing hydrogen, for example, a silicon nitride film, an aluminum nitride film, or the like can be used.

Figure 10A:
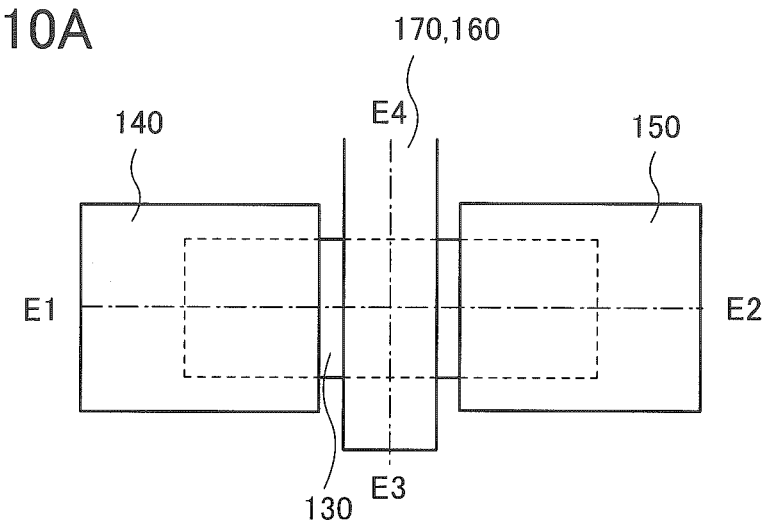
FIG. 10 A top view and a cross-sectional view illustrating a transistor.

In addition, the transistor of one embodiment of the present invention may be a structure illustrated in FIGS. 10(A) and (B). FIG. 10(A) is a top view of a transistor 104, and a cross section in the direction of a dashed-dotted line E1-E2 shown in FIG. 10(A) corresponds to FIG. 10(B). In addition, a cross section in the direction of a dashed-dotted line E3-E4 shown in FIG. 10(A) corresponds to FIG. 13(A). In addition, in some cases, the direction of the dashed-dotted line E1-E2 is referred to as a channel length direction, and the direction of the dashed-dotted line E3-E4 is referred to as a channel width direction.

The transistor 104 has a similar structure to the transistor 103 except that the conductive layer 140 and the conductive layer 150 are in contact with the oxide semiconductor layer 130 so as to cover end portions thereof.

Figure 10B:
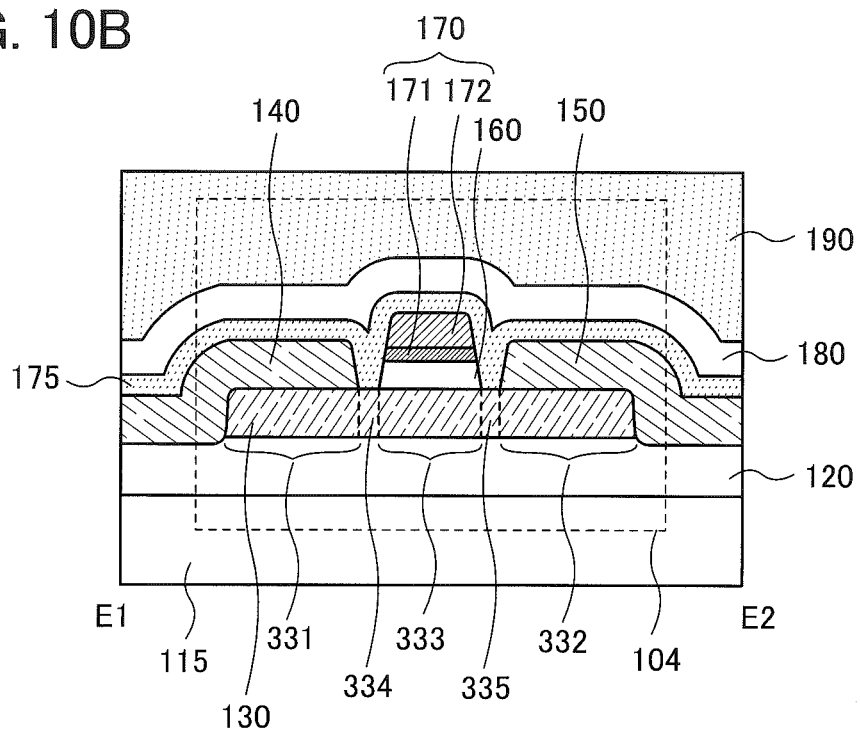

In addition, illustrated in FIG. 10(B), a region 331 and a region 334 can function as a source region, a region 332 and a region 335 can function as a drain region, and a region 333 can function as a channel formation region. The resistance of the region 331 and the region 332 can be reduced in a manner similar to that of the region 231 and the region 232 in the transistor 101. In addition, the resistance of the region 334 and the region 335 can be reduced in a manner similar to that of the region 231 and the region 232 in the transistor 103. Note that in the case where the width of the region 334 and the region 335 in the channel length direction is less than or equal to 100 nm, preferably less than or equal to 50 nm, an on-state current does not decrease significantly owing to contribution of a gate electric field; therefore, a structure in which a reduction in resistance as described above is not performed can also be employed.

The transistor 103 and the transistor 104 each have a self-aligned structure not having a region where the conductive layer 170 and each of the conductive layer 140 and the conductive layer 150 overlap with each other. A transistor with a self-aligned structure is suitable for applications that require high-speed operation because parasitic capacitance between a gate electrode layer and each of a source electrode layer and a drain electrode layer is extremely small.

Figure 11A:
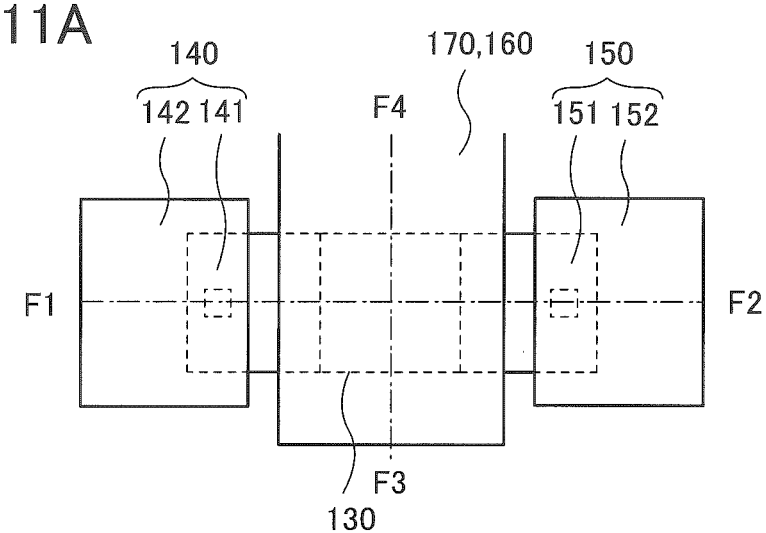
FIG. 11 A top view and a cross-sectional view illustrating a transistor.
Figure 11B:
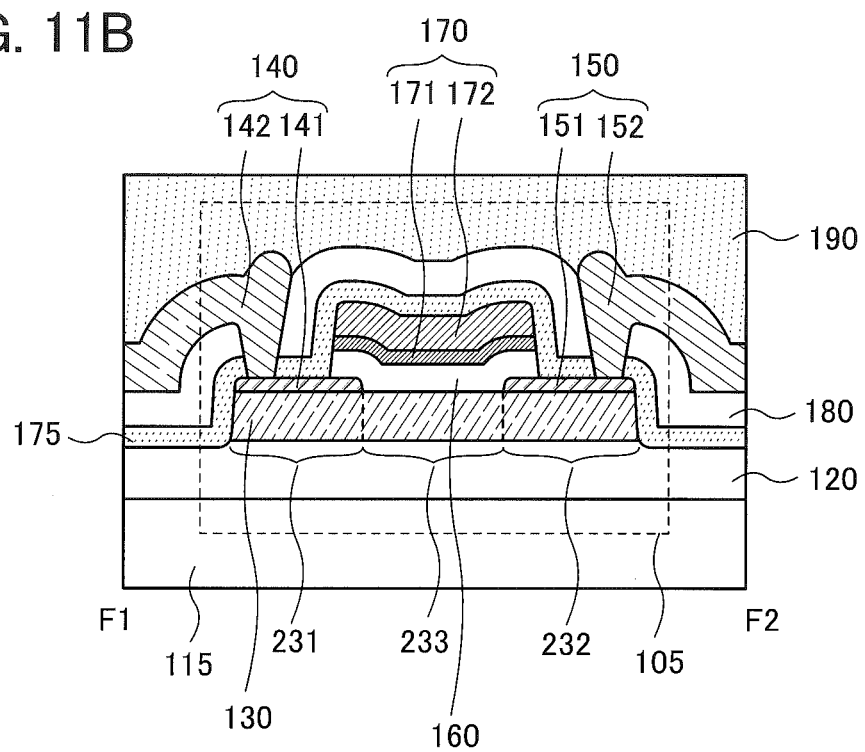

In addition, the transistor of one embodiment of the present invention may be a structure illustrated in FIGS. 11(A) and (B). FIG. 11(A) is a top view of a transistor 105, and a cross section in the direction of a dashed-dotted line F1-F2 shown in FIG. 11(A) corresponds to FIG. 11(B). In addition, a cross section in the direction of a dashed-dotted line F3-F4 shown in FIG. 1(A) corresponds to FIG. 13(A). In addition, in some cases, the direction of the dashed-dotted line F1-F2 is referred to as a channel length direction, and the direction of the dashed-dotted line F3-F4 is referred to as a channel width direction.

The transistor 105 has the insulating layer 120 in contact with the substrate 115; the oxide semiconductor layer 130 in contact with the insulating layer 120; a conductive layer 141 and a conductive layer 151 electrically connected to the oxide semiconductor layer 130; the insulating layer 160 in contact with the oxide semiconductor layer 130, the conductive layer 141, and the conductive layer 151; the conductive layer 170 in contact with the insulating layer 160; the insulating layer 175 in contact with the oxide semiconductor layer 130, the conductive layer 141, the conductive layer 151, the insulating layer 160, and the conductive layer 170; the insulating layer 180 in contact with the insulating layer 175; and a conductive layer 142 and a conductive layer 152 electrically connected to the conductive layer 141 and the conductive layer 151, respectively, through openings provided in the insulating layer 175 and the insulating layer 180. In addition, the transistor 105 may also have the insulating layer 190 (planarization film) in contact with the insulating layer 180, the conductive layer 142, and the conductive layer 152, or the like as necessary.

Here, the transistor 105 has a structure in which the conductive layer 141 and the conductive layer 151 are in contact with the top surface of the oxide semiconductor layer 130 and are not in contact with side surfaces thereof.

The transistor 105 has a similar structure to the transistor 101 except having the conductive layer 141 and the conductive layer 151, having the openings provided in the insulating layer 175 and the insulating layer 180, and having the conductive layer 142 and the conductive layer 152 electrically connected to the conductive layer 141 and the conductive layer 151, respectively, through the openings. The conductive layer 140 (the conductive layer 141 and the conductive layer 142) can operate as a source electrode layer, and the conductive layer 150 (the conductive layer 151 and the conductive layer 152) can operate as a drain electrode layer.

Figure 12A:
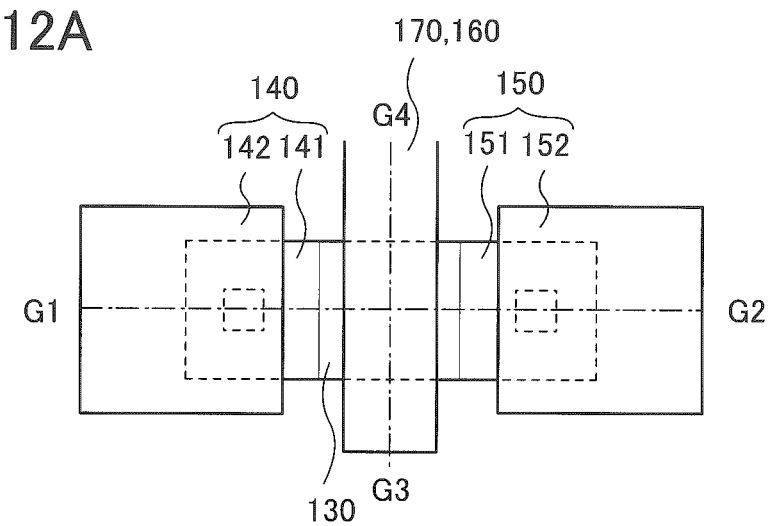
FIG. 12 A top view and a cross-sectional view illustrating a transistor.
Figure 12B:
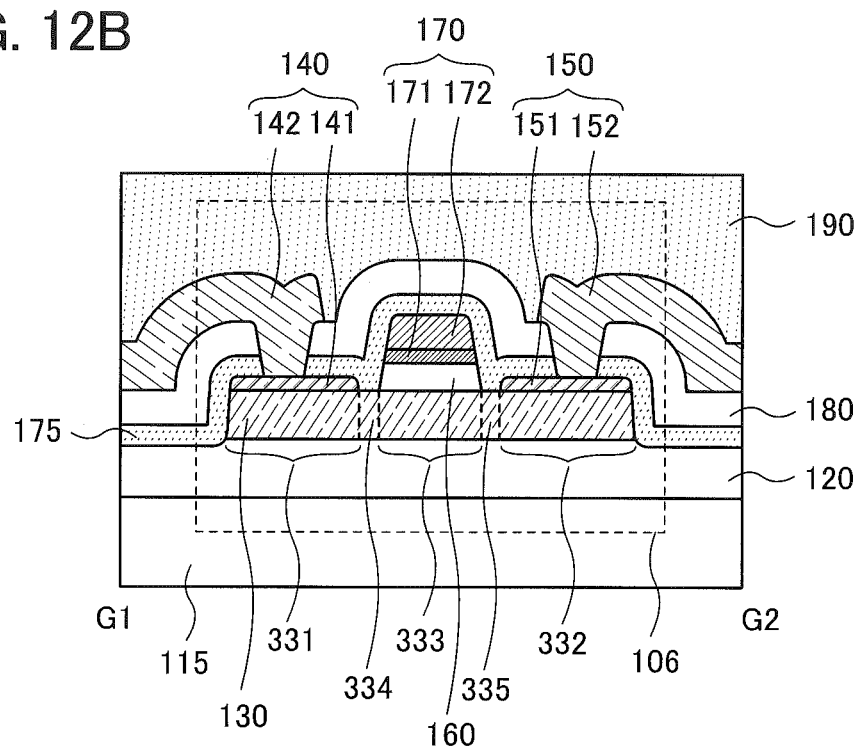

In addition, the transistor of one embodiment of the present invention may be a structure illustrated in FIGS. 12(A) and (B). FIG. 12(A) is a top view of a transistor 106, and a cross section in the direction of a dashed-dotted line G1-G2 shown in FIG. 12(A) corresponds to FIG. 12(B). In addition, a cross section in the direction of a dashed-dotted line G3-G4 shown in FIG. 12(A) corresponds to FIG. 13(A). In addition, in some cases, the direction of the dashed-dotted line G1-G2 is referred to as a channel length direction, and the direction of the dashed-dotted line G3-G4 is referred to as a channel width direction.

The transistor 106 has the insulating layer 120 in contact with the substrate 115; the oxide semiconductor layer 130 in contact with the insulating layer 120; the conductive layer 141 and the conductive layer 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layer 141, the conductive layer 151, the insulating layer 160, and the conductive layer 170; the insulating layer 180 in contact with the insulating layer 175; and the conductive layer 142 and the conductive layer 152 electrically connected to the conductive layer 141 and the conductive layer 151, respectively, through openings provided in the insulating layer 175 and the insulating layer 180. In addition, the transistor 106 may also have the insulating layer 190 (planarization film) in contact with the insulating layer 180, the conductive layer 142, and the conductive layer 152, or the like as necessary.

Here, the transistor 106 has a structure in which the conductive layer 141 and the conductive layer 151 are in contact with the top surface of the oxide semiconductor layer 130 and are not in contact with side surfaces thereof.

The transistor 106 has a similar structure to the transistor 103 except having the conductive layer 141 and the conductive layer 151. The conductive layer 140 (the conductive layer 141 and the conductive layer 142) can operate as a source electrode layer, and the conductive layer 150 (the conductive layer 151 and the conductive layer 152) can operate as a drain electrode layer.

The structures of the transistor 105 and the transistor 106 are each a structure in which the conductive layer 140 and the conductive layer 150 are not in contact with the insulating layer 120; therefore, the insulating layer 120 becomes less likely to be deprived of oxygen by the conductive layer 140 and the conductive layer 150 and oxygen supply from the insulating layer 120 to the oxide semiconductor layer 130 can be facilitated.

Note that an impurity for forming an oxygen vacancy to increase conductivity may be added to the region 231 and the region 232 in the transistor 103 and the region 334 and the region 335 in the transistor 104 and the transistor 106. As an impurity for forming an oxygen vacancy in an oxide semiconductor layer, for example, one or more selected from any of phosphorus, arsenic, antimony, boron, aluminum, silicon, nitrogen, helium, neon, argon, krypton, xenon, indium, fluorine, chlorine, titanium, zinc, and carbon can be used. As a method for adding the impurity, plasma treatment, an ion implantation method, an ion doping method, a plasma immersion ion implantation method, or the like can be used.

When the above element is added as an impurity element to the oxide semiconductor layer, a bond between a metal element and oxygen in the oxide semiconductor layer is cut, whereby an oxygen vacancy is formed. Interaction between an oxygen vacancy included in the oxide semiconductor layer and hydrogen that remains in the oxide semiconductor layer or is added thereto later can increase the conductivity of the oxide semiconductor layer.

Note that when hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Note that here, an oxide semiconductor having become a conductor is referred to as an oxide conductor.

The oxide conductor is a degenerate semiconductor and it is assumed that the conduction band edge equals to or substantially equals to the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 14A:
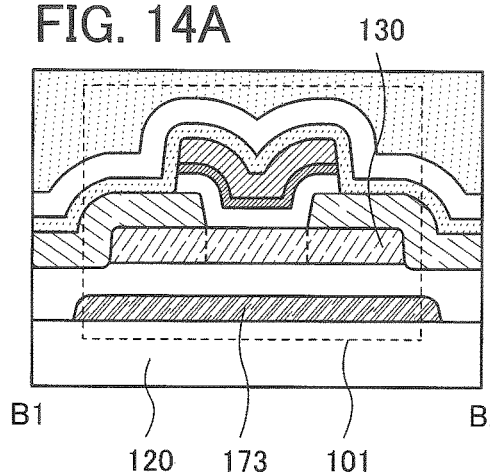
FIG. 14 Views each illustrating a cross section of a transistor in the channel length direction.
Figure 14B:
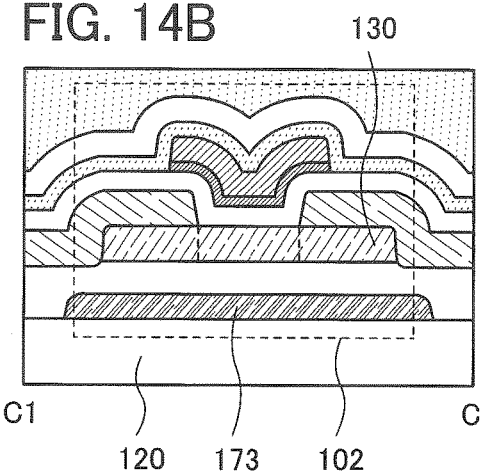
Figure 14C:
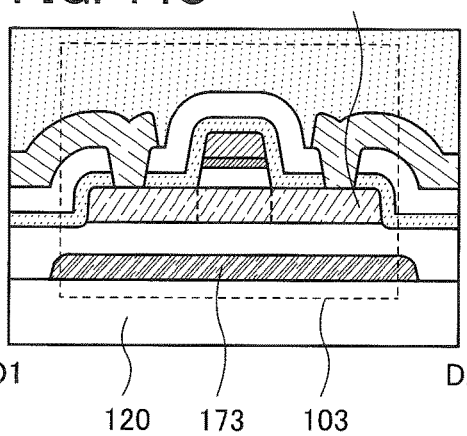
Figure 14D:
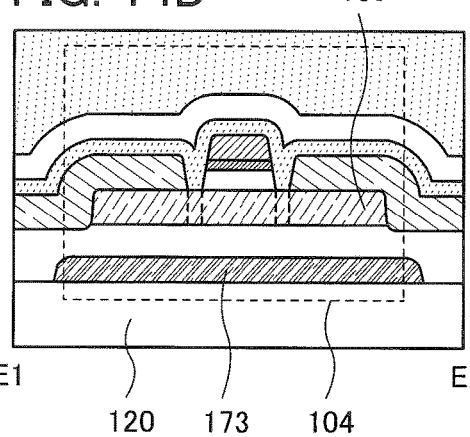
Figure 14E:
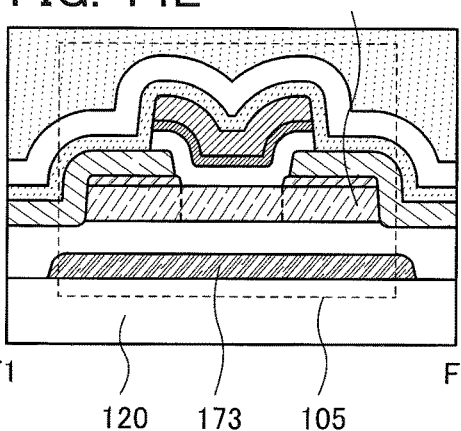
Figure 14F:
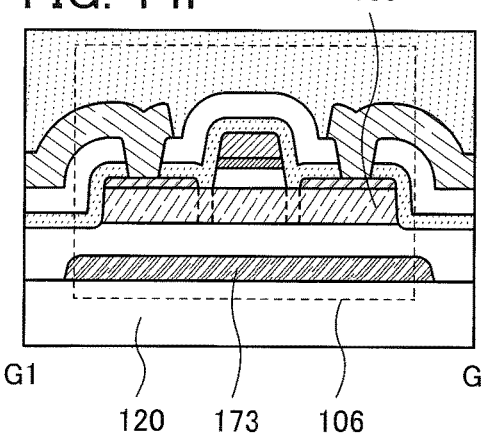
Figure 15A:
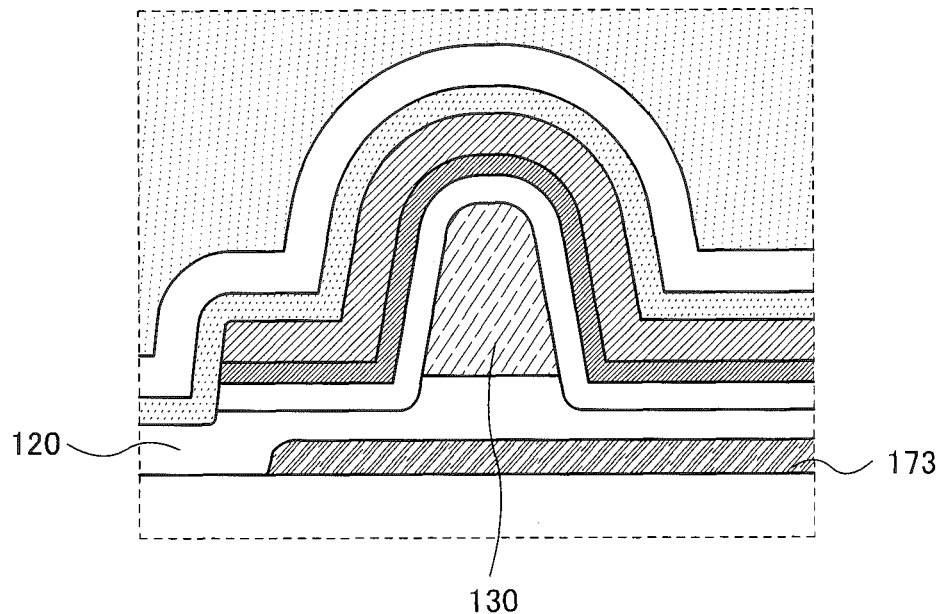
FIG. 15 Views each illustrating a cross section of a transistor in the channel width direction.

In addition, the transistor of one embodiment of the present invention may be provided with a conductive layer 173 between the oxide semiconductor layer 130 and the substrate 115 as in the cross-sectional views in the channel length direction in FIGS. 14(A), (B), (C), (D), (E), and (F) and the cross-sectional views in the channel width direction in FIGS. 15(A) and (B). The on-state current can be further increased or the threshold voltage can be further controlled by using the conductive layer as a second gate electrode layer (back gate). Note that in the cross-sectional views in FIGS. 14(A), (B), (C), (D), (E), and (F), the width of the conductive layer 173 may be shorter than that of the oxide semiconductor layer 130. Furthermore, the width of the conductive layer 173 may be shorter than that of the conductive layer 170.

Figure 15B:
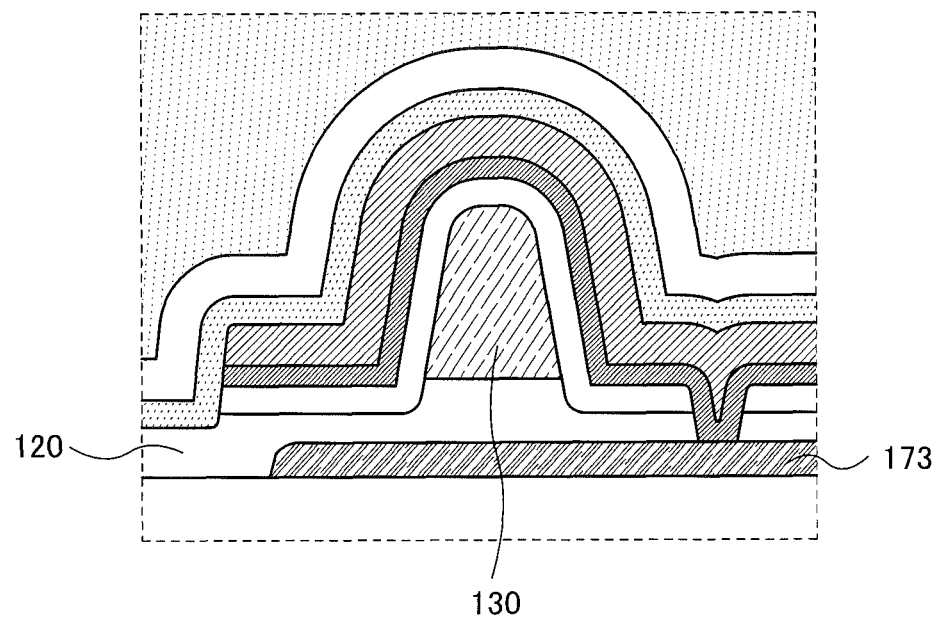

In order to increase the on-state current, for example, the conductive layer 170 and the conductive layer 173 are set to the same potential, and the transistor is driven as a double-gate transistor. Furthermore, to control the threshold voltage, a fixed potential, which is different from a potential of the conductive layer 170, is supplied to the conductive layer 173. To set the conductive layer 170 and the conductive layer 173 to the same potential, for example, as illustrated in FIG. 15(B), the conductive layer 170 and the conductive layer 173 may be electrically connected to each other through a contact hole.

In the transistor 101 to the transistor 106 in FIG. 7 to FIG. 12, examples in which the oxide semiconductor layer 130 is a single layer are illustrated; alternatively, the oxide semiconductor layer 130 may be a stack. The oxide semiconductor layer 130 of the transistor 101 to the transistor 106 can be replaced with the oxide semiconductor layer 130 illustrated in FIG. 16 or FIG. 17.

Figure 16A:
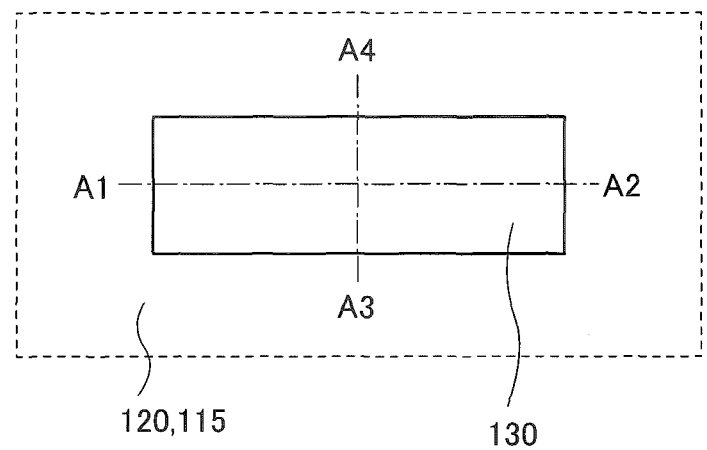
FIG. 16 A top view and cross-sectional views illustrating a semiconductor layer.
Figure 16B:
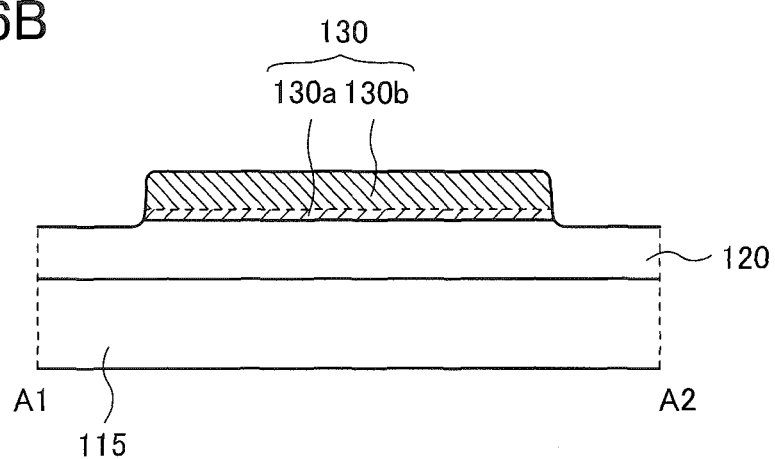
Figure 16C:
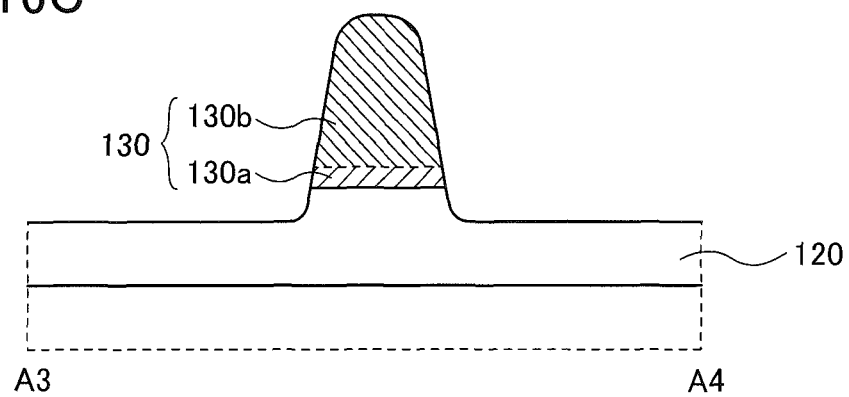

FIGS. 16(A), (B), and (C) are a top view and cross-sectional views of the oxide semiconductor layer 130 with a two-layer structure. FIG. 16(A) is the top view, and a cross section in the direction of a dashed-dotted line A1-A2 shown in FIG. 16(A) corresponds to FIG. 16(B). In addition, a cross section in the direction of a dashed-dotted line A3-A4 shown in FIG. 16(A) corresponds to FIG. 16(C).

Figure 17A:
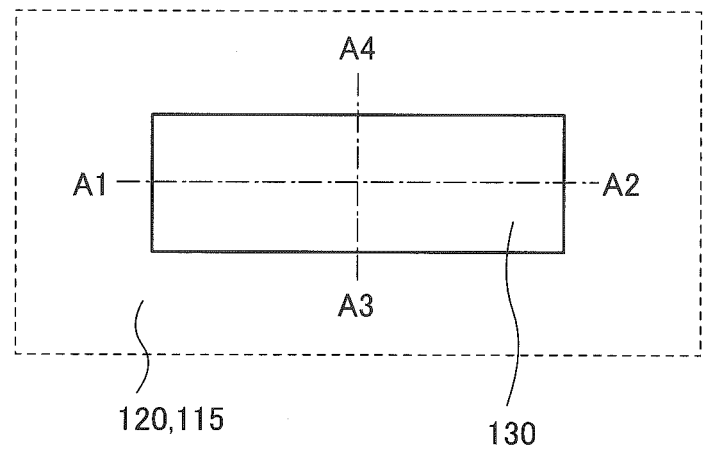
FIG. 17 A top view and cross-sectional views illustrating a semiconductor layer.
Figure 17B:
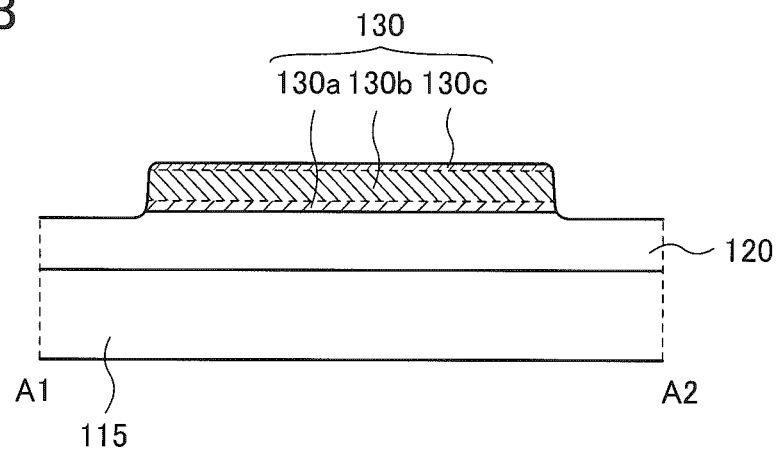
Figure 17C:
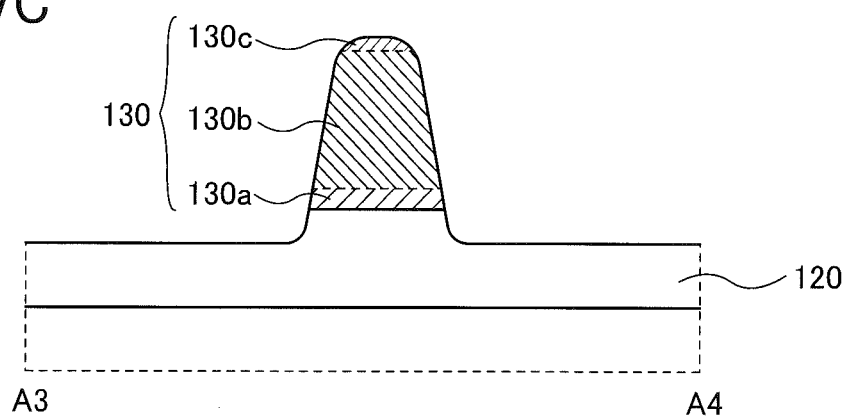

In addition, FIGS. 17(A), (B), and (C) are a top view and cross-sectional views of the oxide semiconductor layer 130 with a three-layer structure. FIG. 17(A) is the top view, and a cross section in the direction of a dashed-dotted line A1-A2 shown in FIG. 17(A) corresponds to FIG. 17(B). In addition, a cross section in the direction of a dashed-dotted line A3-A4 shown in FIG. 17(A) corresponds to FIG. 17(C).

Oxide semiconductor layers with different compositions, or the like can be used as an oxide semiconductor layer 130a, an oxide semiconductor layer 130b, and an oxide semiconductor layer 130c.

Figure 18A:
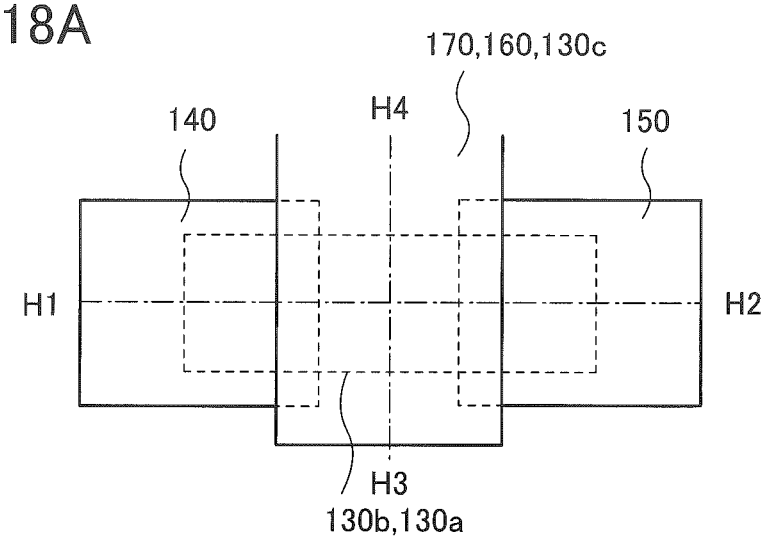
FIG. 18 A top view and a cross-sectional view illustrating a transistor.
Figure 18B:
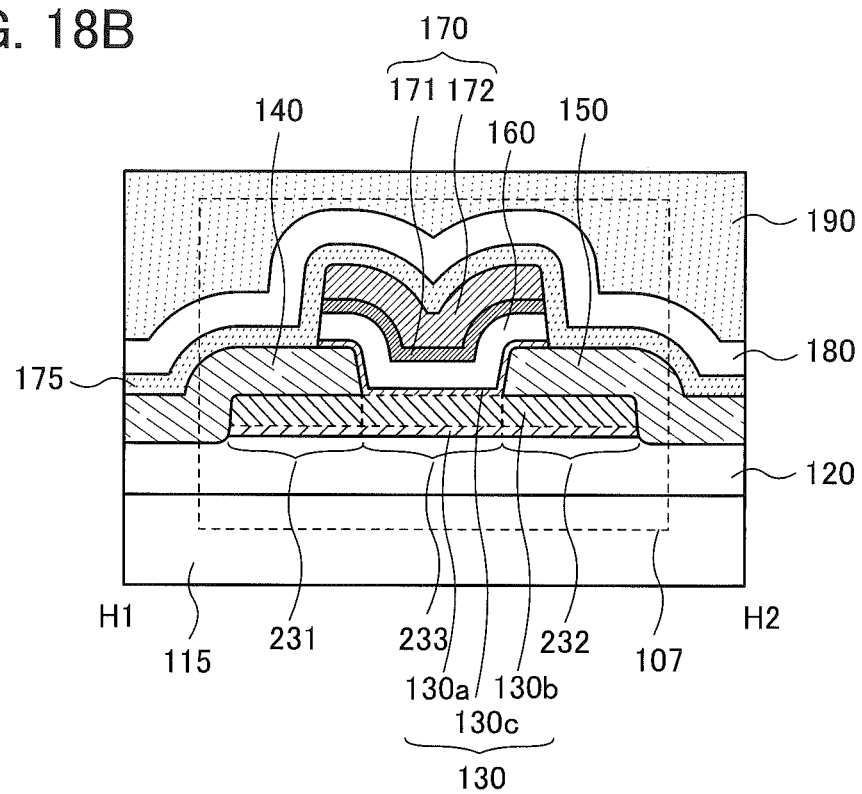
Figure 24A:
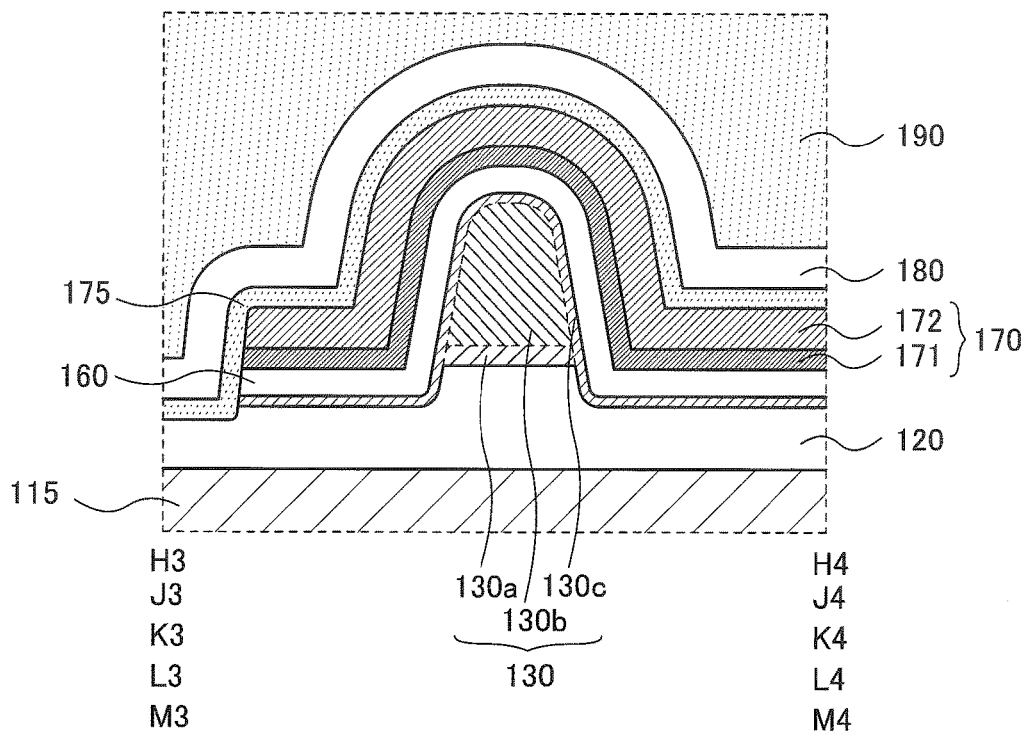
FIG. 24 Views each illustrating a cross section of a transistor in the channel width direction.

In addition, the transistor of one embodiment of the present invention may be a structure illustrated in FIGS. 18(A) and (B). FIG. 18(A) is a top view of a transistor 107, and a cross section in the direction of a dashed-dotted line H1-H2 shown in FIG. 18(A) corresponds to FIG. 18(B). In addition, a cross section in the direction of a dashed-dotted line H3-H4 shown in FIG. 18(A) corresponds to FIG. 24(A). In addition, in some cases, the direction of the dashed-dotted line H1-H2 is referred to as a channel length direction, and the direction of the dashed-dotted line H3-H4 is referred to as a channel width direction.

The transistor 107 has the insulating layer 120 in contact with the substrate 115; a stack of the oxide semiconductor layer 130a and the oxide semiconductor layer 130b, in contact with the insulating layer 120; the conductive layer 140 and the conductive layer 150 electrically connected to the stack; the oxide semiconductor layer 130c in contact with the stack, the conductive layer 140, and the conductive layer 150; the insulating layer 160 in contact with the oxide semiconductor layer 130c; the conductive layer 170 in contact with the insulating layer 160; the insulating layer 175 in contact with the conductive layer 140, the conductive layer 150, the oxide semiconductor layer 130c, the insulating layer 160, and the conductive layer 170; and the insulating layer 180 in contact with the insulating layer 175. In addition, the transistor 107 may also have the insulating layer 190 (planarization film) in contact with the insulating layer 180, or the like as necessary.

The transistor 107 has a similar structure to the transistor 101 except that the oxide semiconductor layer 130 has two layers (the oxide semiconductor layer 130a and the oxide semiconductor layer 130b) in the region 231 and the region 232, that the oxide semiconductor layer 130 has three layers (the oxide semiconductor layer 130a, the oxide semiconductor layer 130b, and the oxide semiconductor layer 130c) in the region 233, and that part of the oxide semiconductor layer (the oxide semiconductor layer 130c) exists between the conductive layer 140 and the conductive layer 150, and the insulating layer 160.

Figure 19A:
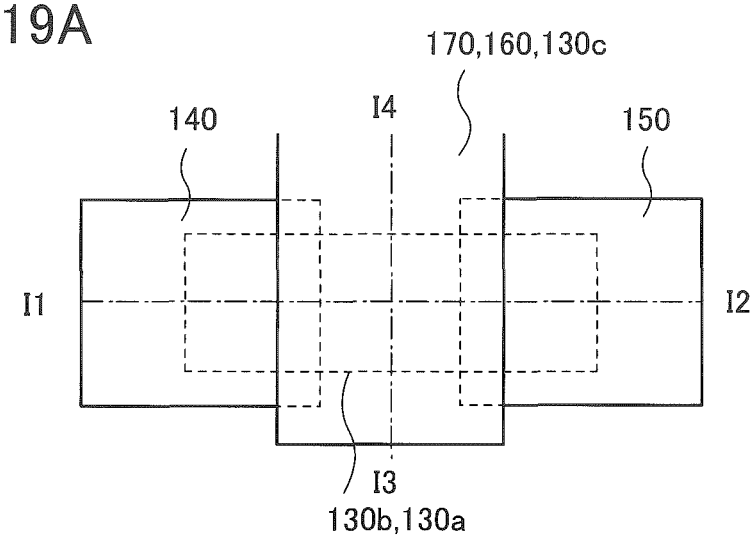
FIG. 19 A top view and a cross-sectional view illustrating a transistor.
Figure 19B:
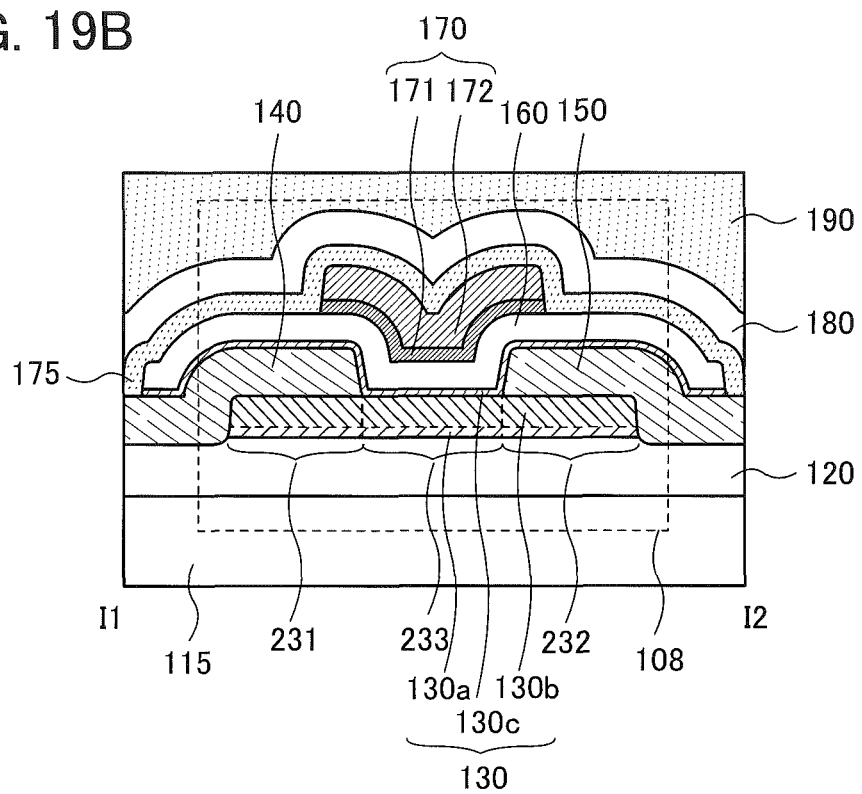
Figure 24B:
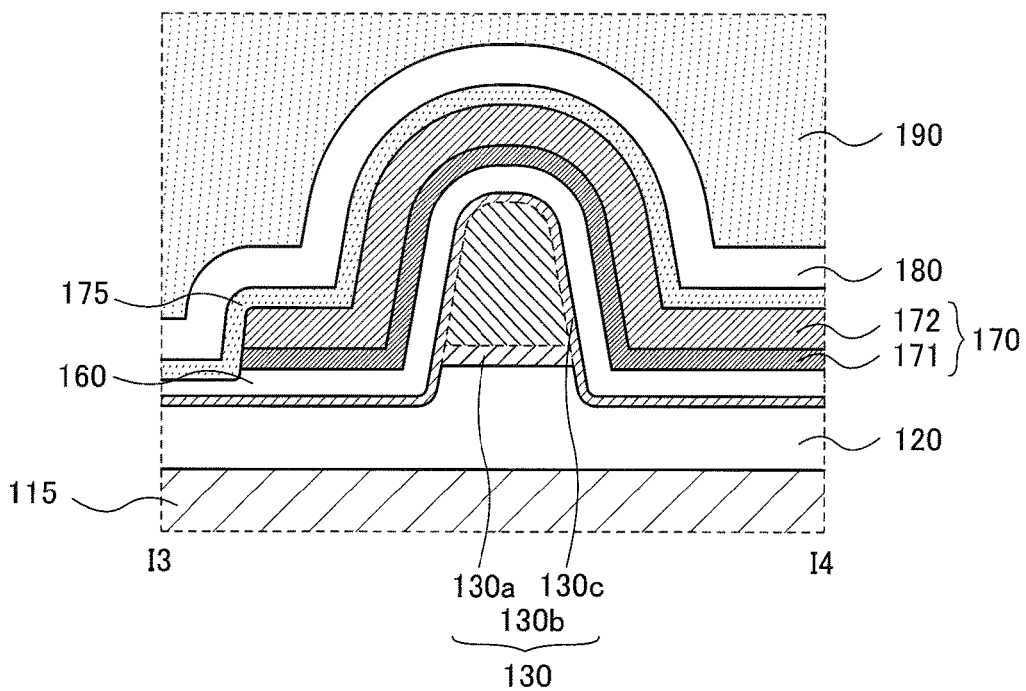

In addition, the transistor of one embodiment of the present invention may have a structure illustrated in FIGS. 19(A) and (B). FIG. 19(A) is atop view of a transistor 108, and a cross section in the direction of a dashed-dotted line 11-12 shown in FIG. 19A corresponds to FIG. 19(B). In addition, a cross section in the direction of a dashed-dotted line 13-14 shown in FIG. 19(A) corresponds to FIG. 24(B). In addition, in some cases, the direction of the dashed-dotted line 11-12 is referred to as a channel length direction, and the direction of the dashed-dotted line 13-14 is referred to as a channel width direction.

The transistor 108 differs from the transistor 107 in that end portions of the insulating layer 160 and the oxide semiconductor layer 130c are not aligned with the end portion of the conductive layer 170.

Figure 20A:
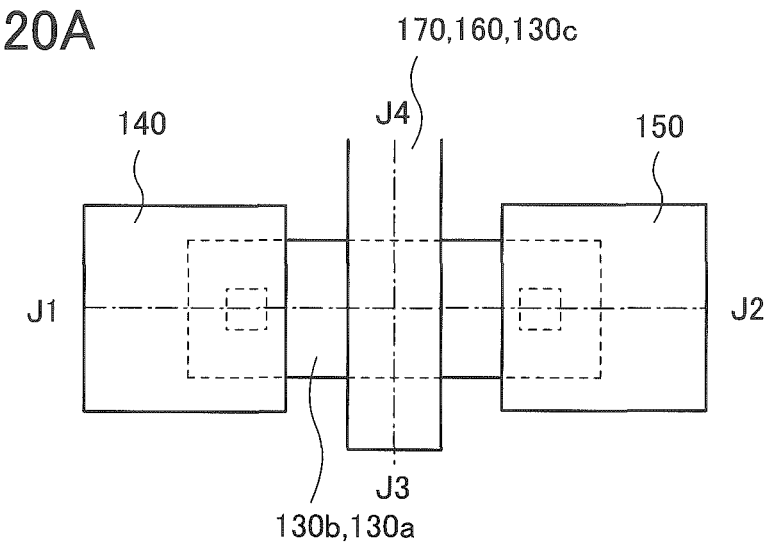
FIG. 20 A top view and a cross-sectional view illustrating a transistor.
Figure 20B:
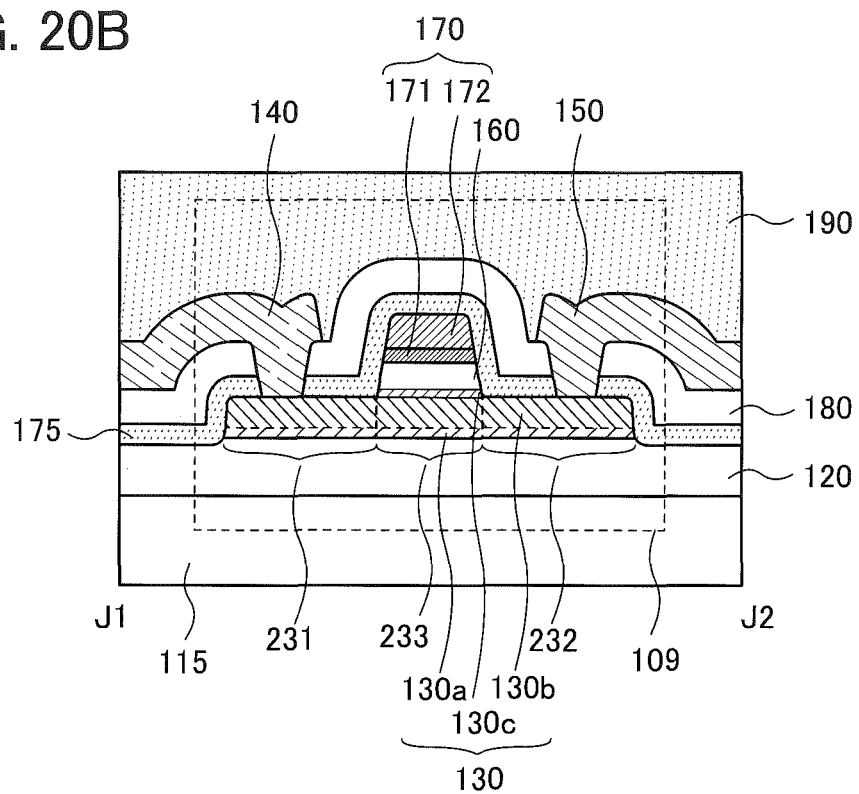

In addition, the transistor of one embodiment of the present invention may have a structure illustrated in FIGS. 20(A) and (B). FIG. 20(A) is a top view of a transistor 109, and a cross section in the direction of a dashed-dotted line J1-J2 shown in FIG. 20(A) corresponds to FIG. 20(B). In addition, a cross section in the direction of a dashed-dotted line J3-J4 shown in FIG. 24(A) corresponds to FIG. 24(A). In addition, in some cases, the direction of the dashed-dotted line J1-J2 is referred to as a channel length direction, and the direction of the dashed-dotted line J3-J4 is referred to as a channel width direction.

The transistor 109 has the insulating layer 120 in contact with the substrate 115; a stack of the oxide semiconductor layer 130a and the oxide semiconductor layer 130b, in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layer 140 and the conductive layer 150 electrically connected to the stack through openings provided in the insulating layer 175 and the insulating layer 180. In addition, the transistor 109 may also have the insulating layer 190 (planarization film) in contact with the insulating layer 180, the conductive layer 140, and the conductive layer 150, or the like as necessary.

The transistor 109 has a similar structure to the transistor 103 except that the oxide semiconductor layer 130 has two layers (the oxide semiconductor layer 130a and the oxide semiconductor layer 130b) in the region 231 and the region 232 and that the oxide semiconductor layer 130 has three layers (the oxide semiconductor layer 130a, the oxide semiconductor layer 130b, and the oxide semiconductor layer 130c) in the region 233.

Figure 21A:
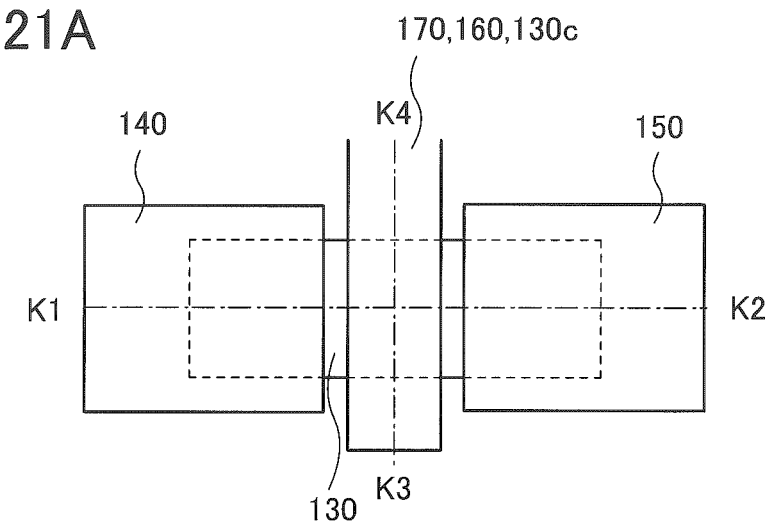
FIG. 21 A top view and a cross-sectional view illustrating a transistor.
Figure 21B:
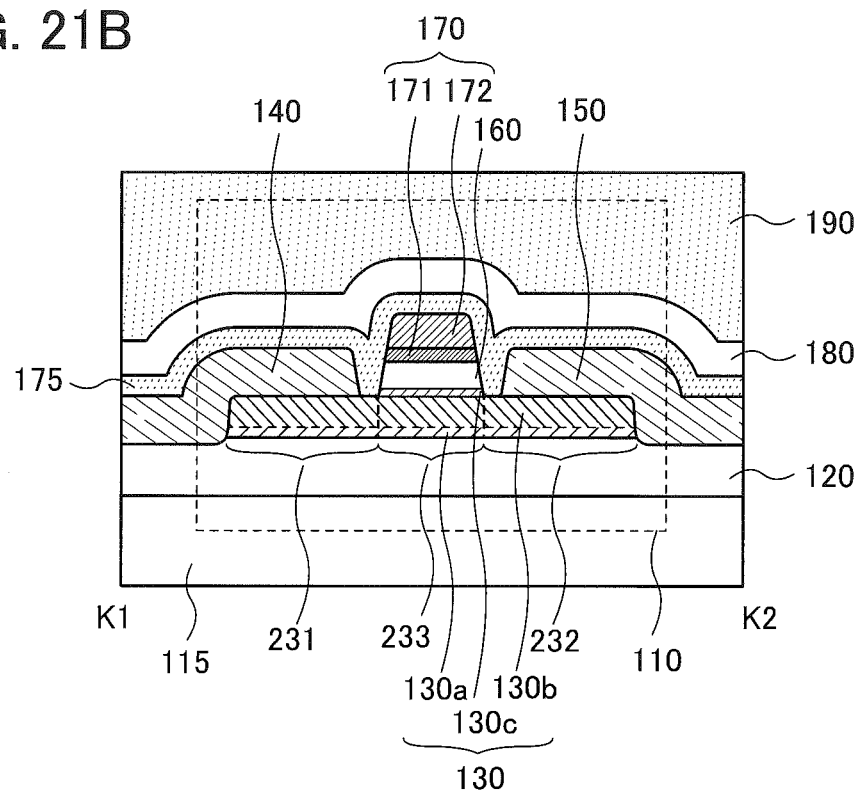

In addition, the transistor of one embodiment of the present invention may have a structure illustrated in FIGS. 21(A) and (B). FIG. 21(A) is atop view of a transistor 110, and a cross section in the direction of a dashed-dotted line K1-K2 shown in FIG. 21(A) corresponds to FIG. 21(B). In addition, a cross section in the direction of a dashed-dotted line K3-K4 shown in FIG. 21(A) corresponds to FIG. 24(A). In addition, in some cases, the direction of the dashed-dotted line K1-K2 is referred to as a channel length direction, and the direction of the dashed-dotted line K3-K4 is referred to as a channel width direction.

The transistor 110 has a similar structure to the transistor 104 except that the oxide semiconductor layer 130 has two layers (the oxide semiconductor layer 130a and the oxide semiconductor layer 130b) in the region 231 and the region 232 and that the oxide semiconductor layer 130 has three layers (the oxide semiconductor layer 130a, the oxide semiconductor layer 130b, and the oxide semiconductor layer 130c) in the region 233.

Figure 22A:
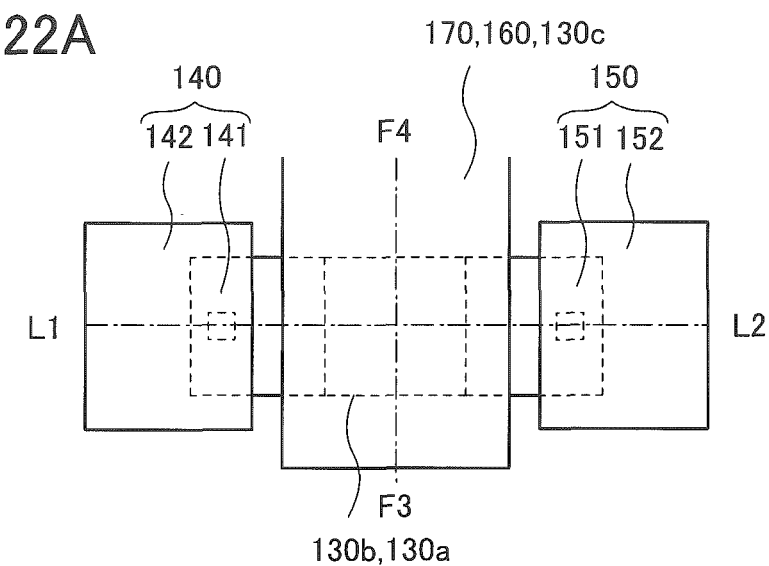
FIG. 22 A top view and a cross-sectional view illustrating a transistor.
Figure 22B:
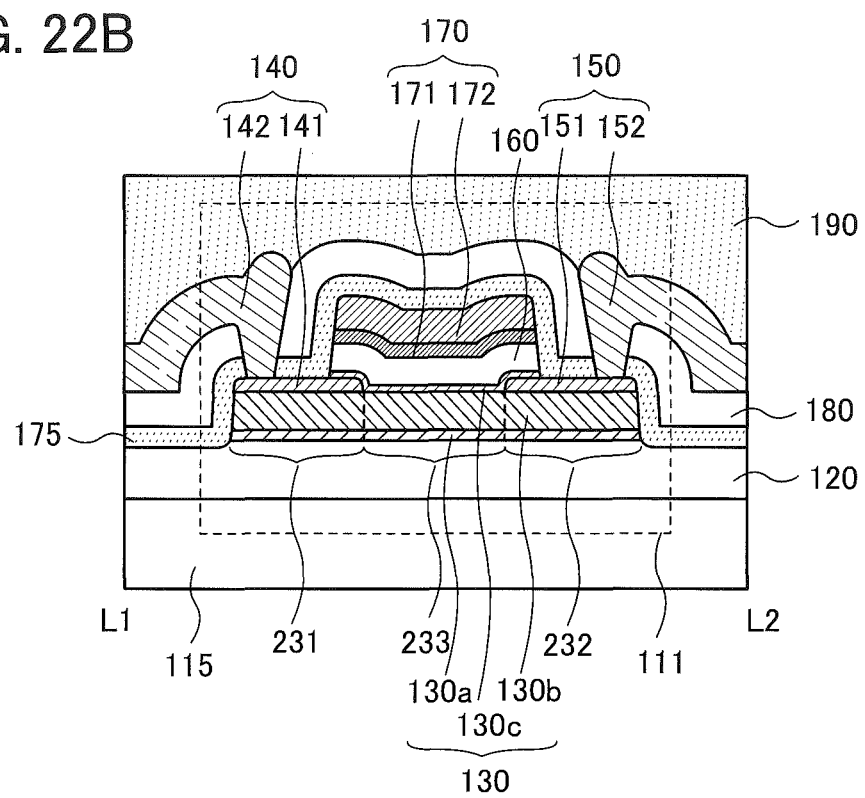

In addition, the transistor of one embodiment of the present invention may have a structure illustrated in FIGS. 22(A) and (B). FIG. 22(A) is atop view of a transistor 111, and a cross section in the direction of a dashed-dotted line K1-K2 shown in FIG. 22(A) corresponds to FIG. 22(B). In addition, a cross section in the direction of a dashed-dotted line K3-K4 shown in FIG. 22(A) corresponds to FIG. 24(A). In addition, in some cases, the direction of the dashed-dotted line K1-K2 is referred to as a channel length direction, and the direction of the dashed-dotted line K3-K4 is referred to as a channel width direction.

The transistor 111 has the insulating layer 120 in contact with the substrate 115; a stack of the oxide semiconductor layer 130a and the oxide semiconductor layer 130b, in contact with the insulating layer 120; the conductive layer 141 and the conductive layer 151 electrically connected to the stack; the oxide semiconductor layer 130c in contact with the stack, the conductive layer 141, and the conductive layer 151; the insulating layer 160 in contact with the oxide semiconductor layer 130c; the conductive layer 170 in contact with the insulating layer 160; the insulating layer 175 in contact with the stack, the conductive layer 141, the conductive layer 151, the oxide semiconductor layer 130c, the insulating layer 160, and the conductive layer 170; the insulating layer 180 in contact with the insulating layer 175; and the conductive layer 142 and the conductive layer 152 electrically connected to the conductive layer 141 and the conductive layer 151, respectively, through openings provided in the insulating layer 175 and the insulating layer 180. In addition, the transistor 111 may also have the insulating layer 190 (planarization film) in contact with the insulating layer 180, the conductive layer 142, and the conductive layer 152, or the like as necessary.

The transistor 111 has a similar structure to the transistor 105 except that the oxide semiconductor layer 130 has two layers (the oxide semiconductor layer 130a and the oxide semiconductor layer 130b) in the region 231 and the region 232, that the oxide semiconductor layer 130 has three layers (the oxide semiconductor layer 130a, the oxide semiconductor layer 130b, and the oxide semiconductor layer 130c) in the region 233, and that part of the oxide semiconductor layer (the oxide semiconductor layer 130c) exists between the conductive layer 141 and the conductive layer 151, and the insulating layer 160.

Figure 23A:
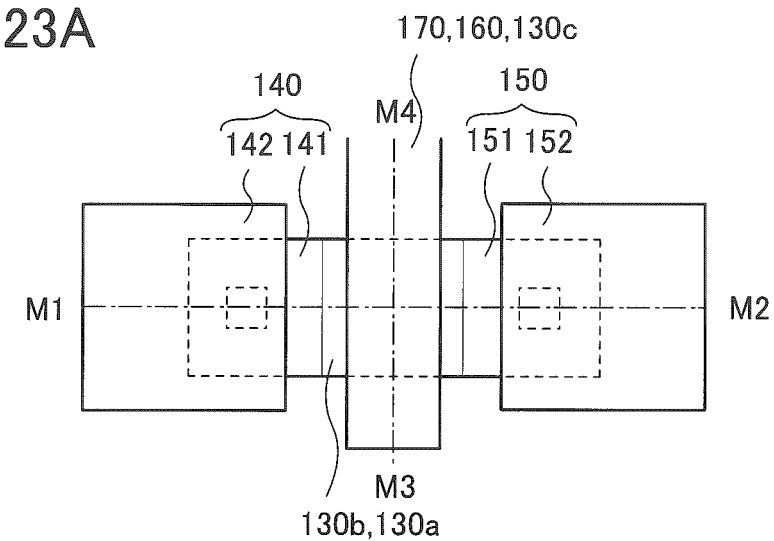
FIG. 23 A top view and a cross-sectional view illustrating a transistor.
Figure 23B:
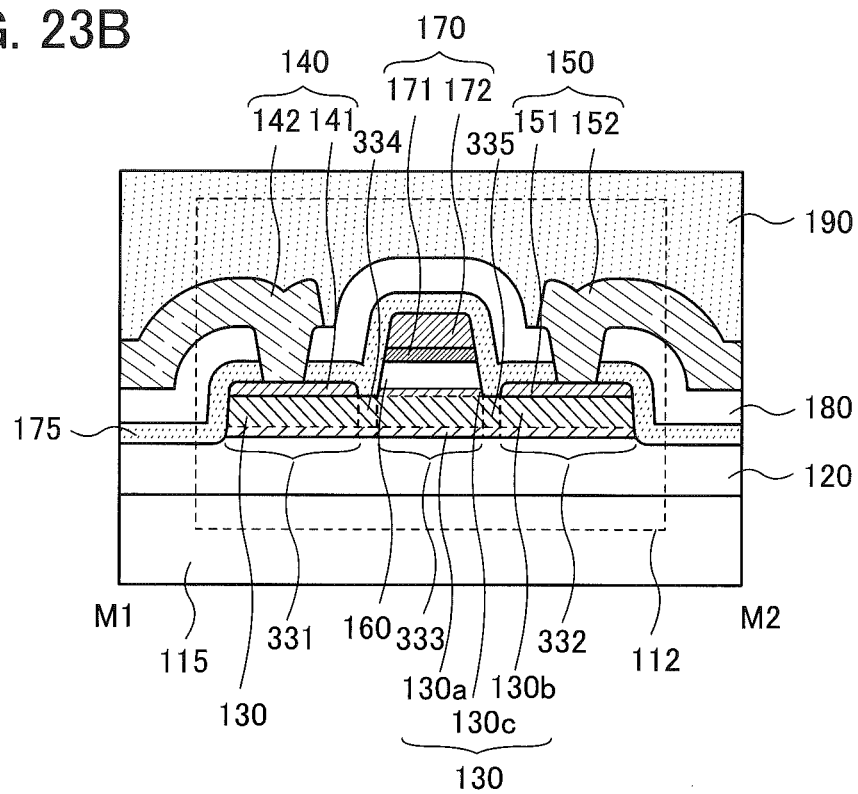

In addition, the transistor of one embodiment of the present invention may have a structure illustrated in FIGS. 23(A) and (B). FIG. 23A is a top view of a transistor 112, and a cross section in the direction of a dashed-dotted line M1-M2 shown in FIG. 23(A) corresponds to FIG. 23(B). In addition, a cross section in the direction of a dashed-dotted line M3-M4 shown in FIG. 23(A) corresponds to FIG. 24(A). In addition, in some cases, the direction of the dashed-dotted line M1-M2 is referred to as a channel length direction, and the direction of the dashed-dotted line M3-M4 is referred to as a channel width direction.

The transistor 112 has a similar structure as the transistor 106 except that the oxide semiconductor layer 130 has two layers (the oxide semiconductor layer 130a and the oxide semiconductor layer 130b) in the region 331, the region 332, the region 334, and the region 335 and that the oxide semiconductor layer 130 has three layers (the oxide semiconductor layer 130a, the oxide semiconductor layer 130b, and the oxide semiconductor layer 130c) in the region 333.

Figure 25A:
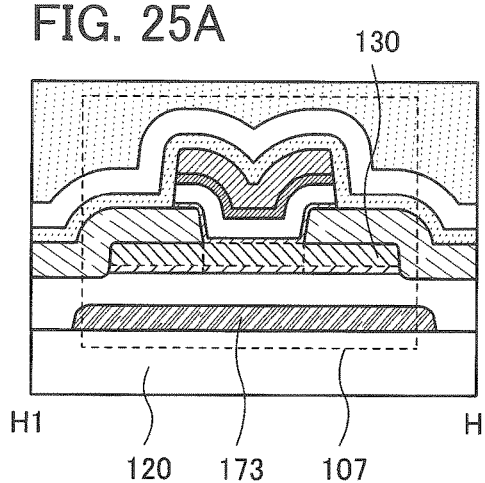
FIG. 25 Views each illustrating a cross section of a transistor in the channel length direction.
Figure 25B:
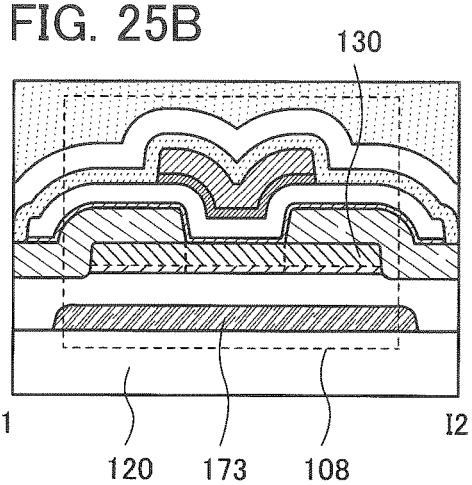
Figure 25C:
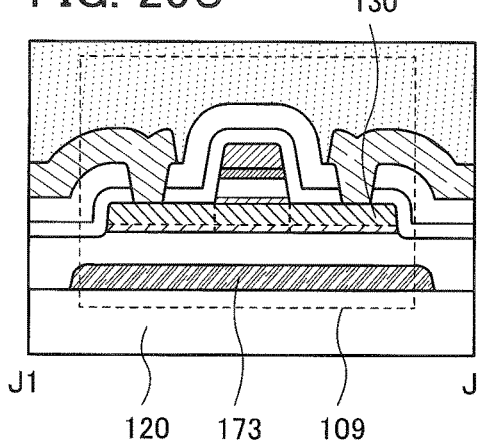
Figure 25D:
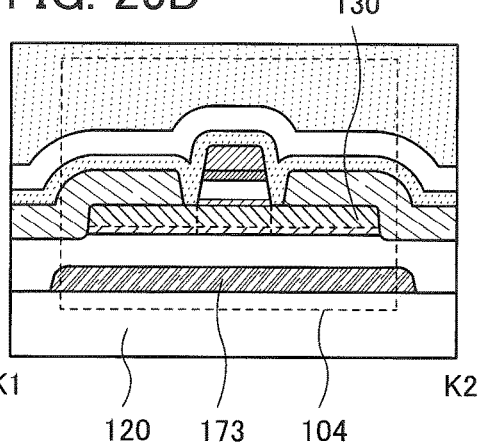
Figure 25E:
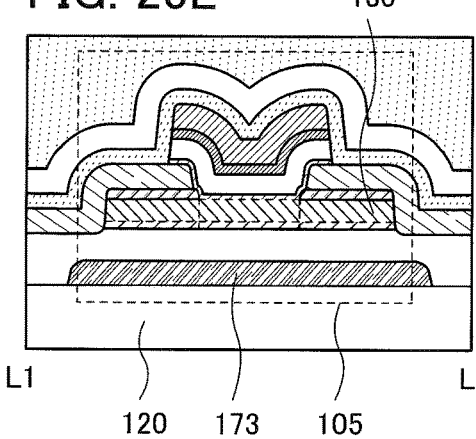
Figure 25F:
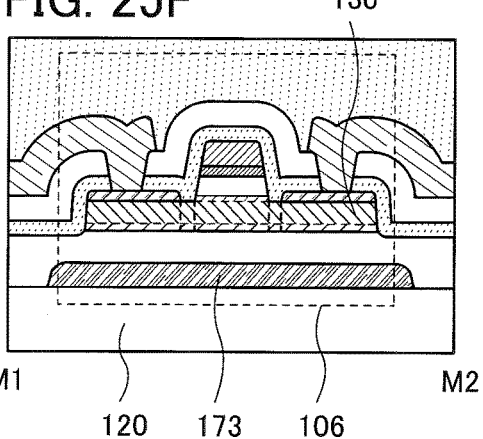
Figure 26A:
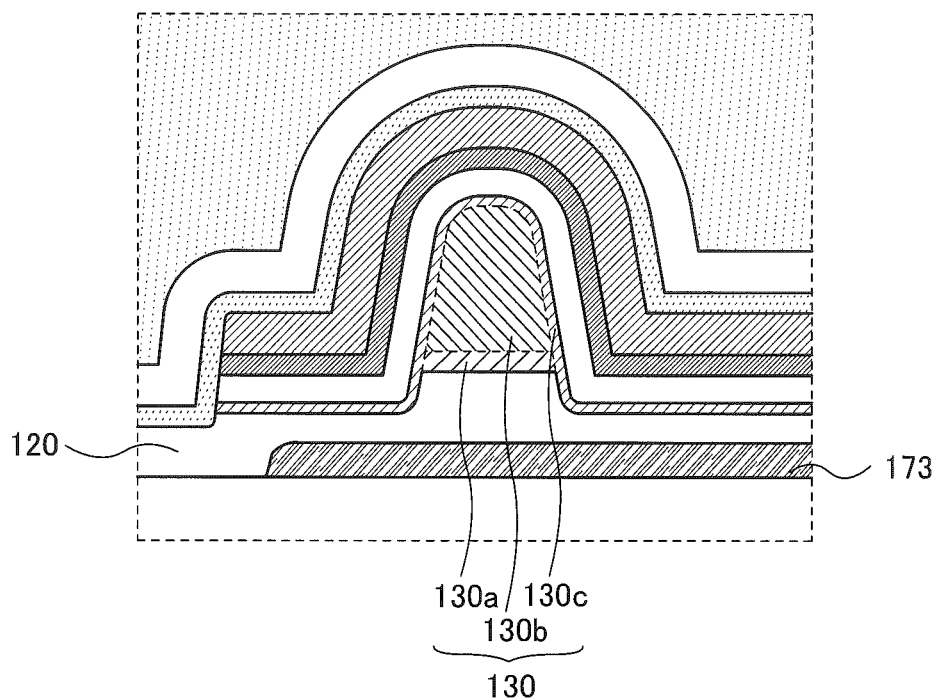
FIG. 26 Views each illustrating a cross section of a transistor in the channel width direction.
Figure 26B:
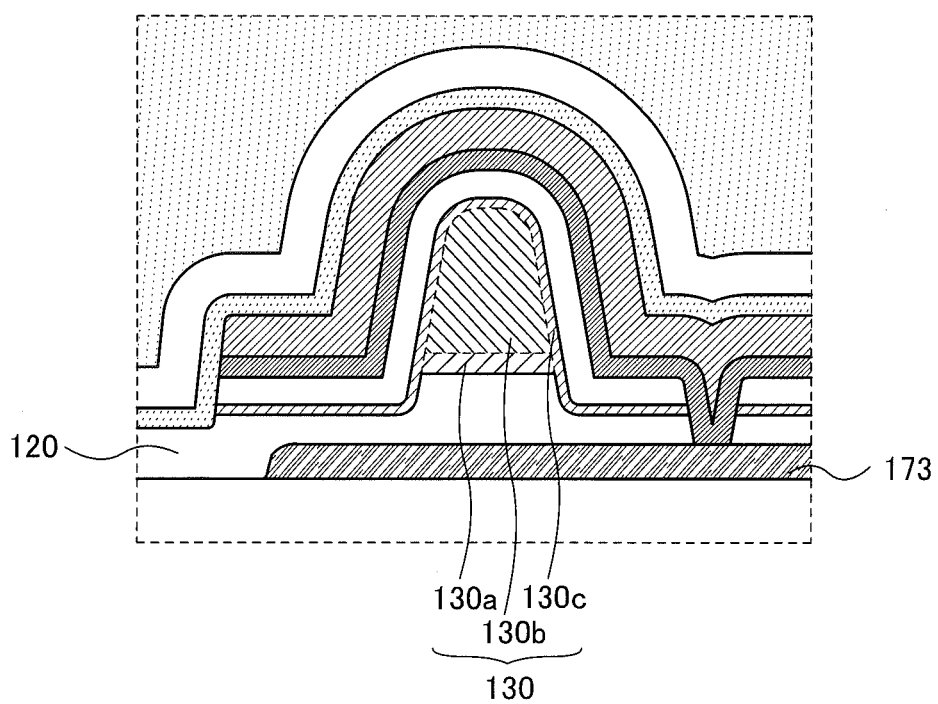

In addition, the transistor of one embodiment of the present invention may be provided with the conductive layer 173 between the oxide semiconductor layer 130 and the substrate 115 as in the cross-sectional views in the channel length direction in FIGS. 25(A), (B), (C), (D), (E), and (F) and the cross-sectional views in the channel width direction in FIGS. 26(A) and (B). The on-state current can be further increased or the threshold voltage can be further controlled by using the conductive layer as a second gate electrode layer (back gate). Note that in the cross-sectional views in FIGS. 26(A), (B), (C), (D), (E), and (F), the width of the conductive layer 173 may be shorter than that of the oxide semiconductor layer 130. Furthermore, the width of the conductive layer 173 may be shorter than that of the conductive layer 170.

Figure 27A:
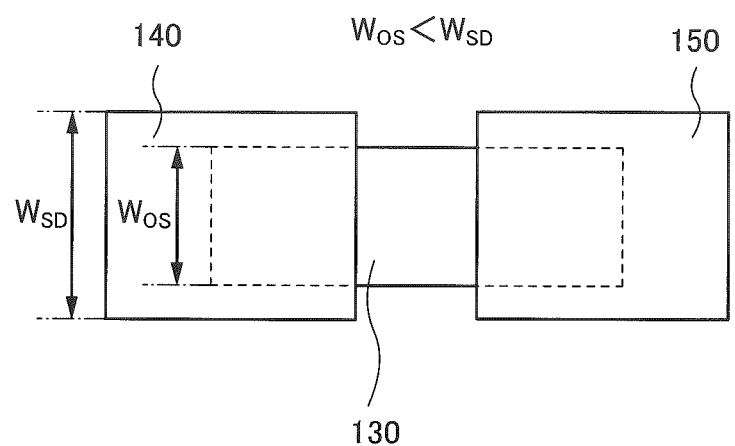
FIG. 27 Top views each illustrating a transistor.
Figure 27B:
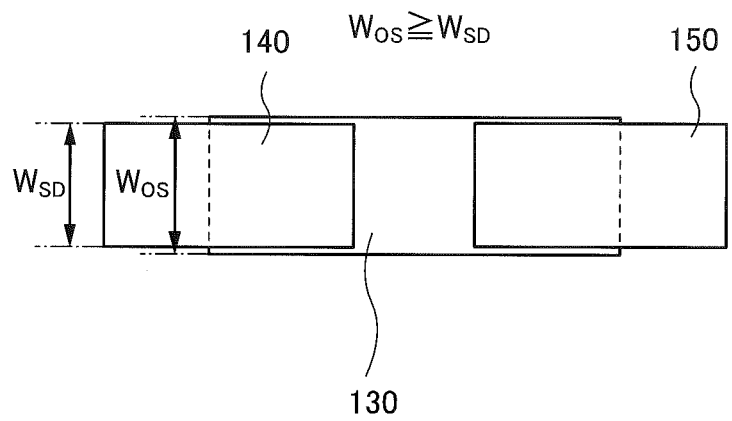

In addition, the conductive layer 140 (source electrode layer) and the conductive layer 150 (drain electrode layer) of the transistor of one embodiment of the present invention may each have a structure like those in top views illustrated in FIGS. 27(A) and (B). Note that only the oxide semiconductor layer 130, the conductive layer 140, and the conductive layer 150 are illustrated in FIGS. 27(A) and (B). As illustrated in FIG. 27(A), the width of the conductive layer 140 and the conductive layer 150 (WSD) may be formed longer than the width of the oxide semiconductor layer 130 (WOS). Alternatively, as illustrated in FIG. 27(B), WSD may be formed shorter than WOS. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved.

In any of the structures of the transistors of one embodiment of the present invention (the transistor 101 to the transistor 109), the conductive layer 170 which is a gate electrode layer electrically surrounds the oxide semiconductor layer 130 in the channel width direction with the insulating layer 160 which is a gate insulating film positioned therebetween, and thus the on-state current can be increased. Such a transistor structure is referred to as a surrounded channel (s-channel) structure.

In addition, in the transistor having the oxide semiconductor layer 130b and the oxide semiconductor layer 130c and the transistor having the oxide semiconductor layer 130a, the oxide semiconductor layer 130b, and the oxide semiconductor layer 130c, selecting appropriate materials for the two or three layers forming the oxide semiconductor layer 130 allows current to flow in the oxide semiconductor layer 130b. Since current flows in the oxide semiconductor layer 130b, the current is hardly influenced by interface scattering and a high on-state current can be obtained. Note that increasing the thickness of the oxide semiconductor layer 130b can increase the on-state current. The thickness of the oxide semiconductor layer 130b may be, for example, 100 nm to 200 nm.

Using a transistor with the above structure allows a semiconductor device to be provided with favorable electrical characteristics.

Note that in this specification, the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. Note that in one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

In addition, the channel width refers to, for example, the length of a portion where a source and a drain face each other in a region where a semiconductor (or a portion where a current flows in a semiconductor when a transistor is on) and a gate electrode overlap with each other, or a region where a channel is formed. Note that in one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

Meanwhile, in a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW: Surrounded Channel Width) in some cases. Furthermore, in this specification, in the case where channel width is simply used, it denotes a surrounded channel width or an apparent channel width in some cases. Alternatively, in this specification, in the case where channel width is simply used, it denotes an effective channel width in some cases. Note that the values of a channel length, a channel width, an effective channel width, an apparent channel width, a surrounded channel width, and the like can be determined by obtaining a cross-sectional TEM image and the like and analyzing an image thereof.

Note that in the case where field-effect mobility, a current value per channel width, and the like of a transistor are obtained by calculation, a surrounded channel width is used for the calculation in some cases. In that case, a value different from one in the case where an effective channel width is used for the calculation is obtained in some cases.

Note that this embodiment can be combined with any of the other embodiments and examples in this specification as appropriate.

(Embodiment 3)

In this embodiment, components of the transistors described in Embodiment 2 will be described in detail.

The substrate 115 is not limited to a simple supporting substrate, and may be a substrate where another device such as a transistor is formed. In this case, at least one of the gate electrode layer (the conductive layer 170), the source electrode layer (the conductive layer 140), and the drain electrode layer (the conductive layer 150) of the transistor may be electrically connected to another device described above.

For the substrate 115, for example, a glass substrate, a ceramic substrate, a quartz substrate, a sapphire substrate, or the like can be used. Alternatively, a single crystal semiconductor substrate or a polycrystalline semiconductor substrate of silicon, silicon carbide, or the like, a compound semiconductor substrate of silicon germanium or the like, an SOI (Silicon On Insulator) substrate, or the like can be used.

The insulating layer 120 can have a function of supplying oxygen to the oxide semiconductor layer 130 as well as a function of preventing diffusion of impurities from the substrate 115. For this reason, the insulating layer 120 is preferably an insulating film containing oxygen and further preferably an insulating film containing oxygen more than that in the stoichiometric composition. The insulating layer 120 is a film of which the amount of released oxygen when converted into oxygen atoms is $1.0 \times 10^{19}$ atoms/cm$^3$ or more in a TDS method in which the temperature of the film surface is higher than or equal to 100° C. and lower than or equal to 700° C., preferably higher than or equal to 100° C. and lower than or equal to 500° C., for example. In addition, in the case where the substrate 115 is provided with another device as described above, the insulating layer 120 also has a function as an interlayer insulating film. In that case, it is preferable to perform planarization treatment by CMP (Chemical Mechanical Polishing) method or the like so as to have a flat surface.

The insulating layer 120 can be formed using, for example, an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a mixed material of any of these. Alternatively, a stack of any of the above materials may be employed.

Note that in this embodiment, detailed description is given mainly on the case where the oxide semiconductor layer 130 of the transistor has a three-layer structure in which the oxide semiconductor layer 130a, the oxide semiconductor layer 130b, and the oxide semiconductor layer 130c are stacked in the above order from the insulating layer 120 side.

Note that in the case where the oxide semiconductor layer 130 is a single layer, a layer corresponding to the oxide semiconductor layer 130b is used.

In addition, in the case where the oxide semiconductor layer 130 has two layers, a stack in which a layer corresponding to the oxide semiconductor layer 130b and a layer corresponding to the oxide semiconductor layer 130c are stacked in this order from the insulating layer 120 side is used. In the case of such a structure, the oxide semiconductor layer 130b and the oxide semiconductor layer 130c can also be replaced with each other.

In addition, in the case where the oxide semiconductor layer 130 has four or more layers, for example, a structure in which another oxide semiconductor layer is stacked over the three-layer structure of the oxide semiconductor layer 130 described in this embodiment or a structure in which another oxide semiconductor layer is inserted in any one of the interfaces in the three-layer structure can be employed.

For the oxide semiconductor layer 130b, for example, an oxide semiconductor whose electron affinity (an energy difference between a vacuum level and the conduction band minimum) is higher than those of the oxide semiconductor layer 130a and the oxide semiconductor layer 130c is used. The electron affinity can be obtained as a value obtained by subtracting an energy difference between a conduction band minimum and a valence band maximum (what is called an energy gap) from an energy difference between the vacuum level and the valence band maximum (what is called an ionization potential).

The oxide semiconductor layer 130a and the oxide semiconductor layer 130c each contain one or more kinds of metal elements that form the oxide semiconductor layer 130b. For example, it is preferable to form using an oxide semiconductor whose conduction band minimum is closer to a vacuum level than that of the oxide semiconductor layer 130b by greater than or equal to any of 0.05 eV, 0.07 eV, 0.1 eV, or 0.15 eV and less than or equal to any of 2 eV, 1 eV, 0.5 eV, or 0.4 eV.

In such a structure, when an electric field is applied to the conductive layer 170, a channel is formed in the oxide semiconductor layer 130b whose conduction band minimum is the lowest in the oxide semiconductor layer 130.

In addition, since the oxide semiconductor layer 130a contains one or more kinds of metal elements that form the oxide semiconductor layer 130b, an interface state is unlikely to be formed at the interface between the oxide semiconductor layer 130b and the oxide semiconductor layer 130a, compared with the interface in the case where the oxide semiconductor layer 130b and the insulating layer 120 are in contact with each other. The interface state sometimes forms a channel; therefore, the threshold voltage of the transistor is changed in some cases. Thus, by providing the oxide semiconductor layer 130a, fluctuations in electrical characteristics of the transistor, such as a threshold voltage, can be reduced. In addition, the reliability of the transistor can be improved.

Furthermore, since the oxide semiconductor layer 130c contains one or more kinds of metal elements that form the oxide semiconductor layer 130b, scattering of carriers is unlikely to occur at the interface between the oxide semiconductor layer 130b and the oxide semiconductor layer 130c, compared with the interface in the case where the oxide semiconductor layer 130b and the gate insulating film (the insulating layer 160) are in contact with each other. Thus, by providing the oxide semiconductor layer 130c, the field-effect mobility of the transistor can be increased.

For the oxide semiconductor layer 130a and the oxide semiconductor layer 130c, for example, a material containing Al, Ti, Ga, Ge, Y, Zr, Sn, La, Ce, or Hf with a higher atomic ratio than that used for the oxide semiconductor layer 130b can be used. Specifically, an atomic ratio is 1.5 times or more, preferably 2 times or more, and further preferably 3 times or more. Any of the above elements is strongly bonded to oxygen and thus has a function of suppressing generation of an oxygen vacancy in the oxide semiconductor layer. That is, an oxygen vacancy is less likely to be generated in the oxide semiconductor layer 130a and the oxide semiconductor layer 130c than in the oxide semiconductor layer 130b.

In addition, an oxide semiconductor that can be used for each of the oxide semiconductor layer 130a, the oxide semiconductor layer 130b, and the oxide semiconductor layer 130c preferably contains indium (In) or zinc (Zn). Alternatively, both In and Zn are preferably contained. In addition, in order to reduce fluctuations in electrical characteristics of the transistors including the oxide semiconductor, a stabilizer is preferably contained in addition to them.

There is gallium (Ga), tin (Sn), hafnium (Hf), aluminum (Al), or zirconium (Zr) as a stabilizer. In addition, as another stabilizer, there is lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), or the like which is a lanthanoid.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

Note that here, for example, an In—Ga—Zn oxide means an oxide having In, Ga, and Zn as its main components. In addition, another metal element in addition to In, Ga, and Zn may be contained. In addition, in this specification, a film formed of the In—Ga—Zn oxide is also referred to as an IGZO film.

In addition, a material represented by $InMO_3(ZnO)_m$ (m>0, where m is not an integer) may be used. Note that M represents one or more metal elements selected from Ga, Y, Zr, La, Ce, or Nd. Alternatively, a material represented by $In_2SnO_5(ZnO)_n$ (n>0, where n is an integer) may be used.

Note that when each of the oxide semiconductor layer 130a, the oxide semiconductor layer 130b, and the oxide semiconductor layer 130c is an In-M-Zn oxide containing at least indium, zinc, and M (M is a metal such as Al, Ti, Ga, Ge, Y, Zr, Sn, La, Ce, or Hf), and when the oxide semiconductor layer 130a is assumed that In:M:Zn=$x_1$:$y_1$:$z_1$ [atomic ratio], the oxide semiconductor layer 130b is assumed that In:M:Zn=$x_2$:$y_2$:$z_2$, and the oxide semiconductor layer 130c is assumed that In:M:Zn=$x_3$:$y_3$:$z_3$, each of $y_1/x_1$ and $y_3/x_3$ is preferably larger than $y_2/x_2$. Each of $y_1/x_1$ and $y_3/x_3$ is one and a half times or more, preferably twice or more, and further preferably three times or more as large as $y_2/x_2$. At this time, when $y_2$ is greater than or equal to $x_2$ in the oxide semiconductor layer 130b, the transistor can have stable electrical characteristics. However, when $y_2$ is 3 times or more, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layer 130a and the oxide semiconductor layer 130c are preferably less than 50 atomic % and greater than or equal to 50 atomic %, respectively, and further preferably less than 25 atomic % and greater than or equal to 75 atomic %, respectively. In addition, in the case where Zn and O are not taken into consideration, the proportion of In and the proportion of M in the oxide semiconductor layer 130b are preferably greater than or equal to 25 atomic % and less than 75 atomic %, respectively, and further preferably greater than or equal to 34 atomic % and less than 66 atomic %, respectively.

The indium content in the oxide semiconductor layer 130b is preferably higher than those in the oxide semiconductor layer 130a and the oxide semiconductor layer 130c. In an oxide semiconductor, the s orbital of heavy metal mainly contributes to carrier transfer, and when the proportion of In in the oxide semiconductor is increased, overlap of the s orbitals is likely to be increased; therefore, an oxide having a composition in which the proportion of In is higher than that of M has higher mobility than an oxide having a composition in which the proportion of In is equal to or lower than that of M. Thus, with the use of an oxide having a high content of indium for the oxide semiconductor layer 130b, a transistor having a high field-effect mobility can be obtained.

The thickness of the oxide semiconductor layer 130a is greater than or equal to 3 nm and less than or equal to 100 nm, preferably greater than or equal to 5 nm and less than or equal to 50 nm, and further preferably greater than or equal to 5 nm and less than or equal to 25 nm. In addition, the thickness of the oxide semiconductor layer 130b is greater than or equal to 3 nm and less than or equal to 200 nm, preferably greater than or equal to 10 nm and less than or equal to 150 nm, and further preferably greater than or equal to 15 nm and less than or equal to 100 nm. In addition, the thickness of the oxide semiconductor layer 130c is greater than or equal to 1 nm and less than or equal to 50 nm, preferably greater than or equal to 2 nm and less than or equal to 30 nm, and further preferably greater than or equal to 3 nm and less than or equal to 15 nm. In addition, the oxide semiconductor layer 130b is preferably thicker than the oxide semiconductor layer 130a and the oxide semiconductor layer 130c.

Note that in order to provide stable electric characteristics to a transistor in which an oxide semiconductor layer serves as a channel, it is effective to reduce the concentration of impurities in the oxide semiconductor layer to make the oxide semiconductor layer intrinsic (i-type) or substantially intrinsic. Here, substantially intrinsic refers to the state where an oxide semiconductor layer has a carrier density which is lower than $1\times10^{15}/cm^3$, preferably lower than $1\times10^{13}/cm^3$, further preferably lower than $8\times10^{11}/cm^3$, and still further preferably lower than $1\times10^8/cm^3$, and is higher than or equal to $1\times10^{-9}/cm^3$.

In addition, in the oxide semiconductor layer, hydrogen, nitrogen, carbon, silicon, and metal elements except for main components are impurities. For example, hydrogen and nitrogen contribute to formation of donor levels to increase the carrier density. In addition, silicon forms impurity levels in the oxide semiconductor layer. The impurity levels serve as traps and might cause the electrical characteristics of the transistor to deteriorate. The impurity level becomes a trap, which might deteriorate the electric characteristics of the transistor. Accordingly, in the oxide semiconductor layer 130a, the oxide semiconductor layer 130b, and the oxide semiconductor layer 130c and at interfaces between these layers, the impurity concentration is preferably reduced.

In order to make the oxide semiconductor layer intrinsic or substantially intrinsic, in SIMS (Secondary Ion Mass Spectrometry) analysis, for example, the concentration of silicon at a certain depth of the oxide semiconductor layer or in a region of the oxide semiconductor layer is lower than $1\times10^{19}$ atoms/cm$^3$, preferably lower than $5\times10^{18}$ atoms/cm$^3$, and further preferably lower than $1\times10^{18}$ atoms/cm$^3$. Furthermore, the concentration of hydrogen at a certain depth of the oxide semiconductor layer or in a region of the oxide semiconductor layer is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, and still further preferably lower than or equal to $5\times10^{18}$ atoms/cm$^3$. In addition, the concentration of nitrogen at a certain depth of the oxide semiconductor layer or in a region of the oxide semiconductor layer is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

In addition, in the case where the oxide semiconductor layer includes crystals, high concentration of silicon or carbon might reduce the crystallinity of the oxide semiconductor layer. In order not to reduce the crystallinity of the oxide semiconductor layer, for example, the concentration of silicon at a certain depth of the oxide semiconductor layer or in a region of the oxide semiconductor layer may be lower than $1\times10^{19}$ atoms/cm$^3$, preferably lower than $5\times10^{18}$ atoms/cm$^3$, and further preferably lower than $1\times10^{18}$ atoms/cm$^3$. Furthermore, the concentration of carbon at a certain depth of the oxide semiconductor layer or in a region of the oxide semiconductor layer may be lower than $1\times10^{19}$ atoms/cm$^3$, preferably lower than $5\times10^{18}$ atoms/cm$^3$, and further preferably lower than $1\times10^{18}$ atoms/cm$^3$, for example.

In addition, a transistor in which a highly purified oxide semiconductor film is used for a channel formation region as described above has an extremely low off-state current. In the case where the voltage between a source and a drain is set to about 0.1 V, 5 V, or 10 V, for example, the off-state current standardized on the channel width of the transistor can be reduced to several yoctoamperes per micrometer to several zeptoamperes per micrometer.

Note that as the gate insulating film of the transistor, an insulating film containing silicon is used in many cases; thus, it is preferable that, as in the transistor of one embodiment of the present invention, a region of the oxide semiconductor layer, which serves as a channel, have a structure not in contact with the gate insulating film for the above-described reason. In addition, in the case where a channel is formed at the interface between the gate insulating film and the oxide semiconductor layer, scattering of carriers occurs at the interface, whereby the field-effect mobility of the transistor is reduced in some cases. Also from the view of the above, it is preferable that the region of the oxide semiconductor layer, which serves as a channel, be separated from the gate insulating film.

Accordingly, with the oxide semiconductor layer 130 having a stacked-layer structure of the oxide semiconductor layer 130a, the oxide semiconductor layer 130b, and the oxide semiconductor layer 130c, a channel can be formed in the oxide semiconductor layer 130b; thus, the transistor having a high field-effect mobility and stable electrical characteristics can be formed.

In a band structure, the conduction band minimums of the oxide semiconductor layer 130a, the oxide semiconductor layer 130b, and the oxide semiconductor layer 130c change continuously. This can be understood also from the fact that the compositions of the oxide semiconductor layer 130a, the oxide semiconductor layer 130b, and the oxide semiconductor layer 130c are close to one another and oxygen is easily diffused among them. Thus, it is possible to say that the oxide semiconductor layer 130a, the oxide semiconductor layer 130b, and the oxide semiconductor layer 130c have a continuous physical property although being a stack of layers having different compositions, and in the drawings of this specification, each interface of the stack are indicated by dotted lines.

The oxide semiconductor layer 130 in which layers having the same main components are stacked is manufactured so that not only a simple stack of the layers but also a continuous energy band (here, in particular, a well structure having a U shape in which energies of the conduction band minimums are changed continuously between layers (U Shape Well)) is formed. In other words, the stacked-layer structure is formed such that there exists no impurity which form a defect level such as a trap center or a recombination center at the interface of each layer. If impurities are mixed between the stacked oxide semiconductor layers, the continuity of the energy band is lost and carriers disappear by a trap or recombination at the interface.

For example, an In—Ga—Zn oxide in which In:Ga:Zn=1:3:2, 1:3:3, 1:3:4, 1:3:6, 1:4:5, 1:6:4, or 1:9:6 (atomic ratio) can be used for the oxide semiconductor layer 130a and the oxide semiconductor layer 130c, and an In—Ga—Zn oxide in which In:Ga:Zn=1:1:1, 2:1:3, 5:5:6, or 3:1:2 (atomic ratio) can be used for the oxide semiconductor layer 130b. Note that the atomic ratio of each of the oxide semiconductor layer 130a, the oxide semiconductor layer 130b, and the oxide semiconductor layer 130c includes a change by ±20% of the above atomic ratios as an error. In addition, an oxide semiconductor such as gallium oxide can also be used for the oxide semiconductor layer 130a and the oxide semiconductor layer 130c.

The oxide semiconductor layer 130b in the oxide semiconductor layer 130 serves as a well, so that a channel is formed in the oxide semiconductor layer 130b in a transistor using the oxide semiconductor layer 130. Note that since the energies of the conduction band minimums are changed continuously, the oxide semiconductor layer 130 can also be referred to as a U-shaped well. Moreover, a channel formed to have such a structure can also be referred to as a buried channel.

In addition, trap levels due to impurities or defects might be formed in the vicinity of the interface between an insulating layer such as a silicon oxide film and each of the oxide semiconductor layer 130a and the oxide semiconductor layer 130c. The oxide semiconductor layer 130b can be distanced away from the trap levels owing to existence of the oxide semiconductor layer 130a and the oxide semiconductor layer 130c.

However, when the energy differences between the conduction band minimum of the oxide semiconductor layer 130b and the conduction band minimum of each of the oxide semiconductor layer 130a and the oxide semiconductor layer 130c are small, an electron in the oxide semiconductor layer 130b might reach the trap level by passing over the energy differences. When the electron is trapped in the trap level, a negative charge is generated at the interface with the insulating layer, whereby the threshold voltage of the transistor is shifted in the positive direction.

Thus, to reduce changes in the threshold voltage of the transistor, energy differences of at least certain values between the conduction band minimum of the oxide semiconductor layer 130b and the conduction band minimum of each of the oxide semiconductor layer 130a and the oxide semiconductor layer 130c are necessary. Each of the energy differences is preferably greater than or equal to 0.1 eV and further preferably greater than or equal to 0.15 eV.

The oxide semiconductor layer 130a, the oxide semiconductor layer 130b, and the oxide semiconductor layer 130c preferably include crystal parts. In particular, when a crystal in which c-axes are aligned is used, it is possible to provide stable electrical characteristics to the transistor. Moreover, crystals with c-axis alignment are resistant to bending; therefore, the reliability of a semiconductor device using a flexible substrate can be improved.

As the conductive layer 140 operating as a source electrode layer and the conductive layer 150 operating as a drain electrode layer, for example, a single layer or a stack of a material selected from Al, Cr, Cu, Ta, Ti, Mo, W, Ni, Mn, Nd, and Sc and alloys of any of these metal materials can be used. Typically, it is preferable to use Ti, which is particularly easily bonded to oxygen, or W, which has a high melting point, because subsequent process temperatures can be made relatively high or the like. It is also possible to use a stack of any of the above materials and Cu or an alloy such as Cu—Mn, which has low resistance. Note that in the transistor 105, the transistor 106, the transistor 111, and the transistor 112, for example, it is possible to use W for the conductive layer 141 and the conductive layer 151 and use a stacked film of Ti and Al for the conductive layer 142 and the conductive layer 152.

These materials are capable of extracting oxygen from an oxide semiconductor film. Therefore, in a region in part of the oxide semiconductor film that is in contact with the above material, oxygen is released from the oxide semiconductor film and an oxygen vacancy is formed. Hydrogen slightly contained in the film and the oxygen vacancy are bonded to each other, whereby the region is markedly changed to an n-type region. Accordingly, the n-type regions can operate as a source or a drain of the transistor.

For the insulating layer 160 operating as a gate insulating film, an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide can be used. In addition, the insulating layer 160 may be a stack of any of the above materials. Note that the insulating layer 160 may contain lanthanum (La), nitrogen, zirconium (Zr), or the like as an impurity.

In addition, as an example in the case where the insulating layer 160 has a stacked-layer structure, it is preferable to contain, for example, hafnium oxide, and silicon oxide or silicon oxynitride.

Hafnium oxide and aluminum oxide have higher dielectric constant than silicon oxide and silicon oxynitride. Thus, a physical thickness can be made larger than an equivalent oxide thickness; as a result, even in the case where the equivalent oxide thickness is less than or equal to 10 nm or less than or equal to 5 nm, leakage current due to tunnel current can be made low.

A region in which the density of states due to nitrogen oxide is low may be included in the insulating layer 120 and the insulating layer 160 in contact with the oxide semiconductor layer 130. As the oxide insulating layer with a low density of states of nitrogen oxide, a silicon oxynitride film that releases less nitrogen oxide, an aluminum oxynitride film that releases less nitrogen oxide, or the like can be used.

Note that a silicon oxynitride film that releases less nitrogen oxide is a film of which the amount of released ammonia is larger than the amount of released nitrogen oxide in thermal desorption spectroscopy method (TDS (Thermal Desorption Spectroscopy)); the amount of released ammonia is typically greater than or equal to $1\times10^{18}$ molecules/cm' and less than or equal to $5\times10^{19}$ molecules/cm$^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

By using the above oxide insulating layer for the insulating layer 120 and the insulating layer 160, a shift in the threshold voltage of the transistor can be reduced, which leads to reduced changes in the electrical characteristics of the transistor.

For the conductive layer 170 operating as a gate electrode layer, for example, a conductive film of Al, Ti, Cr, Co, Ni, Cu, Y, Zr, Mo, Ru, Ag, Mn, Nd, Sc, Ta, W, or the like can be used. It is also possible to use an alloy or a conductive nitride of the material. It is also possible to use a stack of a plurality of materials selected from these materials, alloys of these materials, and conductive nitrides of these materials. Typically, tungsten, a stack of tungsten and titanium nitride, a stack of tungsten and tantalum nitride, or the like can be used. In addition, it is also possible to use Cu or an alloy such as Cu—Mn, which has low resistance, or a stack of any of the above materials and Cu or an alloy such as Cu—Mn. In this embodiment, tantalum nitride is used for the conductive layer 171 and tungsten is used for the conductive layer 172 to form the conductive layer 170.

As the insulating layer 175, a silicon nitride film, an aluminum nitride film, or the like containing hydrogen can be used. In the transistor 103, the transistor 104, the transistor 106, the transistor 109, the transistor 110, and the transistor 112 described in Embodiment 2, using an insulating film containing hydrogen as the insulating layer 175 allows the oxide semiconductor layer to be partly changed to n-type. In addition, a nitride insulating film operates as a blocking film against moisture and the like and can improve the reliability of the transistor.

In addition, an aluminum oxide film can also be used as the insulating layer 175. It is particularly preferable to use an aluminum oxide film as the insulating layer 175 in the transistor 101, the transistor 102, the transistor 105, the transistor 107, the transistor 108, and the transistor 111 described in Embodiment 2. The aluminum oxide film has a high blocking effect of preventing penetration of both oxygen and impurities such as hydrogen and moisture. Accordingly, during and after the manufacturing process of the transistor, the aluminum oxide film can be suitably used as a protective film that has the effect of preventing entry of impurities such as hydrogen and moisture, which cause changes in the electrical characteristics of the transistor, into the oxide semiconductor layer 130, preventing release of oxygen, which is a main component of the oxide semiconductor layer 130, from the oxide semiconductor layer, and preventing unnecessary release of oxygen from the insulating layer 120. In addition, oxygen contained in the aluminum oxide film can be diffused into the oxide semiconductor layer.

In addition, the insulating layer 180 is preferably formed over the insulating layer 175. For the insulating layer, an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide can be used. In addition, the oxide insulating layer may be a stack of the above material.

Here, like the insulating layer 120, the insulating layer 180 preferably contains oxygen more than that in the stoichiometric composition. Oxygen released from the insulating layer 180 can be diffused into the channel formation region of the oxide semiconductor layer 130 through the insulating layer 160, so that oxygen vacancies formed in the channel formation region can be compensated with the oxygen. Thus, stable electrical characteristics of the transistor can be achieved.

High integration of a semiconductor device requires miniaturization of a transistor. In contrast, it is known that miniaturization of a transistor causes deterioration of electrical characteristics of the transistor, and an on-state current is reduced when a channel width is reduced.

The transistor 107 to the transistor 112 of embodiments of the present invention each have a structure in which the oxide semiconductor layer 130c is formed to cover the oxide semiconductor layer 130b where a channel is formed so that a channel formation layer is not in contact with the gate insulating film. Accordingly, scattering of carriers that occurs at the interface between the channel formation layer and the gate insulating film can be suppressed and the on-state current of the transistor can be increased.

In addition, in the transistor of one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in the side surface direction in addition to a gate electric field in the perpendicular direction. In other words, a gate electric field is applied to the entire channel formation layer and an effective channel width is increased, leading to a further increase in the on-state current.

Furthermore, in the transistor of one embodiment of the present invention in which the oxide semiconductor layer 130 has two layers or three layers, the transistor has the effect of making an interface state less likely to be formed by forming, over the oxide semiconductor layer 130a, the oxide semiconductor layer 130b where a channel is formed. In addition, in the transistor of one embodiment of the present invention in which the oxide semiconductor layer 130 has three layers, the transistor has the effect of eliminating the influence of an impurity that enters from upper and lower layers, or the like by positioning the oxide semiconductor layer 130b at the middle of the three-layer structure. Therefore, the above transistor can achieve not only the increase in the on-state current of the transistor but also stabilization of the threshold voltage and a reduction in the S value (subthreshold value). Thus, a current when a gate voltage VG is 0 V can be reduced and power consumption can be reduced. Furthermore, the threshold voltage of the transistor becomes stable; thus, long-term reliability of the semiconductor device can be improved. In addition, the transistor of one embodiment of the present invention is suitable for formation of a highly integrated semiconductor device because deterioration of electrical characteristics due to miniaturization is suppressed.

Note that this embodiment can be combined with the other embodiment and an example in this specification as appropriate.

(Embodiment 4)

In this embodiment, a method for manufacturing the transistor 102 and the transistor 107 described in Embodiment 2 will be described.

First, a method for manufacturing the transistor 102 is described with reference to FIG. 28 and FIG. 29. Note that a cross section of the transistor in the channel length direction is shown on the left side of the drawings, and a cross section of the transistor in the channel width direction is shown on the right side of the drawings. In addition, the drawings in the channel width direction are enlarged views; therefore, the apparent thicknesses of components differ between left and right drawings.

The case where the oxide semiconductor layer 130 has a three-layer structure of the oxide semiconductor layer 130a, the oxide semiconductor layer 130b, and the oxide semiconductor layer 130c is described as an example. In the case where the oxide semiconductor layer 130 has a two-layer structure, two layers of the oxide semiconductor layer 130a and the oxide semiconductor layer 130b is used, and in the case where the oxide semiconductor layer 130 has a single-layer structure, one layer of the oxide semiconductor layer 130b is used.

First, the insulating layer 120 is formed over the substrate 115. Description of Embodiment 3 can be referred to for the kinds of the substrate 115 and a material used for the insulating layer 120. Note that the insulating layer 120 can be formed by a sputtering method, a CVD (Chemical Vapor Deposition) method, an MBE (Molecular Beam Epitaxy) method, or the like.

In addition, oxygen may be added to the insulating layer 120 using an ion implantation method, an ion doping method, a plasma immersion ion implantation method, a plasma treatment method, or the like. By adding oxygen, supply of oxygen from the insulating layer 120 to the oxide semiconductor layer 130 can be performed much easily.

Note that in the case where a surface of the substrate 115 is made of an insulator and there is no influence of impurity diffusion into the oxide semiconductor layer 130 to be formed later, a structure in which the insulating layer 120 is not provided can also be employed.

Figure 28A:
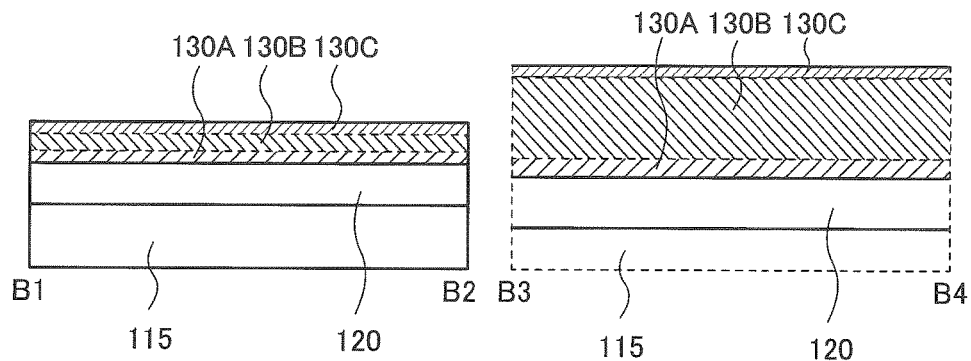
FIG. 28 Views illustrating a method for manufacturing a transistor.

Next, an oxide semiconductor film 130A to be the oxide semiconductor layer 130a, an oxide semiconductor film 130B to be the oxide semiconductor layer 130b, and an oxide semiconductor film 130C to be the oxide semiconductor layer 130c are deposited over the insulating layer 120 by a sputtering method, a CVD method, an MBE method, or the like (see FIG. 28(A)).

In the case where the oxide semiconductor layer 130 has a stacked-layer structure, oxide semiconductor films are preferably formed successively without exposure to the air with the use of a multi-chamber type deposition apparatus (e.g., a sputtering apparatus) provided with a load lock chamber. It is preferable that each chamber of the sputtering apparatus be able to be evacuated to a high vacuum (about $5\times10^{-7}$ Pa to $1\times10^{-4}$ Pa) by an adsorption vacuum evacuation pump such as a cryopump and that the chamber be able to heat a substrate to be deposited to 100° C. or higher, preferably 500° C. or higher, so that water and the like acting as impurities of an oxide semiconductor are removed as much as possible. Alternatively, a combination of a turbo molecular pump and a cold trap is preferably used to prevent back-flow of a gas containing a carbon component, moisture, or the like from an exhaust system into the chamber. Alternatively, a combination of a turbo molecular pump and a cryopump may be used as an exhaust system.

Not only high vacuum evacuation of the chamber but also high purity of a sputtering gas is necessary to obtain a highly purified intrinsic oxide semiconductor. An oxygen gas or an argon gas used for a sputtering gas can prevent entry of moisture or the like into the oxide semiconductor film as much as possible by using a gas which is highly purified to have a dew point of −40° C. or lower, preferably −80° C. or lower and further preferably −100° C. or lower.

For the oxide semiconductor film 130A, the oxide semiconductor film 130B, and the oxide semiconductor film 130C, the materials described in Embodiment 3 can be used. For example, an In—Ga—Zn oxide in which In:Ga:Zn=1:

3:6, 1:3:4, 1:3:3, or 1:3:2 [atomic ratio] can be used for the oxide semiconductor film 130A, an In—Ga—Zn oxide in which In:Ga:Zn=1:1:1, 3:1:2, or 5:5:6 [atomic ratio] can be used for the oxide semiconductor film 130B, and an In—Ga—Zn oxide in which In:Ga:Zn=1:3:6, 1:3:4, 1:3:3, or 1:3:2 [atomic ratio] can be used for the oxide semiconductor film 130C. Alternatively, an oxide semiconductor like gallium oxide may be used for the oxide semiconductor film 130A and the oxide semiconductor film 130C. Note that the atomic ratio of each of the oxide semiconductor film 130A, the oxide semiconductor film 130B, and the oxide semiconductor film 130C includes a change by ±20% of the above atomic rations as an error. In addition, in the case where a sputtering method is used for deposition, the above material can be deposited as a target.

Note that as described in detail in Embodiment 3, a material that has an electron affinity higher than that of the oxide semiconductor film 130A and that of the oxide semiconductor film 130C is used for the oxide semiconductor film 130B.

Note that the oxide semiconductor films are preferably deposited by a sputtering method. As a sputtering method, an RF sputtering method, a DC sputtering method, an AC sputtering method, or the like can be used.

After the oxide semiconductor film 130C is formed, first heat treatment may be performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, as the atmosphere of the first heat treatment, the first heat treatment may be performed in an atmosphere containing an oxidizing gas at 10 ppm or more, in order to compensate released oxygen, after heat treatment is performed in an inert gas atmosphere. By the first heat treatment, the crystallinity of the oxide semiconductor film 130A, the oxide semiconductor film 130B, and the oxide semiconductor film 130C can be increased, and impurities such as water and hydrogen can be removed from the insulating layer 120, the oxide semiconductor film 130A, the oxide semiconductor film 130B, and the oxide semiconductor film 130C. Note that the first heat treatment may be performed after etching for forming the oxide semiconductor layer 130a, the oxide semiconductor layer 130b, and the oxide semiconductor layer 130c described later.

Next, a first conductive layer is formed over the oxide semiconductor film 130A. The first conductive layer can be formed by, for example, the following method.

First, a first conductive film is formed over the oxide semiconductor film 130A. As the first conductive film, a single layer or a stack of a material selected from Al, Cr, Cu, Ta, Ti, Mo, W, Ni, Mn, Nd, and Sc and alloys of any of these metal materials can be used.

Next, a resist film is formed over the first conductive film and the resist film is subjected to light exposure by a method such as electron beam exposure, liquid immersion exposure, or EUV exposure and to development treatment, so that a first resist mask is formed. Note that an organic coating film is preferably formed as an adherence agent between the first conductive film and the resist film. Alternatively, the first resist mask may be formed using nanoimprint lithography method.

Then, the first conductive film is selectively etched using the first resist mask and the first resist mask is subjected to ashing; thus, the conductive layer is formed.

Figure 28B:
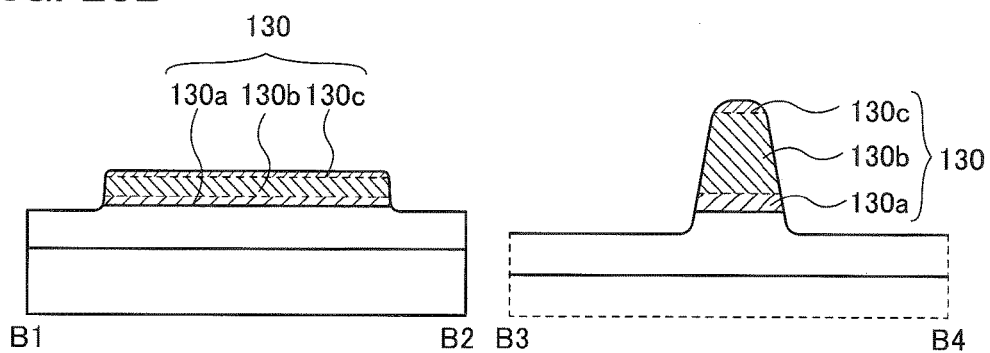
Figure 28C:
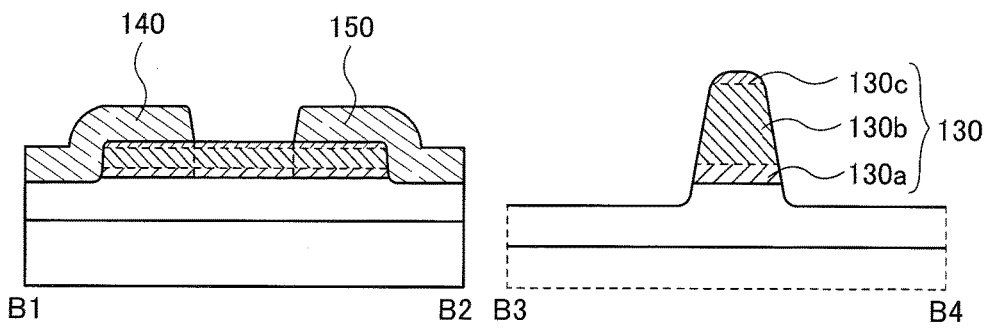

Next, the oxide semiconductor film 130A, the oxide semiconductor film 130B, and the oxide semiconductor film 130C are selectively etched using the conductive layer as a hard mask and the conductive layer is removed; thus, the oxide semiconductor layer 130 formed of a stack of the oxide semiconductor layer 130a, the oxide semiconductor layer 130b, and the oxide semiconductor layer 130c is formed (see FIG. 28(B)). Note that it is also possible to form the oxide semiconductor layer 130 using the first resist mask, without forming the above conductive layer. Here, oxygen ions may be implanted into the oxide semiconductor layer 130.

Next, a second conductive film is formed to cover the oxide semiconductor layer 130. The second conductive film can be formed with a material that can be used for the conductive layer 140 and the conductive layer 150 described in Embodiment 3. A sputtering method, a CVD method, an MBE method, or the like can be used for the formation of the second conductive film.

Then, a second resist mask is formed over portions to be a source region and a drain region. Then, part of the second conductive film is etched, whereby the conductive layer 140 and the conductive layer 150 are formed (see FIG. 28(C)).

Next, an insulating film 160A serving as a gate insulating film is formed over the oxide semiconductor layer 130, the conductive layer 140, and the conductive layer 150. The insulating film 160A can be formed with a material that can be used for the insulating layer 160 described in Embodiment 3. A sputtering method, a CVD method, an MBE method, or the like can be used for the formation of the insulating film 160A.

After that, second heat treatment may be performed. The second heat treatment can be performed in a condition similar to that of the first heat treatment. By the second heat treatment, oxygen implanted into the oxide semiconductor layer 130 can be made to diffuse into the entire oxide semiconductor layer 130. Note that it is possible to obtain this effect by third heat treatment, without performing the second heat treatment.

Then, a third conductive film 171A and a fourth conductive film 172A to be the conductive layer 170 are formed over the insulating film 160A. The third conductive film 171A and the fourth conductive film 172A can be formed with materials that can be used for the conductive layer 171 and the conductive layer 172 described in Embodiment 3. A sputtering method, a CVD method, an MBE method, or the like can be used for the formation of the third conductive film 171A and the fourth conductive film 172A.

Figure 29A:
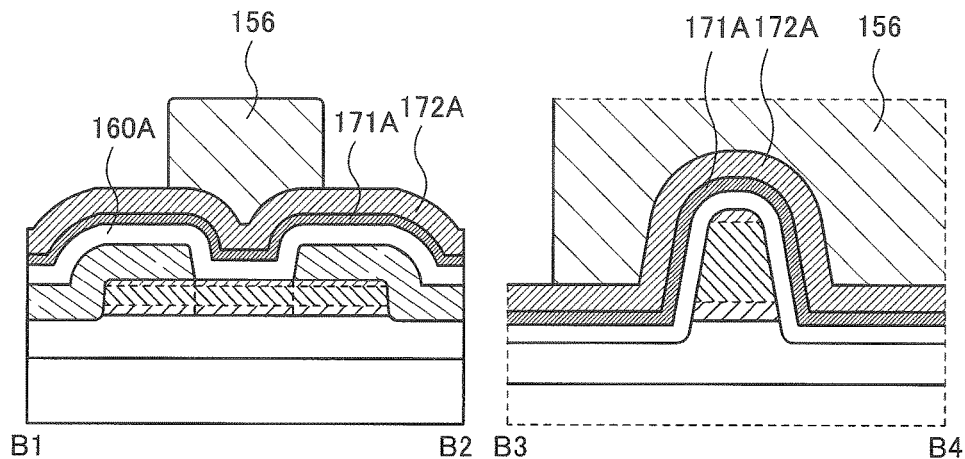
FIG. 29 Views illustrating a method for manufacturing a transistor.
Figure 29B:
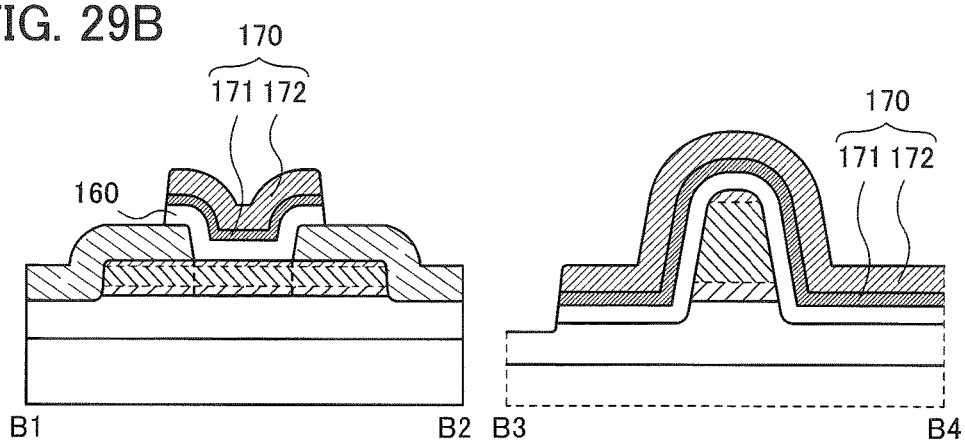

Next, a third resist mask 156 is formed over the fourth conductive film 172A (see FIG. 29(A)). Then, the third conductive film 171A, the fourth conductive film 172A, and the insulating film 160A are selectively etched using the resist mask, whereby the conductive layer 170 formed of the conductive layer 171 and the conductive layer 172 and the insulating layer 160 are formed (see FIG. 29(B)). Note that if a structure in which the insulating film 160A is not etched is employed, the transistor 102 can be manufactured.

Next, the insulating layer 175 is formed over the oxide semiconductor layer 130, the conductive layer 140, the conductive layer 150, the insulating layer 160, and the conductive layer 170. Description of Embodiment 3 can be referred to for a material of the insulating layer 175. In the case of the transistor 101, an aluminum oxide film is preferably used. The insulating layer 175 can be formed by a sputtering method, a CVD method, an MBE method, or the like.

Figure 29C:
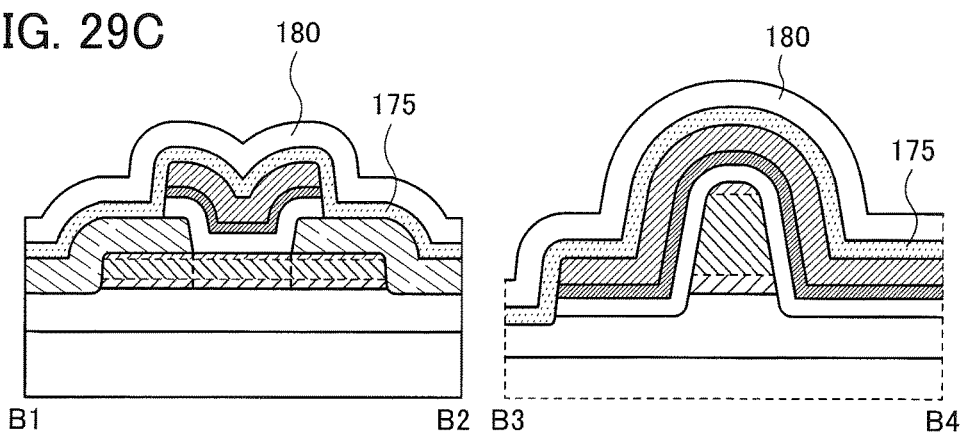

Next, the insulating layer 180 is formed over the insulating layer 175 (see FIG. 29(C)). Description of Embodiment 3 can be referred to for a material of the insulating layer 180. In addition, the insulating layer 180 can be formed by a sputtering method, a CVD method, an MBE method, or the like.

In addition, oxygen may be added to the insulating layer 175 and/or the insulating layer 180 by an ion implantation method, an ion doping method, a plasma immersion ion implantation method, a plasma treatment method, or the like. By adding oxygen, supply of oxygen from the insulating layer 175 and/or the insulating layer 180 to the oxide semiconductor layer 130 can be performed much easily.

Next, third heat treatment may be performed. The third heat treatment can be performed in a condition similar to that of the first heat treatment. By the third heat treatment, excess oxygen is easily released from the insulating layer 120, the insulating layer 175, and the insulating layer 180, so that oxygen vacancies of the oxide semiconductor layer 130 can be reduced.

Next, a method for manufacturing the transistor 107 will be described. Note that detailed description of steps overlapping with those for manufacturing the transistor 102 described above is omitted.

Figure 30A:
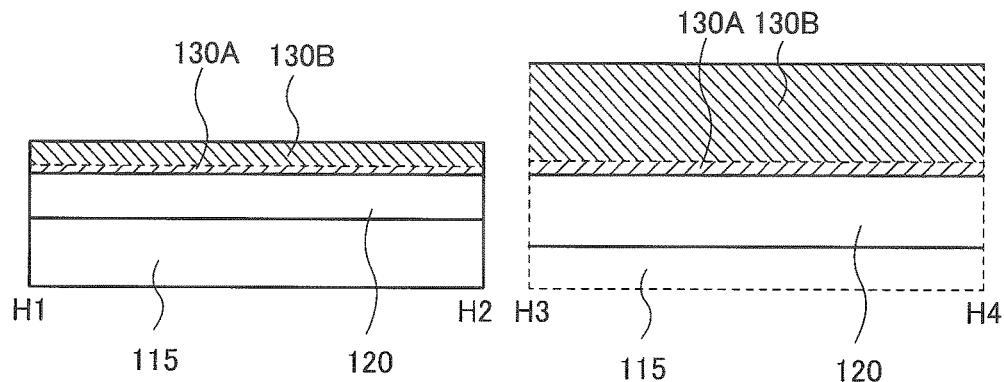
FIG. 30 Views illustrating a method for manufacturing a transistor.

The insulating layer 120 is formed over the substrate 115, and the oxide semiconductor film 130A to be the oxide semiconductor layer 130*a* and the oxide semiconductor film 130B to be the oxide semiconductor layer 130*b* are deposited over the insulating layer by a sputtering method, a CVD method, an MBE method, or the like (see FIG. 30(A)).

Figure 30B:
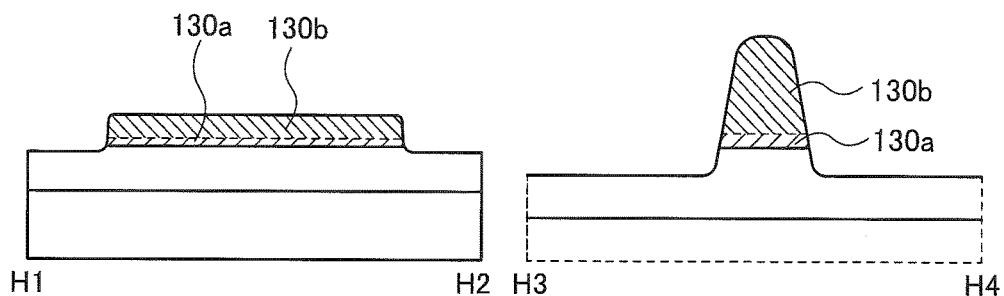

Next, a first conductive film is formed over the oxide semiconductor film 130B, and a conductive layer is formed using a first resist mask by a method similar to the above. Then, the oxide semiconductor film 130A and the oxide semiconductor film 130B are selectively etched using the conductive layer as a hard mask and the conductive layer is removed, whereby a stack of the oxide semiconductor layer 130*a* and the oxide semiconductor layer 130*b* is formed (see FIG. 30(B)). Note that it is also possible to form the stack using the first resist mask, without forming the hard mask. Here, oxygen ions may be implanted into the oxide semiconductor layer 130.

Figure 30C:
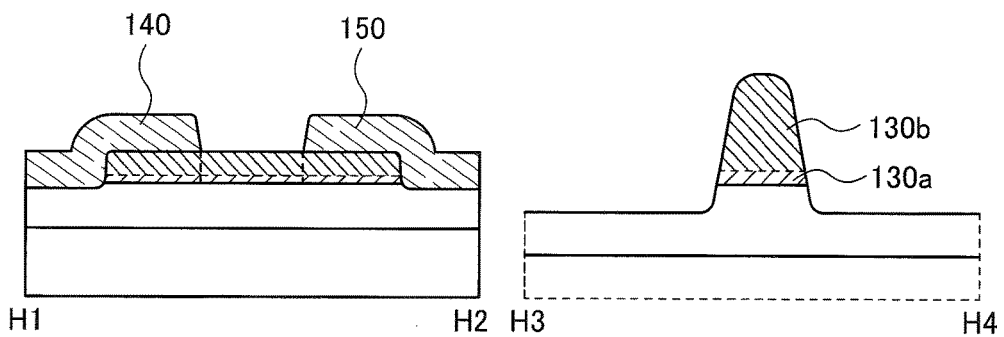

Next, a second conductive film is formed to cover the stack. Then, a second resist mask is formed over portions to be a source region and a drain region, and part of the second conductive film is etched using the second resist mask, whereby the conductive layer 140 and the conductive layer 150 are formed (see FIG. 30(C)).

Then, the oxide semiconductor film 130C to be the oxide semiconductor layer 130*c* is formed over the stack of the oxide semiconductor layer 130*a* and the oxide semiconductor layer 130*b*, the conductive layer 140, and the conductive layer 150. Furthermore, the insulating film 160A to be a gate insulating film and the third conductive film 171A and the fourth conductive film 172A to be the conductive layer 170 are formed over the oxide semiconductor film 130C.

Figure 31A:
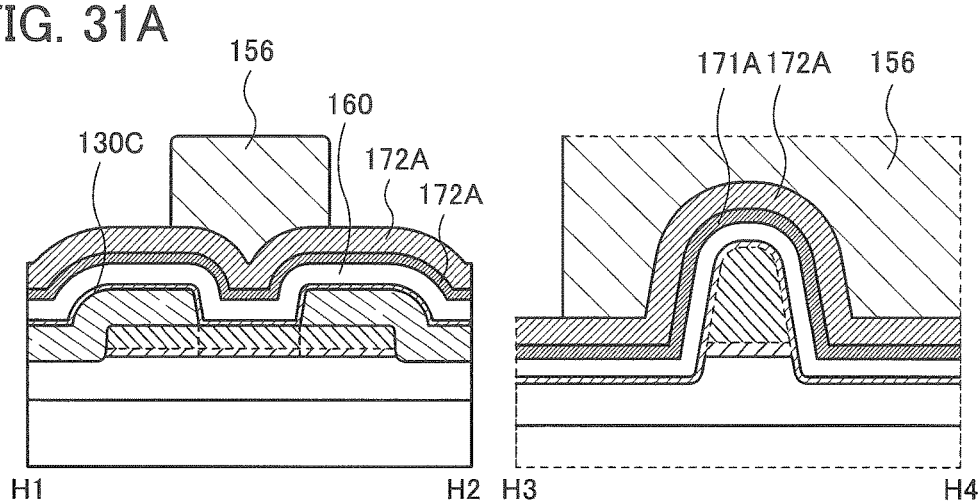
FIG. 31 Views illustrating a method for manufacturing a transistor.
Figure 31B:
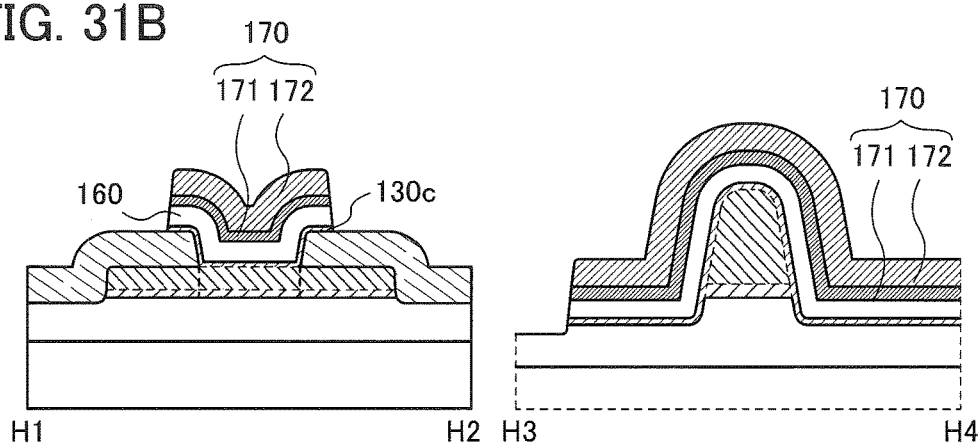

Next, the third resist mask 156 is formed over the fourth conductive film 172A (see FIG. 31(A)). Then, the third conductive film 171A, the fourth conductive film 172A, the insulating film 160A, and the oxide semiconductor film 130C are selectively etched using the resist mask, whereby the conductive layer 170 formed of the conductive layer 171 and the conductive layer 172, the insulating layer 160, and the oxide semiconductor layer 130*c* are formed (see FIG. 31(B)). Note that by etching the insulating film 160A and the oxide semiconductor film 130C using a fourth resist mask, the transistor 108 can be manufactured.

Figure 31C:
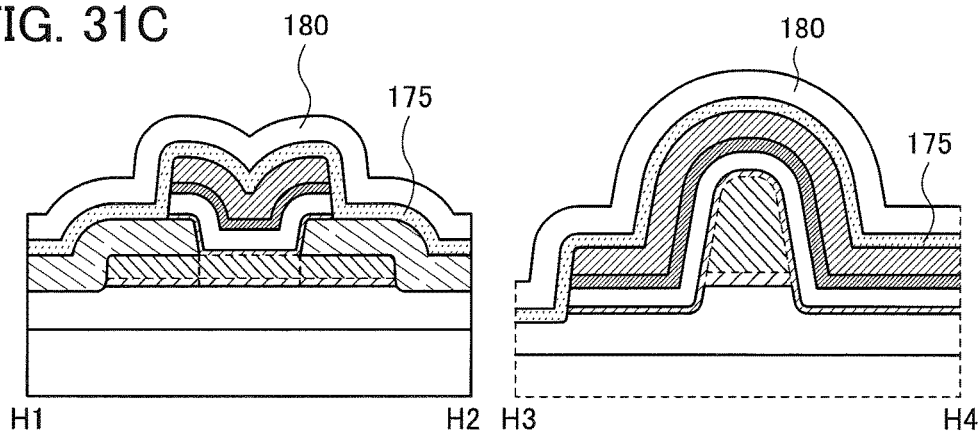

Next, the insulating layer 175 and the insulating layer 180 are formed over the insulating layer 120, the oxide semiconductor layer 130 (the oxide semiconductor layer 130*a*, the oxide semiconductor layer 130*b*, and the oxide semiconductor layer 130*c*), the conductive layer 140, the conductive layer 150, the insulating layer 160, and the conductive layer 170 (see FIG. 31(C)).

Through the above steps, the transistor 107 can be manufactured.

Note that although the variety of films such as the metal films, the semiconductor films, and the inorganic insulating films which are described in this embodiment typically can be formed by a sputtering method or a plasma CVD method, such films may be formed by another method, e.g., a thermal CVD method. There is an MOCVD (Metal Organic Chemical Vapor Deposition) method, an ALD (Atomic Layer Deposition) method, or the like as an example of a thermal CVD method.

A thermal CVD method has an advantage that no defect due to plasma damage is generated because it is a deposition method that does not utilize plasma.

In addition, in a thermal CVD method, deposition may be performed in such a manner that a source gas and an oxidizer are supplied to the chamber at a time, the pressure in the chamber is set to an atmospheric pressure or a reduced pressure, and reaction is caused in the vicinity of the substrate or over the substrate.

An ALD method may perform deposition in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves), and an inert gas (e.g., argon or nitrogen) or the like is introduced at the same time as or after the introduction of the first source gas so that the source gases are not mixed, and then a second source gas is introduced. Note that in the case where the inert gas is introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas which is introduced later is reacted; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, a thickness can be accurately adjusted and thus it is suitable for manufacturing a minute FET.

The variety of films such as the metal film, the semiconductor film, and the inorganic insulating film which have been disclosed in the embodiments can be formed by a thermal CVD method such as an MOCVD method or an ALD method, and in the case where an In—Ga—Zn—$O_x$ (x>0) film is formed, for example, trimethylindium, trimethylgallium, and dimethylzinc can be used. Note that the chemical formula of trimethylindium is $In(CH_3)_3$. In addition, the chemical formula of trimethylgallium is $Ga(CH_3)_3$. In addition, the chemical formula of dimethylzinc is $Zn(CH_3)_2$. In addition, without limitation to the above combination, triethylgallium (chemical formula: Ga($C_2H_5$)$_3$) can be used instead of trimethylgallium and diethylzinc (chemical formula: Zn($C_2H_5$)$_2$) can be used instead of dimethylzinc.

In the case where a hafnium oxide film is formed using a deposition apparatus employing ALD, for example, two kinds of gases of a source gas which is obtained by vaporizing liquid containing a solvent and a hafnium precursor compound (a hafnium alkoxide solution, typically, tetrakis (dimethylamide)hafnium (TDMAH)) and ozone ($O_3$) as an oxidizer are used. Note that the chemical formula of tetrakis (dimethylamide)hafnium is Hf[N($CH_3$)$_2$]$_4$. In addition, there is tetrakis(ethylmethylamide)hafnium or the like as another material liquid.

In the case where an aluminum oxide film is formed using a deposition apparatus employing ALD, for example, two kinds of gases of a source gas which is obtained by vaporizing liquid containing a solvent and an aluminum precursor compound (e.g., trimethylaluminum (TMA)) and $H_2O$ as an oxidizer are used. Note that the chemical formula of trimethylaluminum is Al($CH_3$)$_3$. In addition, there is tris(dimethylamide)aluminum, triisobutylaluminum, and aluminum tris(2,2,6,6-tetramethyl-3,5-heptanedionate) or the like as another material liquid.

In the case where a silicon oxide film is formed using a deposition apparatus employing ALD, for example, hexachlorodisilane is adsorbed on a surface where a film is to be formed, chlorine contained in the adsorbate is removed, and radicals of an oxidizing gas ($O_2$ or dinitrogen monoxide) are supplied to react.

In the case where a tungsten film is formed using a deposition apparatus employing ALD, for example, a $WF_6$ gas and a $B_2H_6$ gas are sequentially introduced plural times to form an initial tungsten film, and then a $WF_6$ gas and an $H_2$ gas are introduced at a time, so that the tungsten film is formed. Note that an $SiH_4$ gas may be used instead of a $B_2H_6$ gas.

In the case where an oxide semiconductor film, e.g., an In—Ga—Zn—Ox (X>0) film is formed using a deposition apparatus employing ALD, for example, an In($CH_3$)$_3$ gas and an $O_3$ gas are sequentially introduced plural times to form an In—O layer, then a Ga($CH_3$)$_3$ gas and an $O_3$ gas are introduced at a time to form a GaO layer, and then further a Zn($CH_3$)$_2$ gas and an $O_3$ gas are introduced at a time to form a ZnO layer. Note that the order of these layers is not limited to this example. In addition, a mixed compound layer such as an In—Ga—O layer, an In—Zn—O layer, or a Ga—Zn—O layer may be formed by mixing of these gases. Note that although an $H_2O$ gas which is obtained by bubbling with an inert gas such as an Ar gas may be used instead of an $O_3$ gas, it is preferable to use an $O_3$ gas, which does not contain H. In addition, instead of an In($CH_3$)$_3$ gas, an In($C_2H_5$)$_3$ gas may be used. In addition, instead of a Ga($CH_3$)$_3$ gas, a Ga($C_2H_5$)$_3$ gas may be used. Furthermore, a Zn($CH_3$)$_2$ gas may be used.

Note that this embodiment can be combined with the other embodiment and an examples in this specification as appropriate.

(Embodiment 5)

In this embodiment, an oxide semiconductor film that can be used for a transistor of one embodiment of the present invention will be described.

In this specification, the term "parallel" means a state where the angle formed between two straight lines is greater than or equal to −10° and less than or equal to 10°. Accordingly, the case where the angle is greater than or equal to −5° and less than or equal to 5° is also included. In addition, "substantially parallel" means a state where the angle formed between two straight lines is greater than or equal to −30° and less than or equal to 30°. In addition, "perpendicular" means a state where an angle formed between two straight lines is greater than or equal to 80° and less than or equal to 100°. Accordingly, an angle greater than or equal to 85° and less than or equal to 95° is also included. In addition, "substantially perpendicular" means a state where the angle formed between two straight lines is greater than or equal to 60° and less than or equal to 120°.

In addition, in this specification, in the case where a crystal is a trigonal crystal or a rhombohedral crystal, it is expressed as a hexagonal crystal system.

<Structure of Oxide Semiconductor>

The structure of an oxide semiconductor is described below.

Oxide semiconductors are classified roughly into a non-single-crystal oxide semiconductor and a single-crystal oxide semiconductor. The non-single-crystal oxide semiconductor refers to CAAC-OS (C Axis Aligned Crystalline Oxide Semiconductor), a polycrystalline oxide semiconductor, a microcrystalline oxide semiconductor, an amorphous oxide semiconductor, or the like. Alternatively, an oxide semiconductor is classified roughly into a crystalline oxide semiconductor and an amorphous oxide semiconductor.

First, a CAAC-OS is described.

A CAAC-OS is one of oxide semiconductors having a plurality of c-axis aligned crystal parts (also referred to as pellets).

By observing a combined analysis image (also referred to as a high-resolution TEM image) of a bright-field image and a diffraction pattern of a CAAC-OS by a transmission electron microscope (TEM: Transmission Electron Microscope), a plurality of pellets can be observed. In contrast, in the high-resolution TEM image, a clear boundary between pellets, that is, a grain boundary (also referred to as grain boundary) cannot be observed. Thus, in the CAAC-OS, a reduction in electron mobility due to the grain boundary is less likely to occur.

Figure 32A:
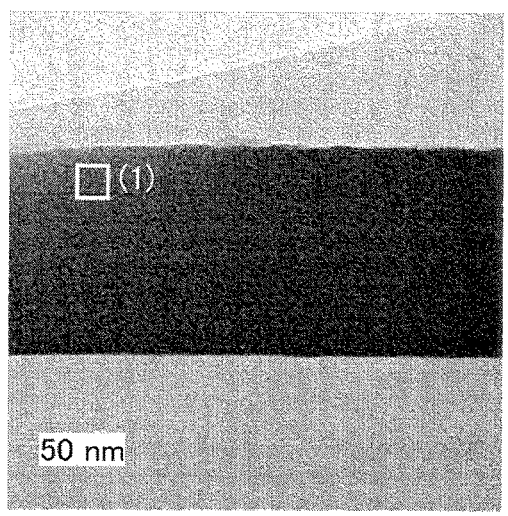
FIG. 32 Cs-corrected high-resolution TEM images of a cross section of a CAAC-OS and a cross-sectional schematic view of a CAAC-OS.

For example, as shown in FIG. 32(A), a high-resolution TEM image of a cross section of the CAAC-OS is observed from a direction substantially parallel to the sample surface. Here, the TEM image is observed using a spherical aberration corrector (Spherical Aberration Corrector) function. Note that the high-resolution TEM image using a spherical aberration corrector function is particularly referred to as a Cs-corrected high-resolution TEM image in the following description. Note that the Cs-corrected high-resolution TEM image can be obtained with, for example, an atomic resolution analytical electron microscope JEM-ARM200F manufactured by JEOL Ltd.

Figure 32B:
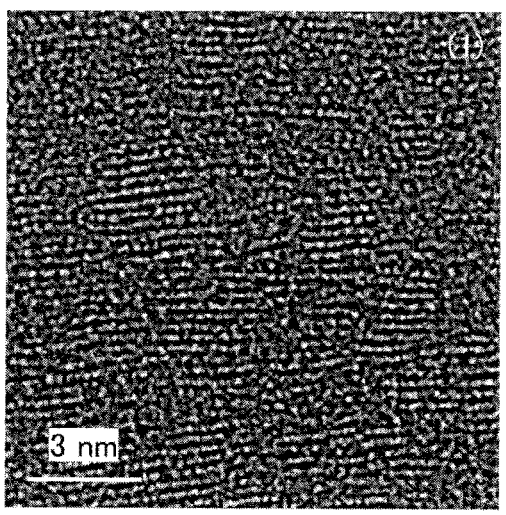

FIG. 32(B) is a Cs-corrected high-resolution TEM image which enlarged a region (1) of FIG. 32(A). According to FIG. 32(B), it can be confirmed that metal atoms are arranged in a layered manner in a pellet. Each layer of metal atoms has a configuration reflecting unevenness of a surface over which the CAAC-OS is formed (hereinafter, the surface is referred to as a formation surface) or a top surface thereof, and is arranged parallel to the formation surface or the top surface of the CAAC-OS.

Figure 32C:
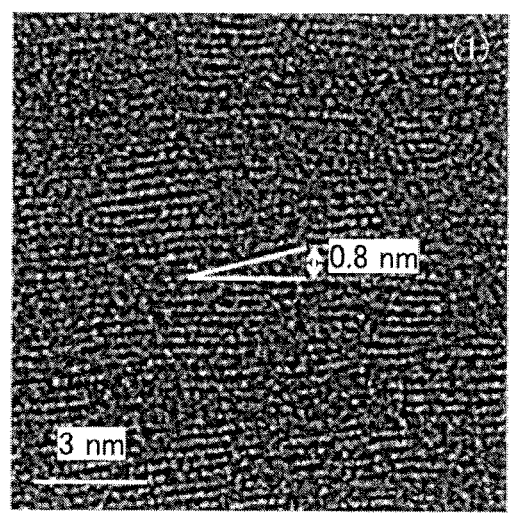

In FIG. 32(B), the CAAC-OS has a characteristic atomic arrangement. FIG. 32(C) shows the characteristic atomic arrangement which is denoted by an auxiliary line. According to FIG. 32(B) and FIG. 32(C), it is found that the size of a pellet is about 1 nm or more and 3 nm or less, and the size of a space caused by tilt of the pellets is about 0.8 nm.

Figure 32D:
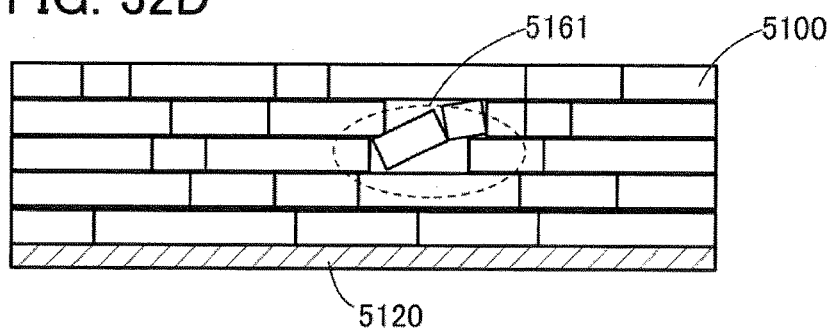

Here, according to the Cs-corrected high-resolution TEM images, when the arrangement of pellets of a CAAC-OS over a substrate 5120 is illustrated schematically, a structure in which bricks or blocks are stacked is obtained (see FIG. 32(D)). The part in which the pellets are tilted as observed in FIG. 32(C) corresponds to a region 5161 shown in FIG. 32(D).

In addition, for example, as shown in FIG. 33(A), a Cs-corrected high-resolution TEM image of a plane of the CAAC-OS is observed from a direction substantially perpendicular to the sample surface. Enlarged Cs-corrected high-resolution TEM images of a region (1), a region (2), and a region (3) in FIG. 33(A) are shown in FIG. 33(B), FIG. 33(C), and FIG. 33(D), respectively. According to FIG. 33(B), FIG. 33(C), and FIG. 33(D), it can be confirmed that metal atoms are arranged in a triangular, quadrangular, or hexagonal configuration in a pellet. However, there is no regularity of arrangement of metal atoms between different pellets.

Figure 34A:
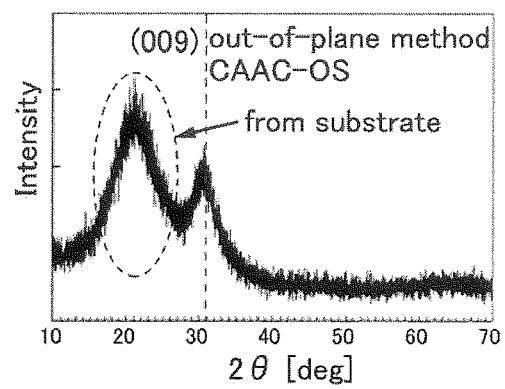
FIG. 34 Graphs showing structural analysis of a CAAC-OS and a single crystal oxide semiconductor by XRD.

For example, when a CAAC-OS film having an $InGaZnO_4$ crystal is subjected to structural analysis by an out-of-plane method using an X-ray diffraction (XRD: X-Ray Diffraction) device, a peak appears at a diffraction angle ($2\theta$) of around 31° as shown in FIG. 34(A). This peak is derived from the (009) plane of the $InGaZnO_4$ crystal; therefore, it can be confirmed that crystals in the CAAC-OS have c-axis alignment and that the c-axes are aligned in a direction substantially perpendicular to the formation surface or the top surface.

Note that in structural analysis of the CAAC-OS having an $InGaZnO_4$ crystal by an out-of-plane method, another peak appears in some cases when $2\theta$ is around 36°, in addition to the peak at $2\theta$ of around 31°. The peak of $2\theta$ at around 36° indicates that a crystal having no c-axis alignment is included in part of the CAAC-OS. It is preferable that the CAAC-OS indicate a peak of $2\theta$ at around 31° and do not indicate a peak of $2\theta$ at around 36°.

Figure 34B:
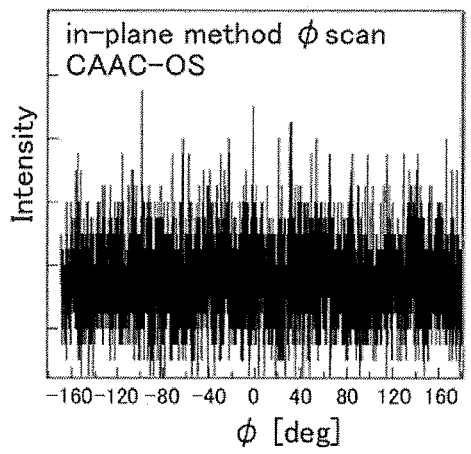
Figure 34C:
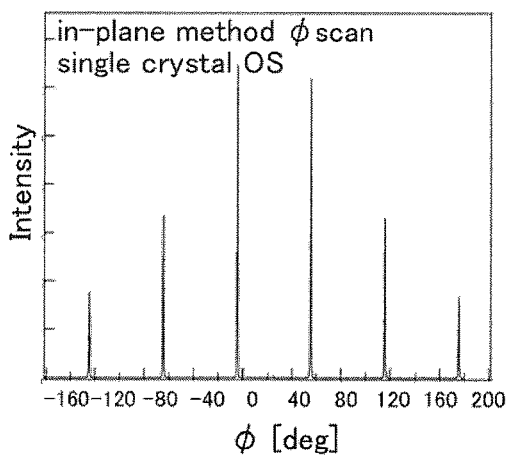

On the other hand, when the CAAC-OS is subjected to structural analysis by an in-plane method in which an X-ray is incident in a direction substantially perpendicular to the c-axis, a peak of $2\theta$ appears at around 56°. This peak is derived from the (110) plane of the $InGaZnO_4$ crystal. In the case of the CAAC-OS, even when analysis ($\phi$ scan) is performed with $2\theta$ fixed at around 56° and with the sample rotated using a normal vector of the sample surface as an axis ($\phi$ axis), a peak is not clearly observed as shown in FIG. 34(B). In contrast, in the case of a single crystal oxide semiconductor of $InGaZnO_4$, when $\phi$ scan is performed with $2\theta$ fixed at around 56°, six peaks which are derived from crystal planes equivalent to the (110) plane are observed as shown in FIG. 34(C). Accordingly, it can be confirmed from the structural analysis using XRD that orientation of a-axes and b-axes are irregular in the CAAC-OS.

Figure 35A:
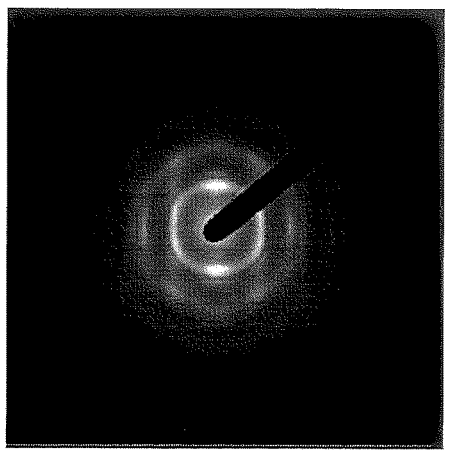
FIG. 35 Views showing electron diffraction patterns of a CAAC-OS.
Figure 35B:
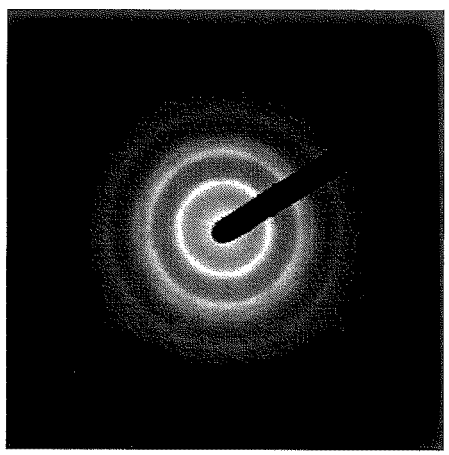

Next, FIG. 35(A) shows a diffraction pattern (also referred to as a selected-area transmission electron diffraction pattern) when an electron beam with a probe diameter of 300 nm is incident on an In—Ga—Zn oxide that is a CAAC-OS in a direction parallel to the sample surface. According to FIG. 35(A), for example, spots derived from the (009) plane of an $InGaZnO_4$ crystal are observed. Thus, it is found also from the electron diffraction that pellets included in the CAAC-OS have c-axis alignment and that the c-axes are aligned in a direction substantially perpendicular to the formation surface or the top surface. Meanwhile, FIG. 35(B) shows a diffraction pattern when an electron beam with a probe diameter of 300 nm is incident on the same sample in a direction perpendicular to the sample surface. According to FIG. 35(B), a ring-like diffraction pattern is observed. Thus, it is found even from the electron diffraction that the a-axes and b-axes of the pellets included in the CAAC-OS do not have regular alignment. Note that the first ring in FIG. 35(B) is thought to be derived from the (010) plane, the (100) plane, and the like of the $InGaZnO_4$ crystal. In addition, the second ring in FIG. 35(B) is thought to be derived from the (110) plane and the like.

The CAAC-OS is an oxide semiconductor with a low impurity concentration. The impurity means an element other than the main components of the oxide semiconductor, such as hydrogen, carbon, silicon, or a transition metal element. In particular, an element having higher strength of bonding to oxygen than a metal element that forms an oxide semiconductor, such as silicon, extracts oxygen from the oxide semiconductor, which results in disorder of the atomic arrangement and reduced crystallinity of the oxide semiconductor. In addition, a heavy metal such as iron or nickel, argon, carbon dioxide, or the like has a large atomic radius (or molecular radius), and thus disturbs the atomic arrangement of the oxide semiconductor and decreases crystallinity when contained in the oxide semiconductor. Note that the impurity contained in the oxide semiconductor serves as a carrier trap or a carrier generation source in some cases.

Moreover, the CAAC-OS is an oxide semiconductor having a low density of defect states. For example, oxygen vacancies in the oxide semiconductor serve as carrier traps or serve as carrier generation sources when hydrogen is captured therein in some cases.

The state in which impurity concentration is low and density of defect states is low (the number of oxygen vacancies is small) is referred to as a highly purified intrinsic or substantially highly purified intrinsic state. A highly purified intrinsic or substantially highly purified intrinsic oxide semiconductor has few carrier generation sources, and thus can reduce carrier density. Thus, a transistor using the oxide semiconductor rarely has a negative threshold voltage (is rarely normally on). In addition, the highly purified intrinsic or substantially highly purified intrinsic oxide semiconductor has few carrier traps. Therefore, the transistor using the oxide semiconductor has little changes in electrical characteristics and high reliability. Note that an electric charge trapped by the carrier traps in the oxide semiconductor takes a long time to be released and the trapped electric charge may behave like a fixed electric charge. Thus, the transistor using the oxide semiconductor having a high impurity concentration and a high density of defect states has unstable electrical characteristics in some cases.

In a transistor using the CAAC-OS, change in electrical characteristics due to irradiation with visible light or ultraviolet light is small.

Next, a microcrystalline oxide semiconductor is described.

A microcrystalline oxide semiconductor has a region in which a crystal part can be observed and a region in which a crystal part cannot be observed clearly in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor having a nanocrystal (nc: nanocrystal) which is a microcrystal with a size greater than or equal to 1 nm and less than or equal to 10 nm, or a size greater than or equal to 1 nm and less than or equal to 3 nm is specifically referred to as an nc-OS (nanocrystalline Oxide Semiconductor). In addition, in a high-resolution TEM image of the nc-OS, for example, a grain boundary cannot be clearly observed in some cases. Note that there is a possibility that the origin of the nanocrystal is the same as that of a pellet in a CAAC-OS. Therefore, a crystal part of the nc-OS is referred to as a pellet in the following description.

In a microscopic region (e.g., a region with a size greater than or equal to 1 nm and less than or equal to 10 nm, in particular, a region with a size greater than or equal to 1 nm and less than or equal to 3 nm), the nc-OS has a periodic atomic arrangement. In addition, no regularity of crystal orientation between different pellets can be observed in the nc-OS. Thus, the orientation of the whole film is not observed. Accordingly, in some cases, the nc-OS cannot be distinguished from an amorphous oxide semiconductor, depending on an analysis method. For example, when the nc-OS is subjected to structural analysis using an XRD apparatus that uses an X-ray having a diameter larger than the size of a pellet, a peak which shows a crystal plane is not detected in analysis by an out-of-plane method. Furthermore, a diffraction pattern like a halo pattern is observed when the nc-OS is subjected to electron diffraction (also referred to as selected-area electron diffraction) using an electron beam with a probe diameter (e.g., 50 nm or larger) that is larger than a pellet. Meanwhile, spots are observed when the nc-OS is subjected to nanobeam electron diffraction using an electron beam having a probe diameter close to or smaller than a pellet. Moreover, regions with high luminance are observed in some cases as if a circular is described (in a ring-like state) when the nc-OS is subjected to nanobeam electron diffraction. In addition, when the nc-OS is subjected to nanobeam electron diffraction, a plurality of spots is observed in a ring-like region in some cases.

Thus, the nc-OS is an oxide semiconductor that has high regularity as compared to an amorphous oxide semiconductor. Therefore, the nc-OS is likely to have a lower density of defect states than an amorphous oxide semiconductor. Note that no regularity of crystal orientation between different pellets can be observed in the nc-OS. Therefore, the nc-OS has a higher density of defect states than the CAAC-OS.

Next, an amorphous oxide semiconductor is described.

The amorphous oxide semiconductor is such an oxide semiconductor having disordered atomic arrangement and no crystal part in a film. An example is an oxide semiconductor having no specific state as in quartz.

In a high-resolution TEM image, crystal parts cannot be found in the amorphous oxide semiconductor.

When the amorphous oxide semiconductor is subjected to structural analysis using an XRD apparatus, a peak which shows a crystal plane is not detected in analysis by an out-of-plane method. In addition, a halo pattern is observed when the amorphous oxide semiconductor is subjected to electron diffraction. Furthermore, a spot is not observed and a halo pattern is observed when the amorphous oxide semiconductor is subjected to nanobeam electron diffraction.

Note that an oxide semiconductor has a structure indicating physical properties intermediate between the nc-OS and the amorphous oxide semiconductor in some cases. The oxide semiconductor having such a structure is specifically referred to as an amorphous-like oxide semiconductor (a-like OS: amorphous-like Oxide Semiconductor).

In a high-resolution TEM image of the a-like OS, a void (also referred to as a void) is observed in some cases. Furthermore, the high-resolution TEM image has a region where a crystal part is clearly observed and a region where a crystal part cannot be observed.

A difference in effect of electron irradiation between structures of an oxide semiconductor is described below.

An a-like OS, an nc-OS, and a CAAC-OS are prepared. Each of the samples is an In—Ga—Zn oxide.

First, a high-resolution cross-sectional TEM image of each sample is obtained. The high-resolution cross-sectional TEM images show that all the samples have crystal parts.

Figure 54:
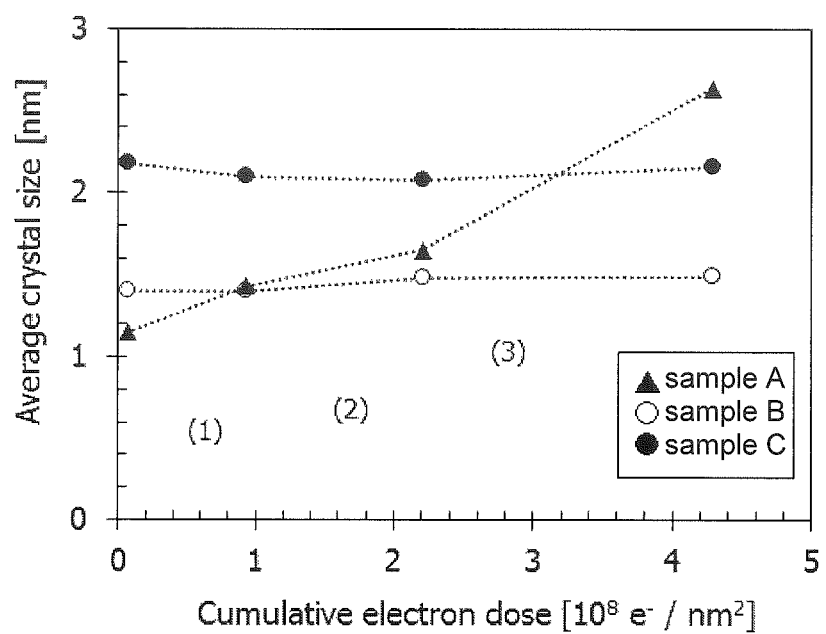
FIG. 54 A graph showing a change of crystal part of an In—Ga—Zn oxide induced by electron irradiation.

Furthermore, the size of the crystal part of each sample is measured. FIG. 54 shows an example in which the change in the average size of crystal parts (at 22 points to 45 points) in each sample is studied. According to FIG. 54, it is found that the crystal part size in the a-like OS increases with an increase in the cumulative electron dose. Specifically, as shown by (1) in FIG. 54, it is found that a crystal part of about 1.2 nm at the start of TEM observation grows to a size of about 2.6 nm at a cumulative electron dose of $4.2 \times 10^8$ $e^-/nm^2$. In contrast, it is found that the crystal part size in the nc-OS and the CAAC-OS shows little change from the start of electron irradiation to a cumulative electron dose of $4.2 \times 10^8$ $e^-/nm^2$ regardless of the cumulative electron dose. Specifically, as shown by (2) in FIG. 54, it is found that the crystal part size is about 1.4 nm regardless of the observation time by TEM. Furthermore, as shown by (3) in FIG. 54, it is found that the crystal part size is about 2.1 nm regardless of the observation time by TEM.

In this manner, growth of the crystal part occurs due to the crystallization of the a-like OS, which is induced by a slight amount of electron beam employed in the TEM observation. In contrast, in the nc-OS and the CAAC-OS that have good quality, crystallization hardly occurs by a slight amount of electron beam used for TEM observation.

Note that the crystal part size in the a-like OS and the nc-OS can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Thus, the spacing between these adjacent layers is equivalent to the lattice spacing on the (009) plane (also referred to as d value), and the value is calculated to 0.29 nm from crystal structure analysis. Therefore, each of the lattice fringes in which the spacing therebetween is from 0.28 nm or more and 0.30 nm or less is regarded to correspond to the a-b plane of the $InGaZnO_4$ crystal, focusing on the lattice fringes in the high-resolution TEM image.

Furthermore, the density of an oxide semiconductor varies depending on the structure in some cases. For example, when the composition of an oxide semiconductor is determined, the structure of the oxide semiconductor can be estimated by comparing the density of the oxide semiconductor with the density of a single crystal having the same composition as the oxide semiconductor. For example, the density of the a-like OS is higher than or equal to 78.6% and lower than 92.3% of the density of the single crystal. For example, the density of each of the nc-OS and the CAAC-OS is higher than or equal to 92.3% and lower than 100% of the density of the single crystal. Note that it is difficult to deposit an oxide semiconductor having a density of lower than 78% of the density of the single crystal.

Specific examples of the above description are given. For example, in an oxide semiconductor which satisfies In:Ga:Zn=1:1:1 [atomic ratio], the density of single crystal $InGaZnO_4$ with a rhombohedral crystal structure is 6.357 $g/cm^3$. Thus, in the oxide semiconductor which satisfies In:Ga:Zn=1:1:1 [atomic ratio], the density of the a-like OS is higher than or equal to 5.0 $g/cm^3$ and lower than 5.9 g/cm³. In addition, for example, in the oxide semiconductor which satisfies In:Ga:Zn=1:1:1 [atomic ratio], the density of each of the nc-OS and the CAAC-OS is higher than or equal to 5.9 g/cm³ and lower than 6.3 g/cm³.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor may be a stacked film including two or more kinds of an amorphous oxide semiconductor, an a-like OS, a microcrystalline oxide semiconductor, and a CAAC-OS, for example.

<Deposition Model>

Examples of deposition models of a CAAC-OS and an nc-OS are described below.

Figure 55A:
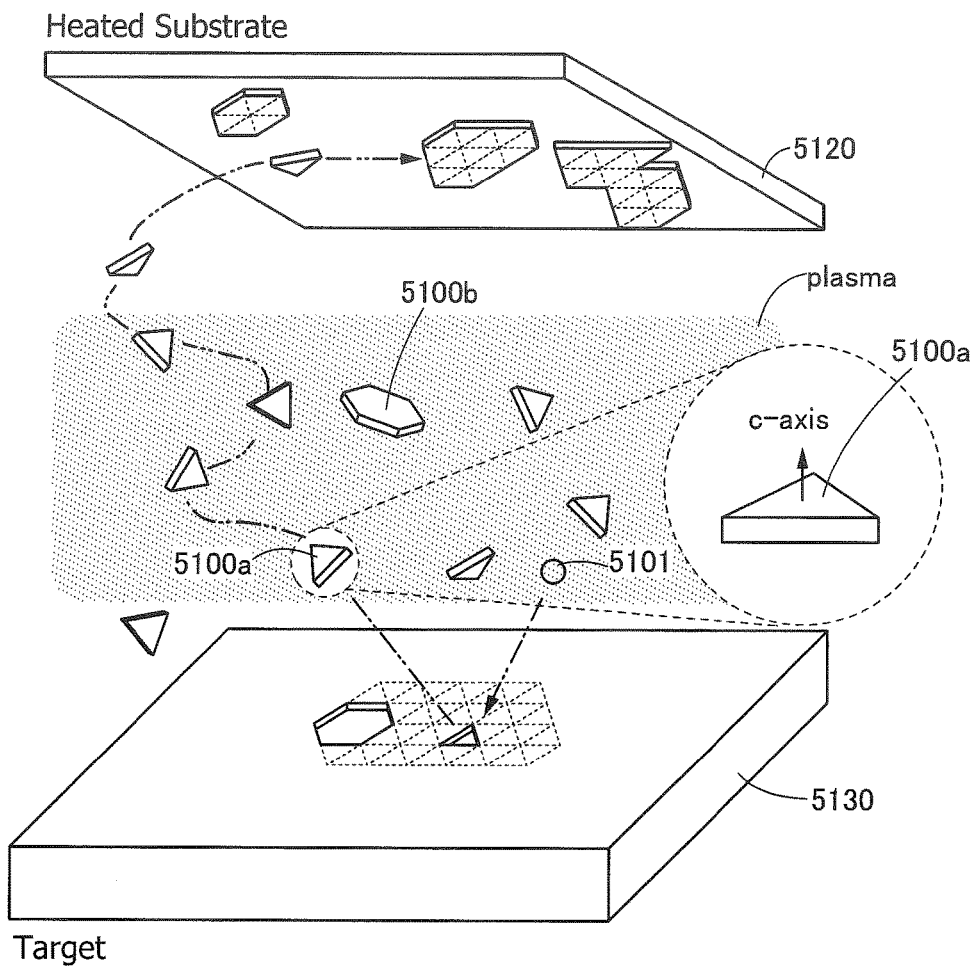
FIG. 55 A schematic diagram illustrating a CAAC-OS deposition model and cross-sectional views of pellets and a CAAC-OS.

FIG. 55(A) is a schematic view of the inside of a deposition chamber where a CAAC-OS is deposited by a sputtering method.

A target 5130 is attached to a backing plate. Under the target 5130 and the backing plate, a plurality of magnets are provided. The plurality of magnets cause a magnetic field over the target 5130. A sputtering method in which the deposition speed is increased by utilizing a magnetic field of magnets is referred to as a magnetron sputtering method.

The target 5130 has a polycrystalline structure in which a cleavage plane exists in at least one crystal grain. Note that the details of the cleavage plane are described later.

A substrate 5120 is placed to face the target 5130, and the distanced (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., oxygen, argon, or a mixed gas containing oxygen at 50 vol % or higher) and controlled to higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. Note that a high-density plasma region is formed by the magnetic field over the target 5130. In the high-density plasma region, the deposition gas is ionized, so that an ion 5101 is generated. The ion 5101 is, for example, an oxygen cation ($O^+$), an argon cation ($Ar^+$), and the like.

The ion 5101 is accelerated to the target 5130 side by an electric field, and collides with the target 5130 eventually. At this time, a pellet 5100a and a pellet 5100b which are flat-plate-like sputtered particles are separated and sputtered from the cleavage plane. Note that structures of the pellet 5100a and the pellet 5100b are distorted in some cases by an impact of collision of the ion 5101.

The pellet 5100a is a flat-plate-like sputtered particle having a triangle plane, for example, a regular triangle plane. In addition, the pellet 5100b is a flat-plate-like sputtered particle having a hexagon plane, for example, a regular hexagon plane. Note that flat-plate-like sputtered particles such as the pellet 5100a and the pellet 5100b are collectively called pellets 5100. The shape of a flat plane of the pellet 5100 is not limited to a triangle or a hexagon; for example, the flat plane may have a shape formed by combining greater than or equal to 2 and less than or equal to 6 triangles. For example, a square (rhombus) is formed by combining two triangles (regular triangles) in some cases.

The thickness of the pellet 5100 is determined depending on the kind of the deposition gas and the like. The thicknesses of the pellets 5100 are preferably uniform; the reasons thereof are described later. In addition, as the sputtered particle, a pellet shape with a small thickness is preferred to a dice shape with a large thickness.

Figure 57:
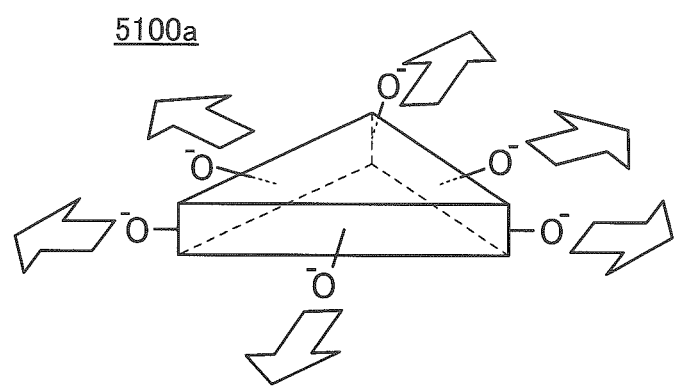
FIG. 57 A diagram illustrating a pellet.

The pellet 5100 receives charge when passing through the plasma, so that the side surfaces are negatively or positively charged in some cases. The pellet 5100 has an oxygen atom on its side surface, and the oxygen atom may be negatively charged. For example, an example in which the pellet 5100a has, on its side surfaces, oxygen atoms that are negatively charged is illustrated in FIG. 57. As in this view, when the side surfaces are charged in the same polarity, charges repel each other, and accordingly, a flat-plate shape can be maintained. Note that in the case where a CAAC-OS is an In—Ga—Zn oxide, there is a possibility that an oxygen atom bonded to an indium atom is negatively charged. Alternatively, there is another possibility that an oxygen atom bonded to an indium atom, a gallium atom, and a zinc atom is negatively charged.

Figure 58:
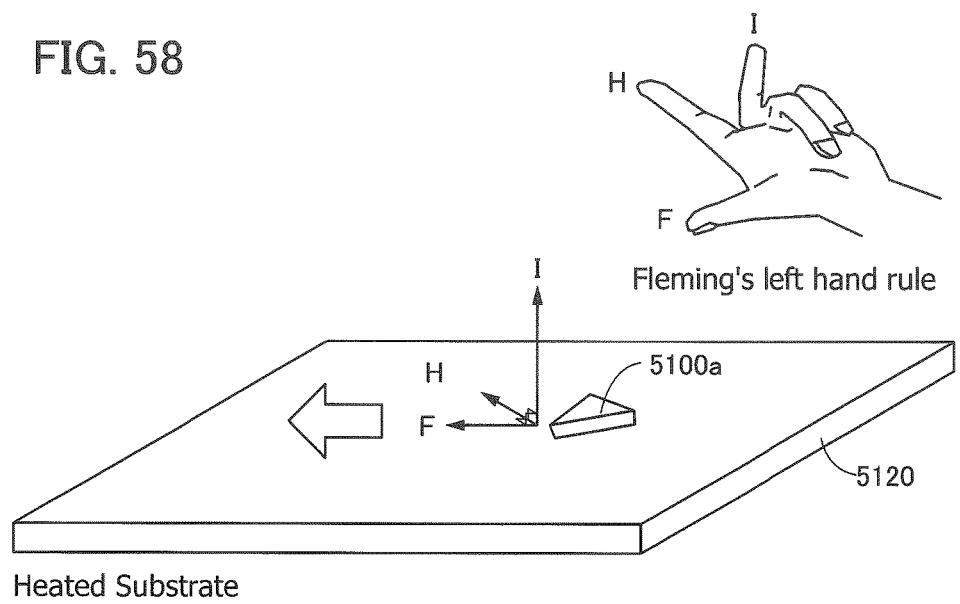
FIG. 58 A diagram illustrating force applied to a pellet on a formation surface.

As shown in FIG. 55(A), for example, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field is generated in a direction parallel to a top surface of the substrate 5120. In addition, a potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current (see FIG. 58). This can be understood with Fleming's left-hand rule. Note that in order to increase a force applied to the pellet 5100, it is preferable to provide, on the top surface of the substrate 5120, a region where the magnetic field in a direction parallel to the top surface of the substrate 5120 is 10 G or higher, preferably 20 G or higher, further preferably 30 G or higher, and still further preferably 50 G or higher. Alternatively, it is preferable to provide, on the top surface of the substrate 5120, a region where the magnetic field in a direction parallel to the top surface of the substrate 5120 is 1.5 times or higher, preferably twice or higher, further preferably 3 times or higher, and still further preferably 5 times or higher as high as the magnetic field in a direction perpendicular to the top surface of the substrate 5120.

Figure 59A:
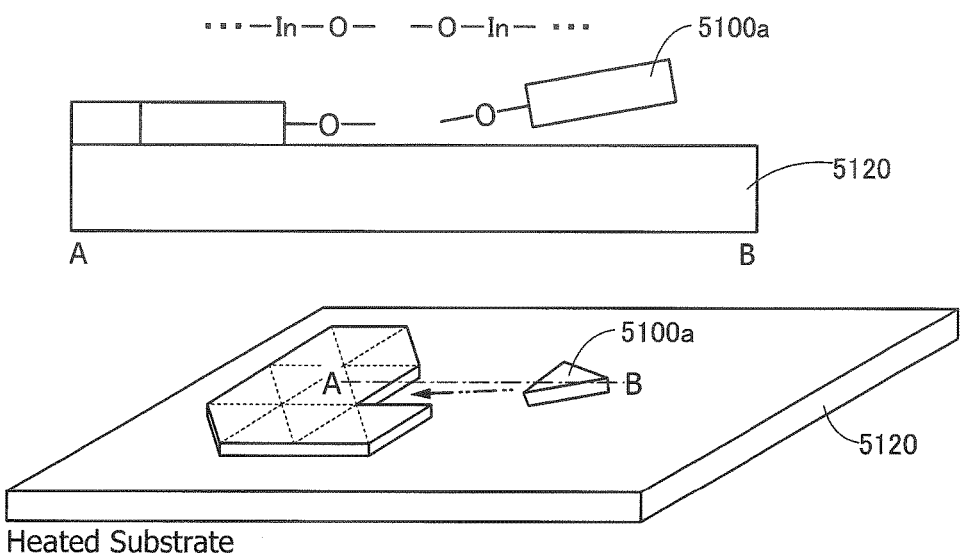
FIG. 59 Diagrams illustrating movement of a pellet on a formation surface.
Figure 59B:
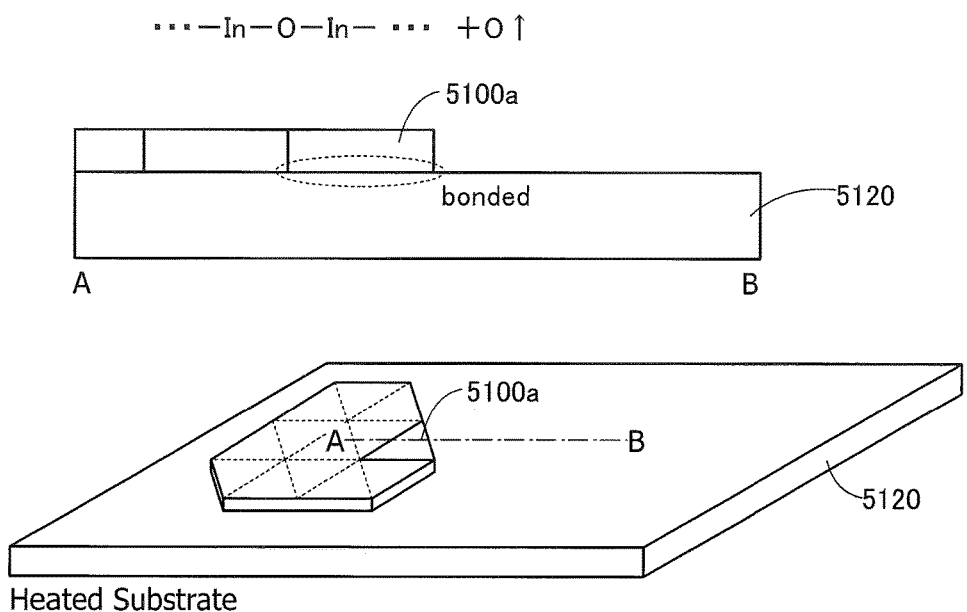

Furthermore, the substrate 5120 is heated, and resistance such as friction between the pellet 5100 and the substrate 5120 is low. As a result, as illustrated in FIG. 59(A), the pellet 5100 glides above the surface of the substrate 5120. The glide of the pellet 5100 is caused in a state where the flat plane faces the substrate 5120. Then, as illustrated in FIG. 59(B), when the pellet 5100 reaches the side surface of another pellet 5100 that has been already deposited, the side surfaces are bonded. At this time, the oxygen atom on the side surface of the pellet 5100 is released. With the released oxygen atom, oxygen vacancies in a CAAC-OS are filled in some cases; thus, the CAAC-OS has a low density of defect states.

Furthermore, the pellet 5100 is heated on the substrate 5120, whereby atoms are rearranged, and the structure distortion caused by the collision of the ion 5101 can be reduced. The pellet 5100 whose distortion is reduced becomes substantially a single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented. Furthermore, the space is filled with elastic metal atoms and the like, whereby it is thought that the elastic metal atoms have a function, like a highway, of jointing side surfaces of the pellets 5100 which are not aligned with each other.

It is thought that as shown in such a model, the pellets 5100 are deposited over the substrate 5120. Thus, deposition of a CAAC-OS can be performed even when film formation surface does not have a crystal structure, which is different from epitaxial growth. For example, even when the structure of a surface (film formation surface) of the substrate 5120 is an amorphous structure, a CAAC-OS can be deposited.

Figure 55B:
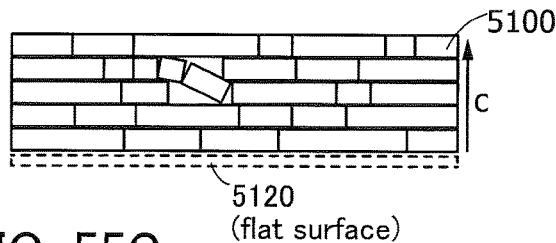

Furthermore, it is found that even when not only a flat surface but also a top surface of the substrate 5120 that is the film formation surface has unevenness, the pellets 5100 are arranged in accordance with the shape thereof as the CAAC-OS. For example, in the case where the top surface of the substrate 5120 is flat at the atomic level, the pellets 5100 are arranged so that flat planes parallel to the ab plane face downwards; thus, a layer with a uniform thickness, flatness, and high crystallinity is formed. Then, by stacking n layers (n is a natural number), the CAAC-OS can be obtained (see FIG. 55(B)).

Figure 55C:
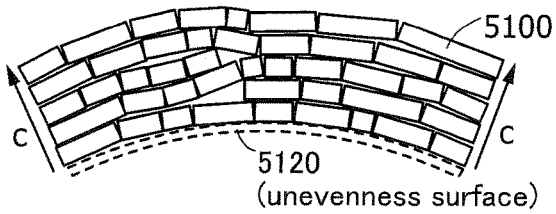

In contrast, in the case where the top surface of the substrate 5120 has unevenness, a CAAC-OS has a structure in which n layers (n is a natural number) in each of which the pellets 5100 are arranged along a convex surface are stacked. Since the substrate 5120 has unevenness, a gap is easily generated between the pellets 5100 in the CAAC-OS in some cases. Note that intermolecular force is applied between the pellets 5100, and the pellets 5100 are arranged so that a gap between the pellets is as small as possible even on the unevenness surface. Therefore, even with unevenness, a CAAC-OS with high crystallinity can be formed (see FIG. 55(C)).

As a result, laser crystallization is not needed for a CAAC-OS, and a uniform deposition can be performed even over a large-sized glass substrate.

Since the CAAC-OS film is deposited in accordance with such a model, the sputtered particle preferably has a pellet shape with a small thickness. Note that in the case where the sputtered particle has a dice shape with a large thickness, planes facing the substrate 5120 are not uniform and thus, the thickness and the orientation of the crystals cannot be uniform in some cases.

According to the deposition model described above, a CAAC-OS having high crystallinity can be obtained even on a film formation surface having an amorphous structure.

Furthermore, a CAAC-OS can also be described with a deposition model having a zinc oxide particle besides the pellet 5100.

The zinc oxide particle reaches the substrate 5120 first because the zinc oxide particle is smaller than the pellet 5100 in mass. On the surface of the substrate 5120, crystal growth of the zinc oxide particle preferentially occurs in the horizontal direction, so that a thin zinc oxide layer is formed. The zinc oxide layer has c-axis alignment. Note that c-axes of crystals in the zinc oxide layer are aligned in the direction parallel to a normal vector of the substrate 5120. The zinc oxide layer serves as a seed layer that makes a CAAC-OS grow and thus has a function of increasing crystallinity of the CAAC-OS. Note that the thickness of the zinc oxide layer is greater than or equal to 0.1 nm and less than or equal to 5 nm, mostly greater than or equal to 1 nm and less than or equal to 3 nm. Since the zinc oxide layer is sufficiently thin, a grain boundary can be hardly observed.

Thus, in order to deposit a CAAC-OS with high crystallinity, a target containing zinc at a proportion higher than that of the stoichiometric composition is preferably used.

Figure 56:
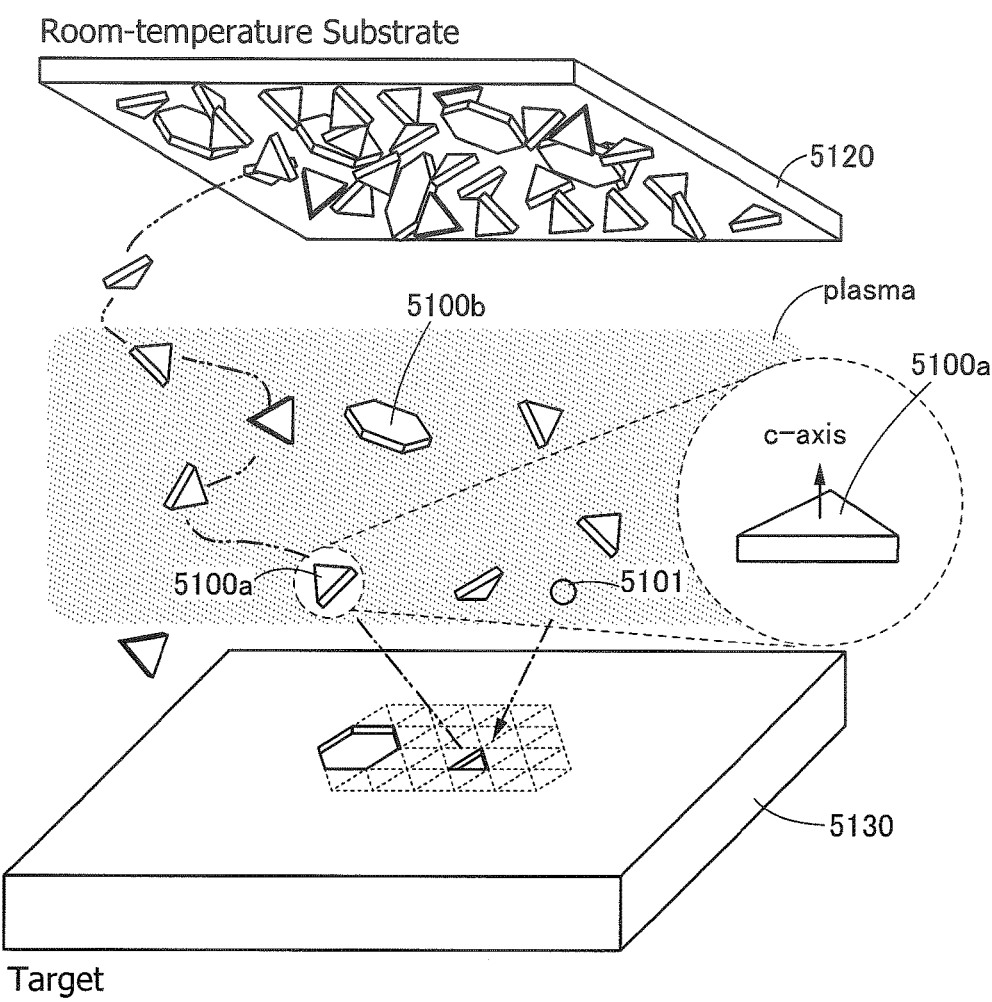
FIG. 56 A schematic diagram illustrating a deposition model of an nc-OS and a view illustrating a pellet.

Similarly, an nc-OS can be understood with a deposition model illustrated in FIG. 56. Note that a difference between FIG. 56 and FIG. 55(A) lies only in the fact that whether the substrate 5120 is heated or not.

Thus, the substrate 5120 is not heated, and the state of a resistance such as friction between the pellet 5100 and the substrate 5120 is high. As a result, the pellets 5100 cannot glide on the surface of the substrate 5120 and are stacked randomly, thereby obtaining an nc-OS.

<Cleavage Plane>

A cleavage plane that has been mentioned in the deposition model of the CAAC-OS will be described below.

First, a cleavage plane of the target is described with reference to FIG. 60. FIG. 60 shows the structure of an InGaZnO$_4$ crystal. Note that FIG. 60(A) shows the structure of the case where the InGaZnO$_4$ crystal is observed from a direction parallel to the b-axis when the c-axis is in an upward direction. Furthermore, FIG. 60(B) shows the structure of the case where the InGaZnO$_4$ crystal is observed from a direction parallel to the c-axis.

Energy needed for cleavage at each of crystal planes of the InGaZnO$_4$ crystal is calculated by the first principles calculation. Note that a pseudopotential and density functional theory program (CASTEP) using the plane wave basis are used for the calculation. Note that an ultrasoft type pseudopotential is used as the pseudopotential. Furthermore, GGA PBE is used as the functional. Moreover, cut-off energy is 400 eV.

Energy of a structure in an initial state is obtained after structural optimization including a cell size is performed. Furthermore, energy of a structure after the cleavage at each plane is obtained after structural optimization of atomic arrangement is performed in a state where the cell size is fixed.

On the basis of the structure of the InGaZnO$_4$ crystal in FIG. 60, a structure cleaved at any one of a first plane, a second plane, a third plane, and a fourth plane is manufactured and subjected to structural optimization calculation in which the cell size is fixed. Here, the first plane is a crystal plane between a Ga—Zn—O layer and an In—O layer and is parallel to the (001) plane (or the ab plane) (see FIG. 60(A)). The second plane is a crystal plane between a Ga—Zn—O layer and a Ga—Zn—O layer and is parallel to the (001) plane (or the ab plane) (see FIG. 60(A)). The third plane is a crystal plane parallel to the (110) plane (see FIG. 60(B)). The fourth plane is a crystal plane parallel to the (100) plane (or the bc plane) (see FIG. 60(B)).

Under the above conditions, the energy of the structure at each plane after the cleavage is calculated. Next, a difference between the energy of the structure after the cleavage and the energy of the structure in the initial state is divided by the area of the cleavage plane; thus, cleavage energy which serves as a measure of easiness of cleavage at each plane is calculated. Note that the energy of a structure is energy obtained in such a manner that, with respect to atoms and electrons included in the structure, kinetic energy of the electrons and interactions between the atoms, between the atom and the electron, and between the electrons are considered.

As calculation results, the cleavage energy of the first plane was 2.60 J/m², that of the second plane was 0.68 J/m², that of the third plane was 2.18 J/m², and that of the fourth plane was 2.12 J/m² (see the table below).

TABLE 3

|  | Cleavage energy [J/m²] |
|---|---|
| First plane | 2.60 |
| Second plane | 0.68 |
| Third plane | 2.18 |
| Fourth plane | 2.12 |

From the calculations, in the structure of the InGaZnO$_4$ crystal in FIG. 60, the cleavage energy of the second plane is the lowest. In other words, it is found that a plane between a Ga—Zn—O layer and a Ga—Zn—O layer is cleaved most easily (cleavage plane). Therefore, in this specification, in the case where there is description of the cleavage plane, it indicates the second plane, which is a plane where cleavage occurs most easily.

Since the second plane between the Ga—Zn—O layer and the Ga—Zn—O layer has the cleavage plane, the InGaZnO$_4$ crystals in FIG. 60(A) can be separated at a plane equivalent to two second planes. Therefore, in the case where an ion or the like is made to collide with a target, a wafer-like unit (we call this a pellet) which is cleaved at a plane with the lowest cleavage energy is thought to be blasted off as the minimum unit. In that case, a pellet of InGaZnO$_4$ becomes three layers of a Ga—Zn—O layer, an In—O layer, and a Ga—Zn—O layer.

In addition, the cleavage energies of the third plane crystal plane parallel to the (110) plane) and the fourth plane (crystal plane parallel to the (100) plane (or the bc plane)) are lower than that of the first plane (crystal plane between the Ga—Zn—O layer and the In—O layer and plane that is parallel to the (001) plane (or the ab plane)), which suggests that most of the flat planes of the pellets have triangle shapes or hexagonal shapes.

Figure 61A:
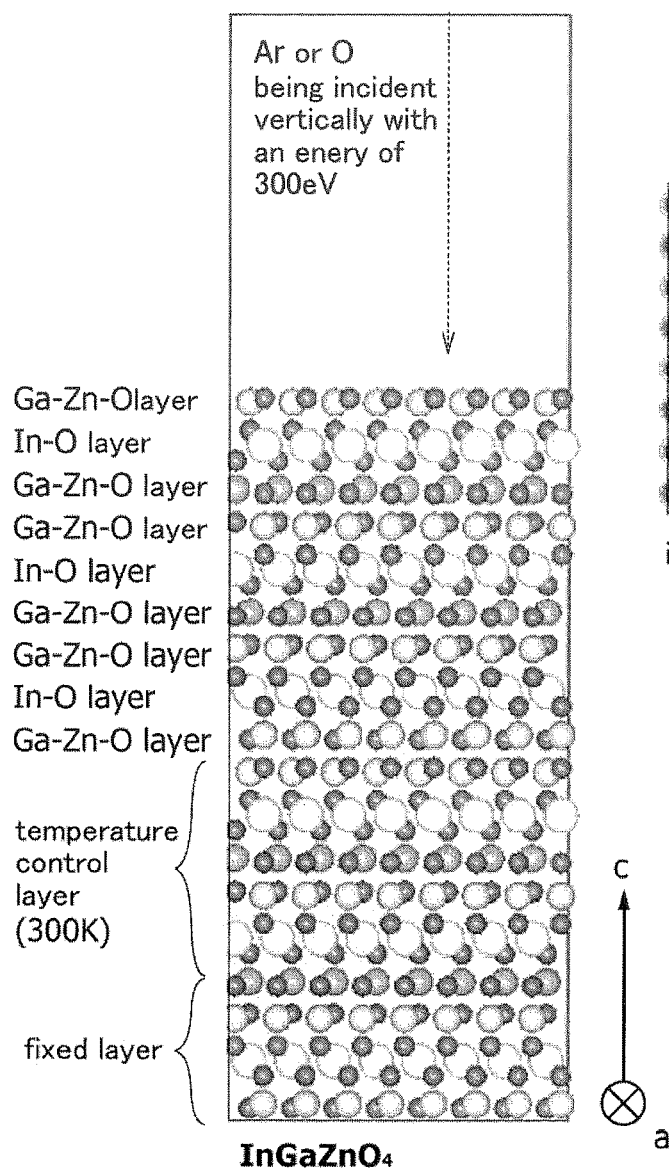
Figure 61B:
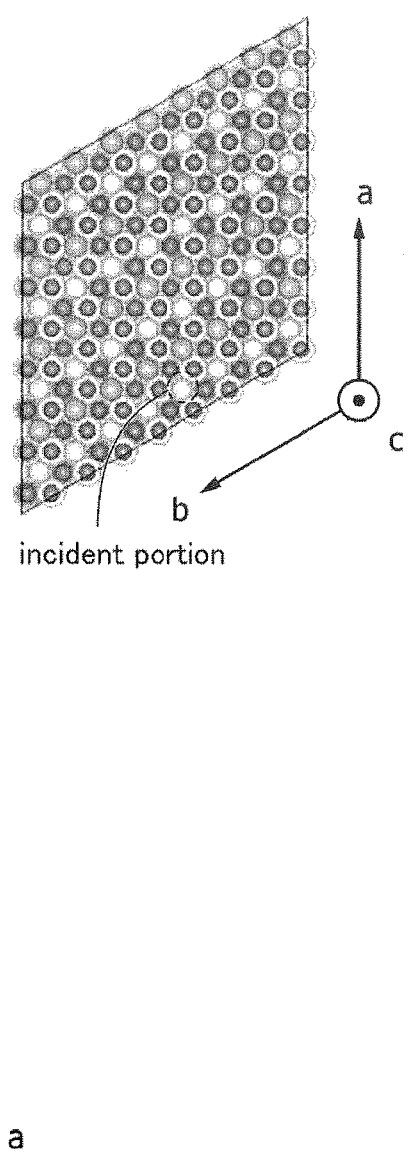

Next, through classical molecular dynamics calculation, on the assumption of an InGaZnO$_4$ crystal having a homologous structure as a target, a cleavage plane in the case where the target is sputtered using argon (Ar) or oxygen (O) is examined. FIG. 61(A) shows a cross-sectional structure of an InGaZnO$_4$ crystal (2688 atoms) used for the calculation, and FIG. 61(B) shows a top structure thereof. Note that a fixed layer shown in FIG. 61(A) is a layer that fixes arrangement of the atoms so that the positions do not move. In addition, a temperature control layer shown in FIG. 61(A) is a layer whose temperature is constantly set to fixed temperature (300 K).

For the classical molecular dynamics calculation, Materials Explorer 5.0 manufactured by Fujitsu Limited. is used. Note that the initial temperature, the cell size, the time step size, and the number of steps are set to be 300 K, a certain size, 0.01 fs, and ten million, respectively. In calculation, an atom to which an energy of 300 eV is applied is made to enter a cell from a direction perpendicular to the ab plane of the InGaZnO$_4$ crystal under the above-mentioned conditions.

FIG. 62(A) shows atomic order when 99.9 picoseconds (psec) have passed after argon enters the cell having the InGaZnO$_4$ crystal in FIG. 61. In addition, FIG. 62(B) shows atomic order when 99.9 picoseconds have passed after oxygen enters the cell. Note that in FIG. 62, part of the fixed layer shown in FIG. 61(A) is omitted.

According to FIG. 62(A), in a period from entry of argon into the cell to when 99.9 picoseconds have passed, a crack is formed from the cleavage plane corresponding to the second plane shown in FIG. 60(A). Thus, in the case where argon collides with the InGaZnO$_4$ crystal and the uppermost surface is the second plane (the zeroth), a large crack is found to be formed in the second plane (the second).

On the other hand, according to FIG. 62(B), in a period from entry of oxygen into the cell to when 99.9 picoseconds have passed, a crack is found to be formed from the cleavage plane corresponding to the second plane shown in FIG. 60(A). Note that in the case of collision of oxygen, a large crack is found to be formed in the second plane (the first) of the InGaZnO$_4$ crystal.

Accordingly, it is found that an atom (ion) collides with a target including an InGaZnO$_4$ crystal having a homologous structure from the upper surface of the target, the InGaZnO$_4$ crystal is cleaved along the second plane, and a flat-plate-like sputtered particle (pellet) is separated. In addition, it is also found that the pellet formed in the case of collision of oxygen is smaller than that formed in the case of collision of argon.

Note that the above calculation suggests that the separated pellet includes a damaged region. In some cases, the damaged region included in the pellet can be repaired in such a manner that a defect caused by the damage reacts with oxygen.

Here, a difference in size of the pellet depending on atoms which are made to collide is studied.

Figure 63A:
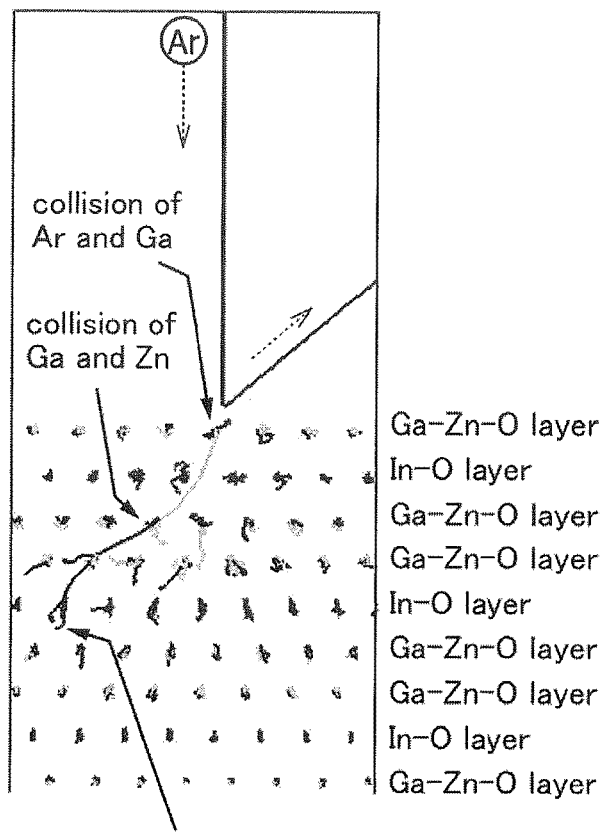
FIG. 63 Diagrams showing trajectories of atoms after collision of an atom.

FIG. 63(A) shows trajectories of the atoms from 0 picosecond to 0.3 picoseconds after argon enters the cell having the InGaZnO$_4$ crystal in FIG. 61. Accordingly, FIG. 63(A) corresponds to a period from FIG. 61 to FIG. 62(A).

According to FIG. 63(A), when argon collides with gallium (Ga) of the first layer (Ga—Zn—O layer), the gallium collides with zinc (Zn) of the third layer (Ga—Zn—O layer) and then, the zinc reaches the vicinity of the sixth layer (Ga—Zn—O layer). Note that the argon which collides with the gallium is sputtered to the outside. Accordingly, in the case where argon collides with the target including the InGaZnO$_4$ crystal, a crack is thought to run through the second plane (the second) in FIG. 61(A).

Figure 63B:
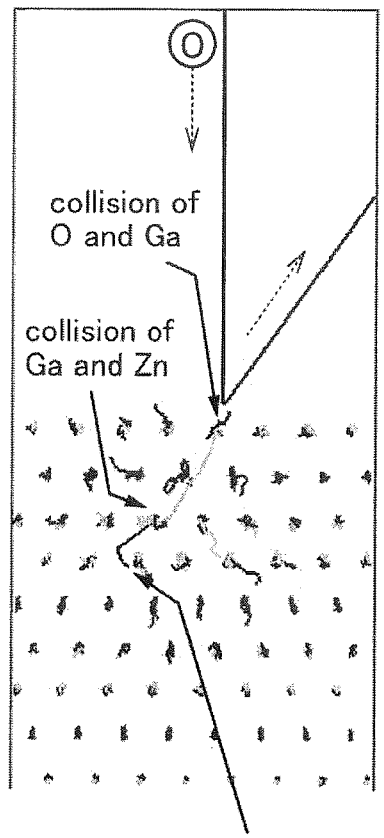

In addition, FIG. 63(B) shows trajectories of the atoms from 0 picosecond to 0.3 picoseconds after oxygen enters the cell having the InGaZnO$_4$ crystal in FIG. 61. Accordingly, FIG. 63(B) corresponds to a period from FIG. 61 to FIG. 62(A).

On the other hand, according to FIG. 63(B), when oxygen collides with gallium (Ga) of the first layer (Ga—Zn—O layer), the gallium collides with zinc (Zn) of the third layer (Ga—Zn—O layer) and then, the zinc does not reach the fifth layer (In—O layer). Note that the oxygen which collides with the gallium is sputtered to the outside. Accordingly, in the case where oxygen collides with the target including the InGaZnO$_4$ crystal, a crack is thought to run through the second plane (the first) in FIG. 61(A).

This calculation also shows that the InGaZnO$_4$ crystal, with which an atom (ion) collides, is separated from the cleavage plane.

In addition, a difference in depth of a crack is examined in view of conservation laws. The energy conservation law and the law of conservation of momentum can be represented by the following Formula (1) and the following Formula (2). Here, E represents energy of argon or oxygen before collision (300 eV), $m_A$ represents mass of argon or oxygen, $v_A$ represents the speed of argon or oxygen before collision, $v'_A$ represents the speed of argon or oxygen after collision, $m_{Ga}$ represents mass of gallium, $v_{Ga}$ represents the speed of gallium before collision, and $v'_{Ga}$ represents the speed of gallium after collision.

$$E = \frac{1}{2}m_A v_A^2 + \frac{1}{2}m_{Ga} v_{Ga}^2 \qquad \text{[Formula 6]}$$

$$m_A v_A + m_{Ga} v_{Ga} = m_A v'_A + m_{Ga} v'_{Ga} \qquad \text{[Formula 7]}$$

On the assumption that collision of argon or oxygen is elastic collision, the relationship among $v_A$, $v'_A$, $v_{Ga}$, and $v'_{Ga}$ can be represented as in the following Formula (3).

$$v'_A - v'_{Ga} = -(v_A - v_{Ga}) \qquad \text{[Formula 8]}$$

From the formula (1), the formula (2), and the formula (3), on the assumption that $v_{Ga}$ is 0, the speed of gallium $v'_{Ga}$ after collision of argon or oxygen can be represented as in the following Formula (4).

$$v'_{Ga} = \frac{\sqrt{m_A}}{m_A + m_{Ga}} \cdot 2\sqrt{2E} \qquad \text{[Formula 9]}$$

In Formula (4), mass of argon or mass of oxygen is substituted into $m_A$, whereby the speeds of gallium after collision of the atoms are compared. In the case where the argon and the oxygen have the same energy before collision, the speed of gallium in the case of collision of argon was found to be 1.24 times as high as that in the case of collision of oxygen. Thus, the energy of the gallium in the case of collision of argon is higher than that in the case of collision of oxygen by the square of the speed.

The speed (energy) of gallium after collision in the case of collision of argon is found to be higher than that in the case of collision of oxygen. Accordingly, it is thought that a crack is generated at a deeper position in the case of collision of argon than in the case of collision of oxygen.

It is found from the above calculation that when a target including the InGaZnO$_4$ crystal having a homologous structure is sputtered, separation occurs from the cleavage plane to form a pellet. On the other hand, even when a region having another structure of a target without the cleavage plane is sputtered, a pellet is not formed, and a sputtered particle with an atomic-level size which is minuter than a pellet is formed. Because the sputtered particle is smaller than the pellet, the sputtered particle is thought to be evacuated through a vacuum pump connected to a sputtering apparatus. Therefore, a model in which particles with a variety of sizes and shapes fly to a substrate and are deposited hardly applies to the case where a target including the InGaZnO$_4$ crystal having a homologous structure is sputtered. The model illustrated in FIG. 55(A) or the like where sputtered pellets are deposited to form a CAAC-OS is a reasonable model.

The CAAC-OS deposited in such a manner has a density substantially equal to that of a single crystal OS. For example, the density of the single crystal OS having a homologous structure of InGaZnO$_4$ is 6.36 g/cm$^3$, and the density of the CAAC-OS having substantially the same atomic ratio is about 6.3 g/cm$^3$.

Figure 64A:
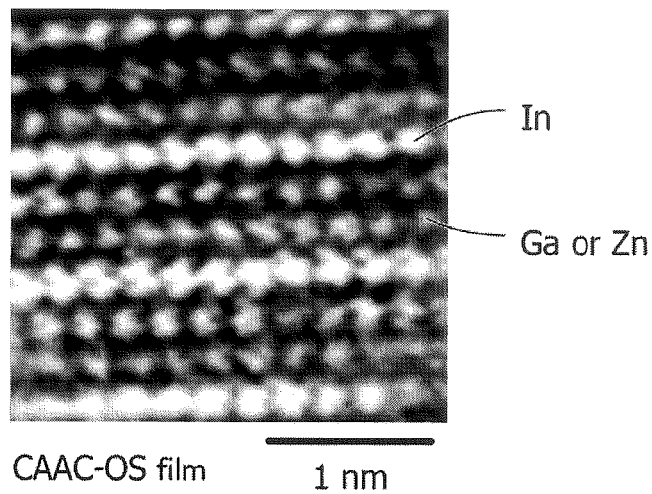
FIG. 64 Cross-sectional HAADF-STEM images of a CAAC-OS and a target.
Figure 64B:
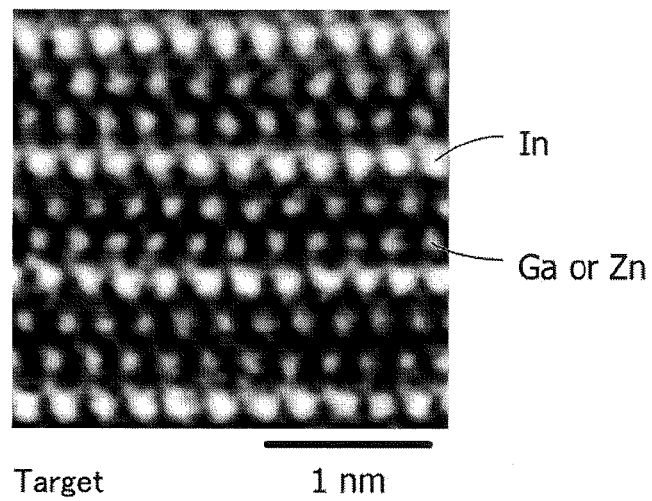

FIG. 64 shows atomic order of cross sections of an In—Ga—Zn oxide (see FIG. 64(A)) that is a CAAC-OS deposited by a sputtering method and a target thereof (see FIG. 64(B)). For observation of atomic arrangement, a high-angle annular dark field scanning transmission electron microscopy (HAADF-STEM: High-Angle Annular Dark Field Scanning Transmission Electron Microscopy) is used. Note that in HAADF-STEM, the intensity of an image of each atom is proportional to the square of its atomic number. Therefore, Zn (atomic number: 30) and Ga (atomic number: 31), whose atomic numbers are close to each other, cannot be hardly distinguished from each other. A Hitachi scanning transmission electron microscope HD-2700 is used for the HAADF-STEM.

When FIG. 64(A) and FIG. 64(B) are compared, it is found that the CAAC-OS and the target each have a homologous structure and the atomic orders correspond to each other. Thus, as illustrated in the deposition model in FIG. 55(A) or the like, the crystal structure of the target is transferred, whereby a CAAC-OS is deposited.

Note that this embodiment can be combined with the other embodiment and an example in this specification as appropriate.

(Embodiment 6)

In this embodiment, an example of a circuit utilizing the transistor of one embodiment of the present invention will be described with reference to drawings.

[Cross-sectional Structure]

Figure 36A:
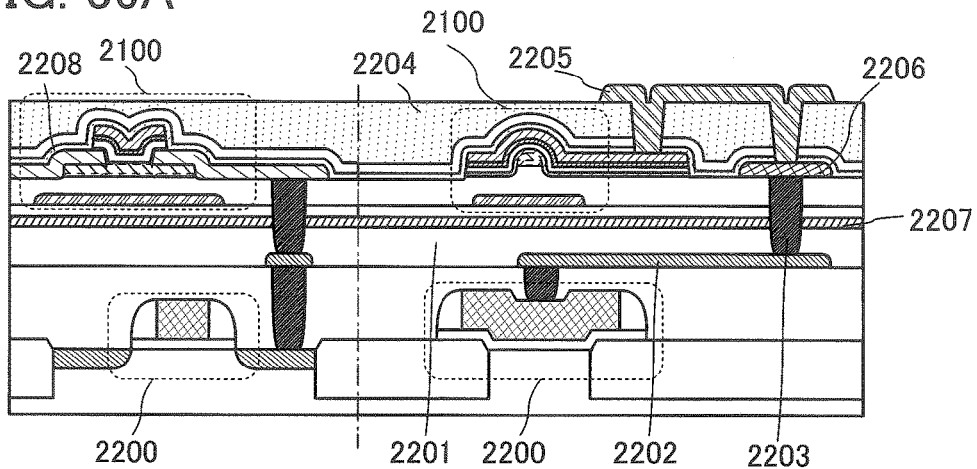
FIG. 36 Cross-sectional views and circuit diagrams of semiconductor devices.

FIG. 36(A) is a cross-sectional view of a semiconductor device of one embodiment of the present invention. The semiconductor device illustrated in FIG. 36(A) includes a transistor 2200 containing a first semiconductor material in a lower portion and a transistor 2100 containing a second semiconductor material in an upper portion. In FIG. 36(A), an example is described in which the transistor described in the above embodiment as an example is used as the transistor 2100 containing the second semiconductor material. Note that a cross section of the transistors in a channel length direction is on the left side of a dashed-dotted line, and a cross section of the transistors in a channel width direction is on the right side of the dashed-dotted line.

The first and second semiconductor materials preferably have different band gaps. For example, the first semiconductor material can be a semiconductor material other than an oxide semiconductor (silicon (including strained silicon), germanium, silicon germanium, silicon carbide, gallium arsenide, aluminum gallium arsenide, indium phosphide, gallium nitride, an organic semiconductor, or the like), and the second semiconductor material can be an oxide semiconductor. A transistor using a material other than an oxide semiconductor, such as single crystal silicon, can operate at high speed easily. In contrast, a transistor including an oxide semiconductor has a low off-state current.

The transistor 2200 may be either an n-channel transistor or a p-channel transistor; an appropriate transistor is used depending on a circuit. Furthermore, the specific structure of the semiconductor device, such as the material or the structure which are used, is not necessarily limited to those described here except for the use of the transistor of one embodiment of the present invention which includes an oxide semiconductor.

FIG. 36(A) illustrates a structure in which the transistor 2100 is provided over the transistor 2200 with an insulating layer 2201 and an insulating layer 2207 provided therebetween. In addition, a plurality of wirings 2202 is provided between the transistor 2200 and the transistor 2100. Furthermore, wirings and electrodes provided in an upper layer and a lower layer are electrically connected to each other through a plurality of plugs 2203 embedded in the insulating layers. In addition, an insulating layer 2204 covering the transistor 2100, a wiring 2205 over the insulating layer 2204, and a wiring 2206 formed by processing a conductive layer that is the same as a pair of electrodes of the transistor 2100 are provided.

Since the two kinds of transistors are stacked, the area occupied by the circuit can be reduced, allowing a plurality of circuits to be highly integrated.

Here, in the case where a silicon-based semiconductor material is used for the transistor 2200 provided in a lower portion, hydrogen in an insulating layer provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulating layer provided in the vicinity of the semiconductor layer of the transistor 2100 becomes a factor of generating carriers in the oxide semiconductor; thus, the reliability of the transistor 2100 might be decreased. Therefore, in the case where the transistor 2100 using an oxide semiconductor is stacked in an upper portion of the transistor 2200 using a silicon-based semiconductor material, it is particularly effective that the insulating layer 2207 having a function of preventing diffusion of hydrogen is provided therebetween.

For the insulating layer 2207, for example, aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like.

Furthermore, a blocking layer 2208 (corresponding to the insulating layer 175 in the transistor 101 to the transistor 112) having a function of preventing diffusion of hydrogen is preferably formed over the transistor 2100 to cover the transistor 2100 including an oxide semiconductor layer.

Note that the transistor 2200 can be a transistor of various types without being limited to a planar type transistor. For example, a transistor of a FIN (fin)-type, a TRI-GATE (tri-gate) type, or the like can be employed. An example of a cross-sectional view in such a case is shown in FIG. 36(D). An insulating layer 2212 is provided over a semiconductor substrate 2211. The semiconductor substrate 2211 has a projecting portion with a thin tip (also referred to a fin). Note that an insulating layer may be provided over the projecting portion. The insulating layer functions as a mask for preventing the semiconductor substrate 2211 from being etched when the projecting portion is formed. Note that the projecting portion does not necessarily have the thin tip; a cuboid-like projecting portion and a projecting portion with a thick tip are permitted, for example. A gate insulating layer 2214 is provided over the projecting portion of the semiconductor substrate 2211, and a gate electrode 2213 is provided thereover. Source and drain regions 2215 are formed in the semiconductor substrate 2211. Note that here is shown an example using the semiconductor substrate 2211; however, the semiconductor device of one embodiment of the present invention is not limited thereto. For example, an SOI substrate may be used.

[Circuit Configuration Example]

In the above structure, connection structures of electrodes of the transistor 2100 and the transistor 2200 can be made different; thus, a variety of circuits can be configured. Examples of circuit configurations which can be achieved by using the semiconductor device of one embodiment of the present invention will be described below.

[CMOS Circuit]

Figure 36B:
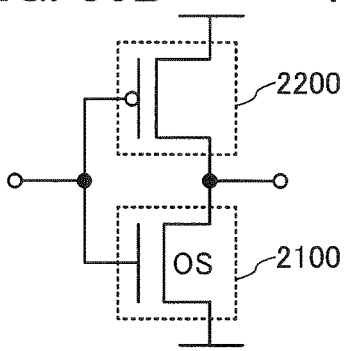

A circuit diagram illustrated in FIG. 36(B) shows a configuration of what is called a CMOS circuit in which the p-channel transistor 2200 and the n-channel transistor 2100 are connected to each other in series and in which gates of them are connected to each other.

[Analog Switch]

Figure 36C:
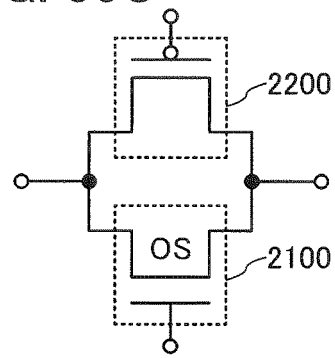
Figure 36D:
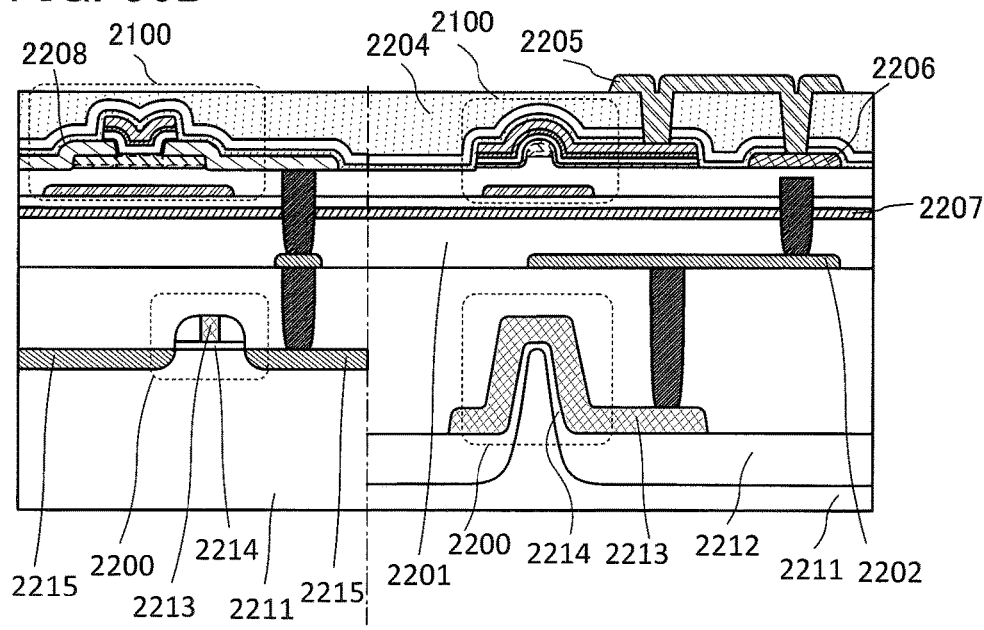

In addition, a circuit diagram illustrated in FIG. 36(C) shows a configuration in which sources of the transistor 2100 and the transistor 2200 are connected to each other and drains thereof are connected to each other. With such a configuration, the transistors can function as what is called an analog switch.

[Example of Memory Device]

Examples of a semiconductor device (memory device) which uses the transistor of one embodiment of the present invention, which can retain stored data even when not powered, and which has an unlimited number of write cycles are illustrated in FIG. 37.

Figure 37A:
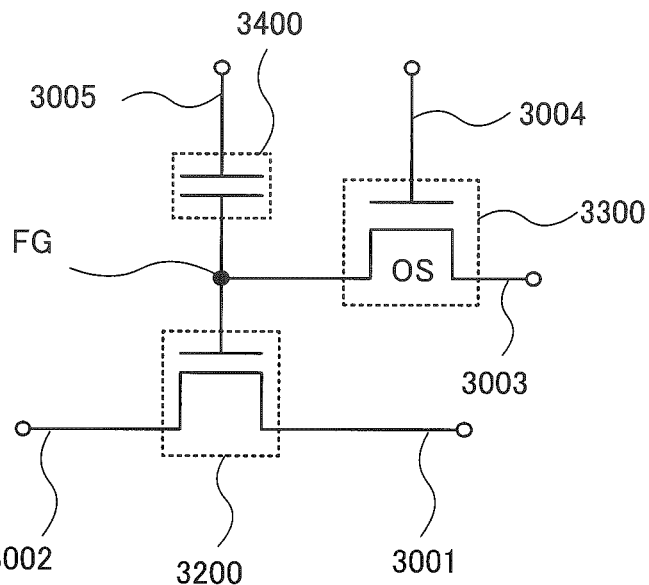
FIG. 37 A cross-sectional view and circuit diagrams of memory devices.

The semiconductor device illustrated in FIG. 37(A) has a transistor 3200 using a first semiconductor material, a transistor 3300 using a second semiconductor material, and a capacitor 3400. Note that the above-described transistor can be used as the transistor 3300.

Figure 37B:
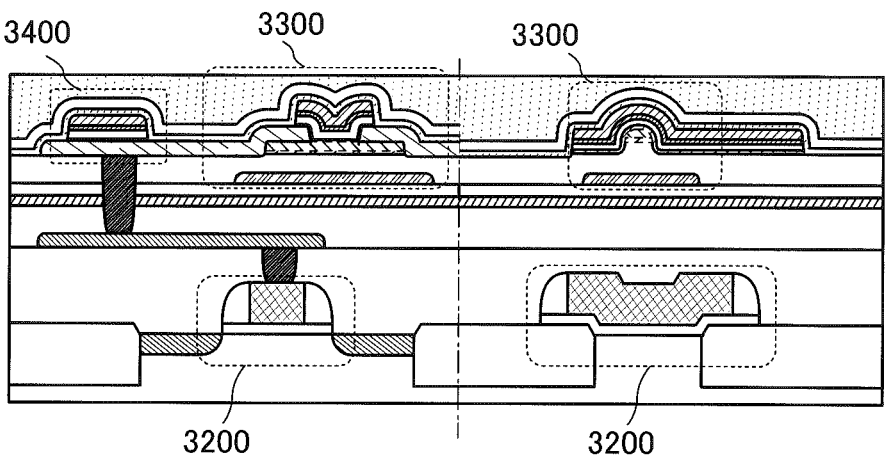

FIG. 37(B) is a cross-sectional view of the semiconductor device illustrated in FIG. 37(A). The semiconductor device in the cross-sectional view has a structure in which the transistor 3300 is provided with a back gate; however, a structure without a back gate may be employed.

In the transistor 3300, a channel is formed in a semiconductor layer having an oxide semiconductor. Since the off-state current of the transistor 3300 is low, stored data can be retained for a long time by using this. In other words, power consumption can be sufficiently reduced because a semiconductor memory device in which refresh operation is unnecessary or the frequency of refresh operation is extremely low can be provided.

In FIG. 37(A), a wiring 3001 is electrically connected to a source electrode of the transistor 3200, and a wiring 3002 is electrically connected to a drain electrode of the transistor 3200. In addition, a wiring 3003 is electrically connected to one of a source electrode or a drain electrode of the transistor 3300, and a wiring 3004 is electrically connected to a gate electrode of the transistor 3300. Then, a gate electrode of the transistor 3200 is electrically connected to the other of the source electrode and the drain electrode of the transistor 3300 and one electrode of the capacitor 3400, and a wiring 3005 is electrically connected to the other electrode of the capacitor 3400.

The semiconductor device illustrated in FIG. 37(A) has a feature that the potential of the gate electrode of the transistor 3200 can be retained, and thus enables writing, retaining, and reading of data as follows.

Writing and retaining of data are described. First, the potential of the wiring 3004 is set to a potential at which the transistor 3300 is turned on, so that the transistor 3300 is turned on. Accordingly, the potential of the wiring 3003 is supplied to the gate electrode of the transistor 3200 and the capacitor 3400. That is, a predetermined charge is supplied to the gate of the transistor 3200 (writing). Here, one of two kinds of charges providing different potential levels (hereinafter referred to as a Low-level charge and a High-level charge) is supplied. After that, the potential of the wiring 3004 is set to a potential at which the transistor 3300 is turned off, so that the transistor 3300 is turned off; thus, the charge supplied to the gate of the transistor 3200 is held (retaining).

Since the off-state current of the transistor 3300 is extremely low, the charge of the gate of the transistor 3200 is retained for a long time.

Next, reading of data is described. An appropriate potential (a reading potential) is supplied to the wiring 3005 while a predetermined potential (a constant potential) is supplied to the wiring 3001, whereby the potential of the wiring 3002 varies depending on the amount of charge retained in the gate the transistor 3200. This is because in general, when an n-channel transistor is used as the transistor 3200, an apparent threshold voltage $V_{th\_H}$ in the case where the High-level charge is given to the gate electrode of the transistor 3200 is lower than an apparent threshold voltage $V_{th\_L}$ in the case where the Low-level charge is given to the gate electrode of the transistor 3200. Here, an apparent threshold voltage refers to the potential of the wiring 3005 which is needed to turn "on" the transistor 3200. Thus, the potential of the wiring 3005 is set to a potential $V_0$ which is between $V_{th\_H}$ and $V_{th\_L}$, whereby charge supplied to the gate of the transistor 3200 can be determined. For example, in the case where the High-level charge is supplied in writing and the potential of the wiring 3005 is $V_0$ ($>V_{th\_H}$), the transistor 3200 is turned "on". In the case where the Low-level charge is supplied, the transistor 3200 remains "off" even when the potential of the wiring 3005 is $V_0$ ($<V_{th\_L}$). Thus, the retained data can be read by determining the potential of the wiring 3002.

Note that in the case where memory cells are arrayed, it is necessary that only data of a desired memory cell be able to be read. The wiring 3005 in the case where data is not read may be supplied with a potential at which the transistor 3200 is turned "off" regardless of the state of the gate, that is, a potential lower than $V_{th\_H}$. Alternatively, the wiring 3005 may be supplied with a potential at which the transistor 3200 is turned "on" regardless of the state of the gate, that is, a potential higher than $V_{th\_L}$.

Figure 37C:
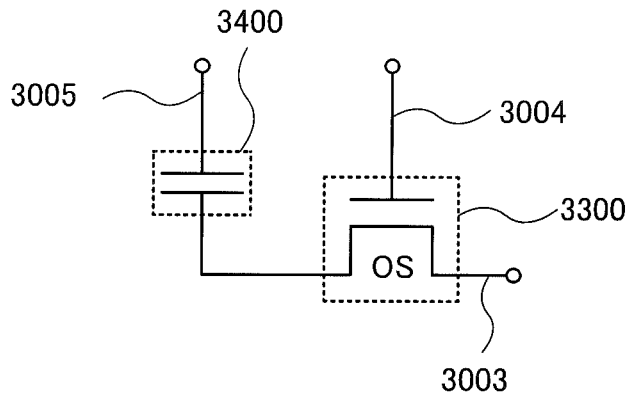

The semiconductor device illustrated in FIG. 37(C) is different from FIG. 37(A) in that the transistor 3200 is not provided. In this case, writing and retaining operation of data can be performed in a manner similar to that of the above.

Next, reading of data is described. When the transistor 3300 is turned on, the wiring 3003 which is in a floating state and the capacitor 3400 are electrically connected to each other, and charge is redistributed between the wiring 3003 and the capacitor 3400. As a result, the potential of the wiring 3003 is changed. The amount of change in potential of the wiring 3003 takes a different value depending on the potential of the first terminal of the capacitor 3400 (or the charge accumulated in the capacitor 3400).

For example, the potential of the wiring 3003 after the charge redistribution is $(C_B \times V_{B0} + C \times V)/(C_B + C)$, where V is the potential of the first terminal of the capacitor 3400, C is the capacitance of the capacitor 3400, $C_B$ is the capacitance component of the wiring 3003, and $V_{B0}$ is the potential of the wiring 3003 before the charge redistribution. Thus, it can be found that, assuming that the memory cell is in either of two states in which the potential of the second terminal of the capacitor 3400 is $V_1$ and $V_0$ ($V_1 > V_0$), the potential of the wiring 3003 in the case of retaining the potential $V_1$ ($=(C_B \times V_{B0} + C \times V_1)/(C_B + C)$) is higher than the potential of the wiring 3003 in the case of retaining the potential $V_0$ ($=(C_B \times V_{B0} + C \times V_0)/(C_B + C)$).

Then, by comparing the potential of the wiring 3003 with a predetermined potential, data can be read.

In this case, a transistor to which the first semiconductor material is applied may be used in a driver circuit for driving a memory cell, and a transistor to which the second semiconductor material is applied may be stacked over the driver circuit as the transistor 3300.

When a transistor having a channel formation region formed using an oxide semiconductor and having an extremely low off-state current is applied to the semiconductor device described in this embodiment, the semiconductor device can retain stored data for an extremely long time. In other words, refresh operation becomes unnecessary or the frequency of the refresh operation can be extremely low, leading to a sufficient reduction in power consumption. Moreover, stored data can be retained for a long time even when not powered (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is unlikely to be caused. That is, the semiconductor device according to the disclosed invention does not have a limit on the number of times data can be rewritten, which is a problem of a conventional nonvolatile memory, and the reliability thereof is drastically improved. Moreover, since data is written depending on the on state or the off state of the transistor, high-speed operation can be easily achieved.

Note that this embodiment can be combined with the other embodiment and an example in this specification as appropriate.

(Embodiment 7)

In this embodiment, a CPU that includes the memory device described in the above embodiment will be described.

Figure 38:
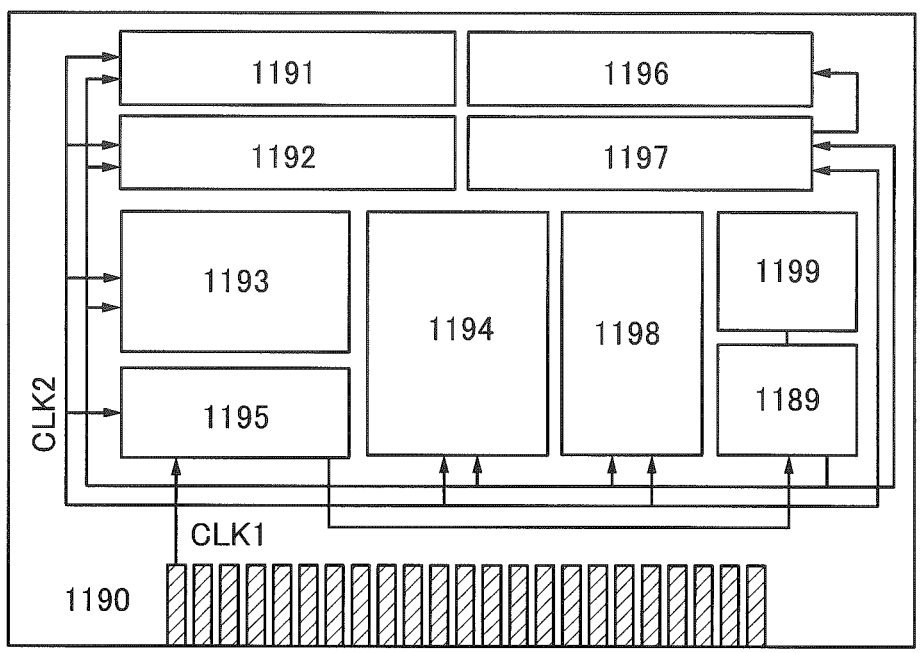
FIG. 38 A view illustrating a configuration example of a CPU.

FIG. 38 is a block diagram illustrating a configuration example of a CPU at least partly using the transistor described in the above embodiment.

The CPU illustrated in FIG. 38 has, over a substrate 1190, an ALU 1191 (ALU: Arithmetic logic unit), an ALU controller 1192, an instruction decoder 1193, an interrupt controller 1194, a timing controller 1195, a register 1196, a register controller 1197, a bus interface (BUS I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU illustrated in FIG. 38 is just an example in which the configuration is simplified, and an actual CPU may have a variety of configurations depending on the application. For example, the CPU may have the following configuration: a structure including the CPU illustrated in FIG. 38 or an arithmetic circuit is assumed as one core; a plurality of the cores are included; and the cores operate parallel. The number of bits that the CPU can process in an internal arithmetic circuit or in a data bus can be 8 bits, 16 bits, 32 bits, 64 bits, or the like, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. In addition, while the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

In addition, the timing controller 1195 generates signals for controlling operation timings of the ALU 1191, the ALU controller 1192, the instruction decoder 1193, the interrupt controller 1194, and the register controller 1197. For example, the timing controller 1195 is provided with an internal clock generator for generating an internal clock signal CLK2 based on a reference clock signal CLK1, and supplies the internal clock signal CLK2 to the above various circuits.

In the CPU illustrated in FIG. 38, a memory cell is provided in the register 1196. As the memory cell of the register 1196, the transistor described in the above embodiment can be used.

In the CPU illustrated in FIG. 38, the register controller 1197 selects operation of retaining data in the register 1196 in accordance with an instruction from the ALU 1191. That is, whether data is retained by a flip-flop or by a capacitor in the memory cell of the register 1196 is selected. In the case where data retaining by the flip-flop is selected, a power supply voltage is supplied to the memory cell in the register 1196. In the case where data retaining by the capacitor is selected, the data is rewritten in the capacitor, and supply of power supply voltage to the memory cell in the register 1196 can be stopped.

Figure 39:
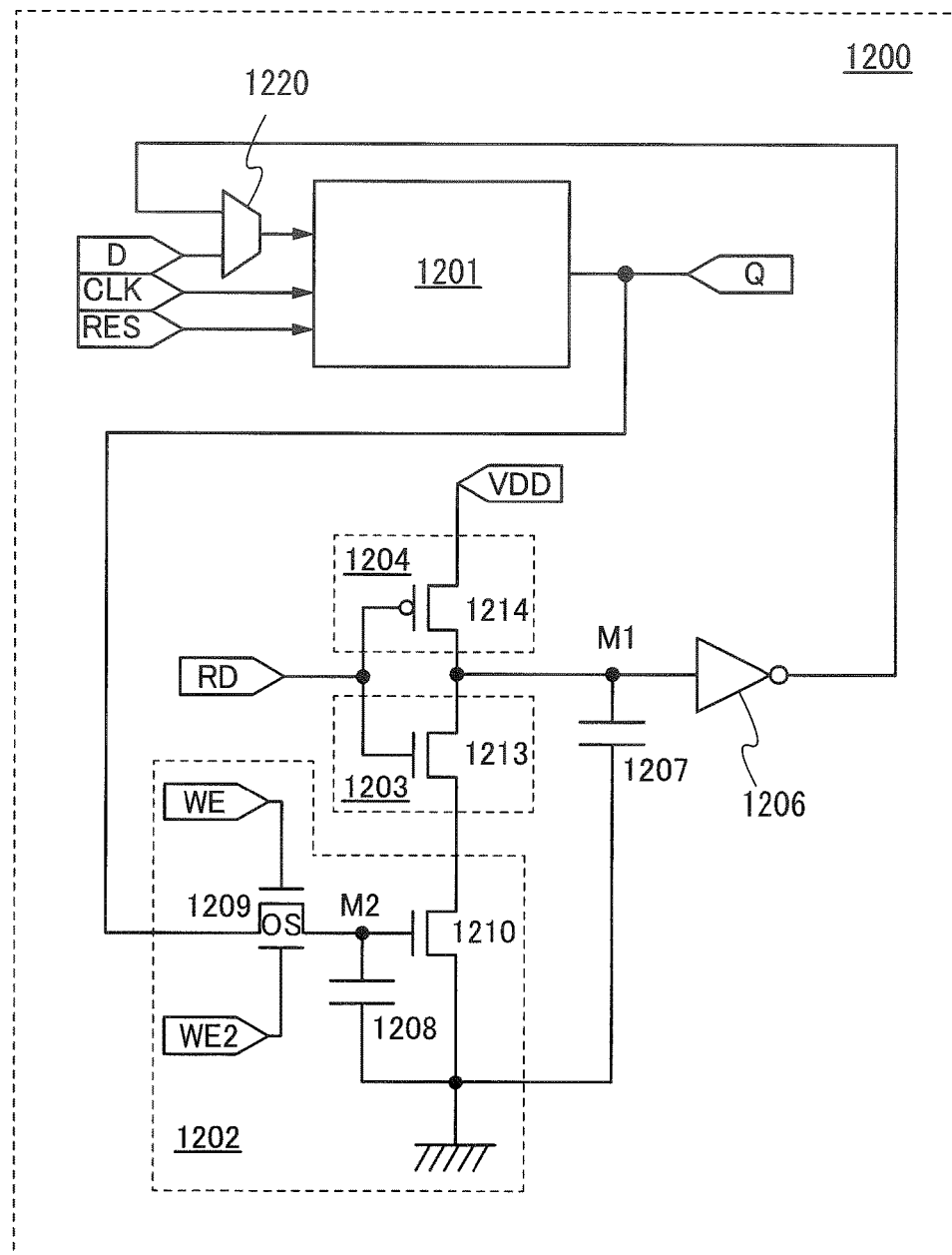
FIG. 39 A circuit diagram of a memory element.

FIG. 39 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. A structure is employed in which, when supply of a power supply voltage to the memory element 1200 is stopped, a ground potential (0 V) or a potential at which the transistor 1209 is turned off continues to be input to a gate of the transistor 1209 in the circuit 1202. For example, a structure in which the first gate of the transistor 1209 is grounded through a load such as a resistor.

Shown is an example in which the switch 1203 is structured using a transistor 1213 having one conductivity type (e.g., an n-channel type) and the switch 1204 is structured using a transistor 1214 having a conductivity type opposite to the one conductivity type (e.g., a p-channel type). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low potential power supply (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. A structure in which a constant potential is input to the other of the pair of electrodes of the capacitor 1207 can be employed. For example, a structure in which a low power supply potential (e.g., GND) or a high power supply potential (e.g., VDD) is input can be employed. The other of the pair of electrodes of the capacitor 1207 is electrically connected to the line which can supply a low potential power supply (e.g., a GND line). A structure in which a constant potential is input to the other of the pair of electrodes of the capacitor 1208 can be employed. For example, a structure in which a low power supply potential (e.g., GND) or a high power supply potential (e.g., VDD) is input can be employed. The other of the pair of electrodes of the capacitor 1208 is electrically connected to the line which can supply a low potential power supply (e.g., a GND line).

Note that the capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE, and when the first terminal and the second terminal of one of the switches are in the conduction state, the first terminal and the second terminal of the other of the switches are in the non-conduction state.

Note that a structure with a second gate (first gate electrode; back gate) is illustrated in the transistor 1209 in FIG. 39. The control signal WE can be input to the first gate and the control signal WE2 can be input to the second gate. The control signal WE2 is a signal having a constant potential. As the constant potential, for example, a ground potential GND or a potential lower than a source potential of the transistor 1209 is selected. At this time, the control signal WE2 is a potential signal for controlling the threshold voltage of the transistor 1209, and the current at the gate voltage of 0 V of the transistor 1209 can be further reduced. In addition, the control signal WE2 may be a signal having the same potential as that of the control signal WE. Note that as the transistor 1209, it is also possible to use a transistor without a second gate.

A signal corresponding to data retained in the circuit 1201 is input to the other of the source and the drain of the transistor 1209. FIG. 39 illustrates an example in which a signal output from the circuit 1201 is input to the other of the source and the drain of the transistor 1209. A signal output from the second terminal of the switch 1203 (the other of the source and the drain of the transistor 1213) becomes an inverted signal obtained by inversion of the logic value of the signal by the logic element 1206, and the inverted signal is input to the circuit 1201 through the circuit 1220.

Note that in FIG. 39, an example in which a signal output from the second terminal of the switch 1203 (the other of the source and the drain of the transistor 1213) is input to the circuit 1201 through the logic element 1206 and the circuit 1220 is illustrated; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In addition, in FIG. 39, the transistors used for the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor layer. Further alternatively, in the memory element 1200, a transistor in which a channel is formed in an oxide semiconductor layer can be included besides the transistor 1209, and a transistor in which a channel is formed in a layer formed of a semiconductor other than an oxide semiconductor or in the substrate 1190 can be used for the rest of the transistors.

As the circuit 1201 in FIG. 39, for example, a flip-flop circuit can be used. In addition, as the logic element 1206, for example, an inverter, a clocked inverter, or the like can be used.

In a period during which the memory element 1200 is not supplied with the power supply voltage, the semiconductor device of one embodiment of the present invention can retain data stored in the circuit 1201 by the capacitor 1208 which is provided in the circuit 1202.

In addition, the off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

In addition, since the above-described memory element performs pre-charge operation by being provided with the switch 1203 and the switch 1204, the time required for the circuit 1201 to retain original data again after the supply of the power supply voltage is restarted can be shortened.

In addition, in the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory of a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be applied to an LSI such as a DSP (Digital Signal Processor), a custom LSI, or a PLD (Programmable Logic Device), and a RF-ID (Radio Frequency Identification).

Note that this embodiment can be combined with the other embodiment and an example in this specification as appropriate.

(Embodiment 8)

In this embodiment, configuration examples of a display device utilizing a transistor of one embodiment of the present invention will be described.

[Configuration Example]

Figure 40A:
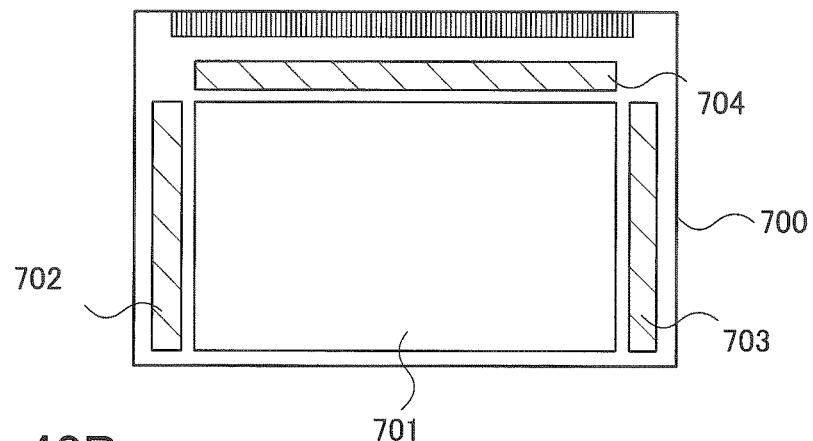
FIG. 40 A view illustrating a configuration example of a display device and circuit diagrams of pixels.
Figure 40B:
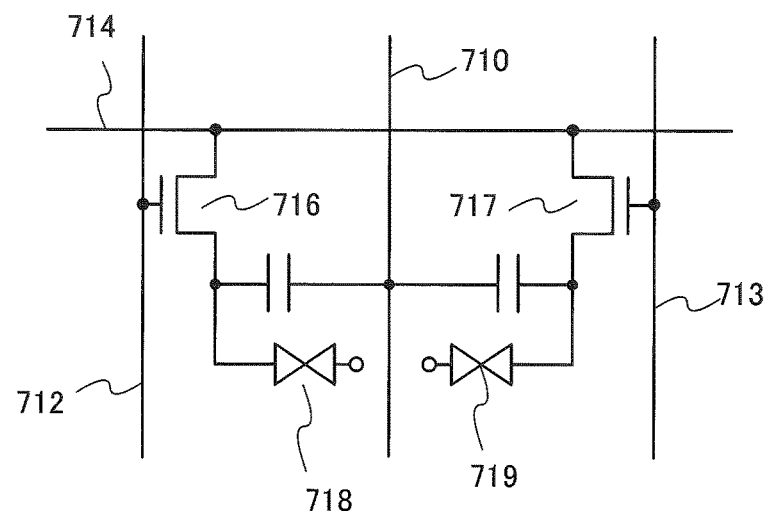
Figure 40C:
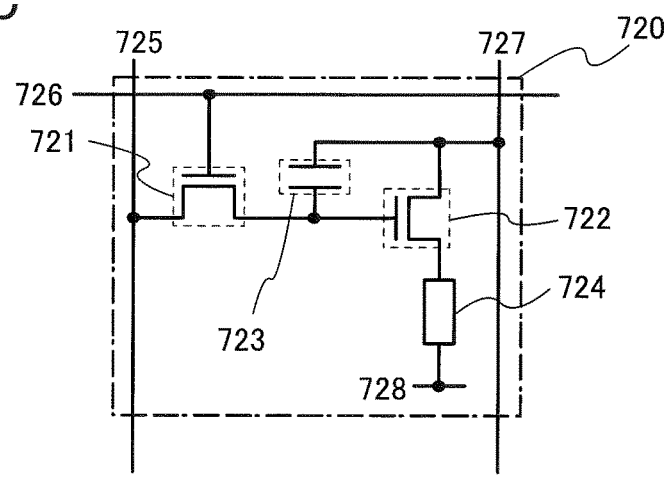

FIG. 40(A) is a top view of the display device of one embodiment of the present invention, and FIG. 40(B) is an example of a pixel circuit that can be used in the case where a liquid crystal element is applied in a pixel in the display device. In addition, FIG. 40(C) is an example of a pixel circuit that can be used in the case where an organic EL element is applied to a pixel in the display device.

The transistor arranged in the pixel portion can be formed in accordance with the above embodiment. In addition, a transistor that forms a driver circuit or part thereof can be formed over the same substrate as the transistor of the pixel portion.

FIG. 40(A) illustrates an example of a top view of an active matrix type display device. The display device has a pixel portion 701, a scan line driver circuit 702, a scan line driver circuit 703, and a signal line driver circuit 704. In the pixel portion 701, a plurality of signal lines extended from the signal line driver circuit 704 are arranged and a plurality of scan lines extended from the scan line driver circuit 702 and the scan line driver circuit 703 are arranged. Note that pixels which have display elements are provided in a matrix in respective regions where the scan lines and the signal lines intersect with each other. In addition, the display device is connected to a timing control circuit (also referred to as a controller or a controller IC) through a connection portion such as an FPC (Flexible Printed Circuit).

In the display device illustrated in FIG. 40(A), the scan line driver circuit 702, the scan line driver circuit 703, the signal line driver circuit 704, and the pixel portion 701 are formed over the same substrate 700. Accordingly, the number of components which are provided outside, such as a driver circuit, can be reduced, so that a reduction in cost can be achieved. Furthermore, neither a step of connecting the external driver circuit nor formation of a connection terminal is necessary; therefore, an improvement in reliability or an improvement in yield can be achieved.

[Liquid Crystal Display Device]

In addition, FIG. 40(B) illustrates an example of a circuit configuration of the pixel. Here, a pixel circuit which is applicable to a pixel of a VA liquid crystal display device is illustrated as an example.

This pixel circuit can be applied to a structure in which one pixel has a plurality of pixel electrode layers. The pixel electrode layers are each connected to a different transistor, and the transistors can be driven with different gate signals. Accordingly, signals applied to individual pixel electrode layers of multi-domain design can be controlled independently.

A gate wiring 712 of a transistor 716 and a gate wiring 713 of a transistor 717 are separated so that different gate signals can be supplied thereto. In contrast, a data line 714 is shared by the transistor 716 and the transistor 717. The transistor described in the above embodiment can be used as appropriate as each of the transistor 716 and the transistor 717. Thus, a highly reliable liquid crystal display device can be provided.

The pixel circuit has a first pixel electrode layer electrically connected to the transistor 716 and a second pixel electrode layer electrically connected to the transistor 717. The first pixel electrode layer and the second pixel electrode layer are separated by a slit. The first pixel electrode layer has a shape expanding into a V shape and the second pixel electrode layer has a shape which surrounds the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied; thus, alignment of liquid crystals is controlled.

Furthermore, a storage capacitor may be formed with a capacitor wiring 710, a gate insulating film functioning as a dielectric, and a capacitor electrode electrically connected to the first pixel electrode layer or the second pixel electrode layer.

In the multi-domain structure, one pixel is provided with a first liquid crystal element 718 and a second liquid crystal element 719. The first liquid crystal element 718 is formed of the first pixel electrode layer, a counter electrode layer, and a liquid crystal layer therebetween, and the second liquid crystal element 719 is formed of the second pixel electrode layer, a counter electrode layer, and a liquid crystal layer therebetween.

Note that the pixel circuit illustrated in FIG. 40(B) is not limited thereto. For example, a switch, a resistor, a capacitor, a transistor, a sensor, a logic circuit, or the like may be newly added to the pixel illustrated in FIG. 40(B).

[Organic EL Display Device]

FIG. 40(C) illustrates another example of a circuit configuration of the pixel. Here, a pixel structure of a display device using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. Then, the electrons and holes are recombined, and thus, the light-emitting organic compound forms an excited state, and the light-emitting organic compound returns to a ground state from the excited state, thereby emitting light. Owing to such a mechanism, this light-emitting element is referred to as a current-excitation type light-emitting element.

FIG. 40(C) illustrates an example of a pixel circuit applicable to an organic EL display device. Here, an example in which two n-channel transistors are used in one pixel is illustrated. Furthermore, digital time grayscale driving can be employed for the pixel circuit.

The configuration of the pixel circuit and operation of a pixel in the case where digital time grayscale driving is employed are described.

A pixel 720 has a switching transistor 721, a driver transistor 722, a light-emitting element 724, and a capacitor 723. In the switching transistor 721, a gate electrode layer is connected to a scan line 726, a first electrode (one of a source electrode layer and a drain electrode layer) is connected to a signal line 725, and a second electrode (the other of the source electrode layer and the drain electrode layer) is connected to a gate electrode layer of the driver transistor 722. In the driver transistor 722, the gate electrode layer is connected to a power supply line 727 through the capacitor 723, a first electrode is connected to the power supply line 727, and a second electrode is connected to a first electrode (a pixel electrode) of the light-emitting element 724. A second electrode of the light-emitting element 724 corresponds to a common electrode 728. The common electrode 728 is electrically connected to a common potential line formed over the same substrate.

As each of the switching transistor 721 and the driver transistor 722, the transistor described in the other embodiment can be used as appropriate. In this manner, a highly reliable organic EL display device can be provided.

The potential of the second electrode (the common electrode 728) of the light-emitting element 724 is set to be a low power supply potential. Note that the low power supply potential is a potential lower than a high power supply potential supplied to the power supply line 727; for example, GND, 0 V, or the like can be set as the low power supply potential. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. Note that the forward voltage of the light-emitting element 724 refers to a voltage at which a desired luminance is obtained, and includes at least a forward threshold voltage.

Note that the capacitor 723 can be omitted by substituting gate capacitance of the driver transistor 722. As for the gate capacitance of the driver transistor 722, capacitance may be formed between the channel formation region and the gate electrode layer.

Next, a signal input to the driver transistor 722 is described. In the case of a voltage-input voltage driving method, a video signal such that the driver transistor 722 takes two states of being sufficiently turned on or off is input to the driver transistor 722. In order for the driver transistor 722 to operate in a linear region, voltage higher than the voltage of the power supply line 727 is applied to the gate electrode layer of the driver transistor 722. In addition, voltage higher than or equal to voltage which is the sum of power supply line voltage and the threshold voltage $V_{th}$ of the driver transistor 722 is applied to the signal line 725.

In the case of performing analog grayscale driving, a voltage greater than or equal to a voltage which is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit is not limited to the pixel configuration shown in FIG. 40(C). For example, a switch, a resistor, a capacitor, a sensor, a transistor, a logic circuit, or the like may be added to the pixel circuit illustrated in FIG. 40(C).

In this specification and the like, for example, a display element, a display device which is a device including a display element, a light-emitting element, and a light-emitting device which is a device including a light-emitting element can employ a variety of modes or can include a variety of elements. As an example, the display element, the display device, the light-emitting element, or the light-emitting device has a display medium whose contrast, luminance, reflectance, transmittance, or the like is changed by electrical or magnetic action in some cases, such as an EL (electroluminescence) element (an EL element including organic and inorganic materials, an organic EL element, or an inorganic EL element), an LED (a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using MEMS (micro electro mechanical system), a digital micromirror device (DMD), a DMS (digital micro shutter), MIRASOL (registered trademark), an IMOD (interferometric modulator display (IMOD) element, a MEMS shutter display element, an optical-interference-type MEMS display element, an electrowetting element, a piezoelectric ceramic display, or a carbon nanotube. As an example of a display device using an EL element, there is an EL display or the like. As an example of a display device using an electron emitter, there is a field emission display (FED) or an SED-type flat panel display (SED: Surface-conduction Electron-emitter Display). As an example of a display device using a liquid crystal element, there is a liquid crystal display (a transmissive liquid crystal display, a transflective liquid crystal display, a reflective liquid crystal display, a direct-view liquid crystal display, or a projection liquid crystal display) or the like. As an example of a display device using electronic ink, Electronic Liquid Powder (registered trademark), or an electrophoretic element, there is electronic paper or the like. Note that in the case of a transflective liquid crystal display or a reflective liquid crystal display, some or all of pixel electrodes may function as reflective electrodes. For example, some or all of pixel electrodes may be formed to contain aluminum, silver, or the like. Furthermore, in such a case, a memory circuit such as an SRAM can be provided under the reflective electrodes. Accordingly, power consumption can be reduced.

Note that this embodiment can be combined with the other embodiment and an examples in this specification as appropriate.

(Embodiment 9)

In this embodiment, effects of an oxygen vacancy in an oxide semiconductor layer and hydrogen that enters the oxygen vacancy will be described below.

<(1) Ease of Formation and Stability of $V_oH$>

In the case where an oxide semiconductor film (hereinafter referred to as IGZO) is a complete crystal, H preferentially diffuses along the ab plane at a room temperature. In addition, in heat treatment at 450° C., H diffuses along the ab plane and in the c-axis direction. Thus, here, description is made on whether H easily enters an oxygen vacancy $V_o$ if the oxygen vacancy $V_o$ exists in IGZO. A state in which H is in an oxygen vacancy $V_o$ is referred to as $V_oH$.

Figure 41:
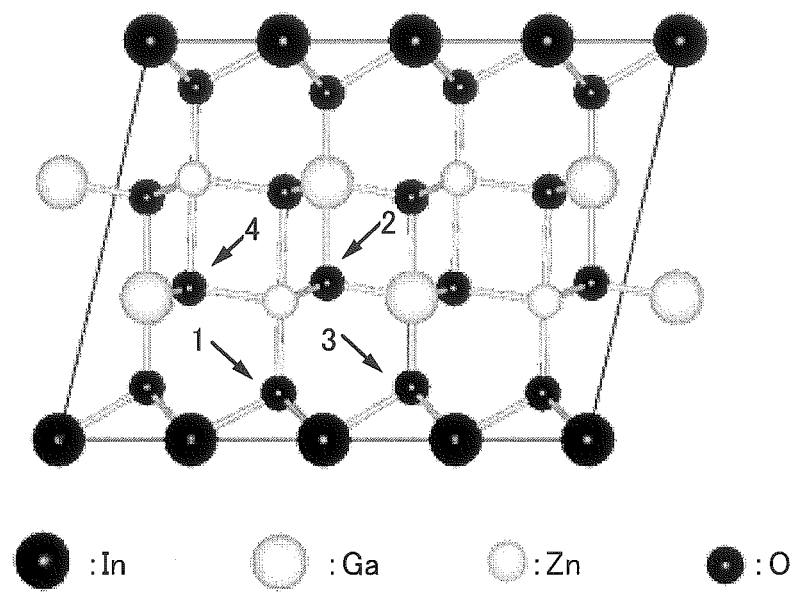
FIG. 41 A diagram showing a calculation model.

An $InGaZnO_4$ crystal model shown in FIG. 41 was used for calculation. The activation barrier ($E_a$) along the reaction path where H in $V_oH$ is released from $V_o$ and bonded to oxygen was calculated by an NEB (Nudged Elastic Band) method. The calculation conditions are shown in Table 4.

TABLE 4

| Software | VASP |
| --- | --- |
| Calculation method | NEB method |
| Functional | GGA-PBE |
| Pseudopotential | PAW |
| Cut-off energy | 500 eV |
| Point k | 2 × 2 × 3 |

In addition, in the $InGaZnO_4$ crystal model, there are an oxygen site 1 to an oxygen site 4 as shown in FIG. 41 which differ from each other in metal elements bonded to oxygen and the number of bonded metal elements. Here, calculation was made on the oxygen sites 1 and 2 in which an oxygen vacancy $V_o$ is easily formed.

First, calculation was made on the oxygen site that was bonded to three In atoms and one Zn atom as the oxygen site 1 in which an oxygen vacancy $V_o$ is easily formed.

Figure 42A:
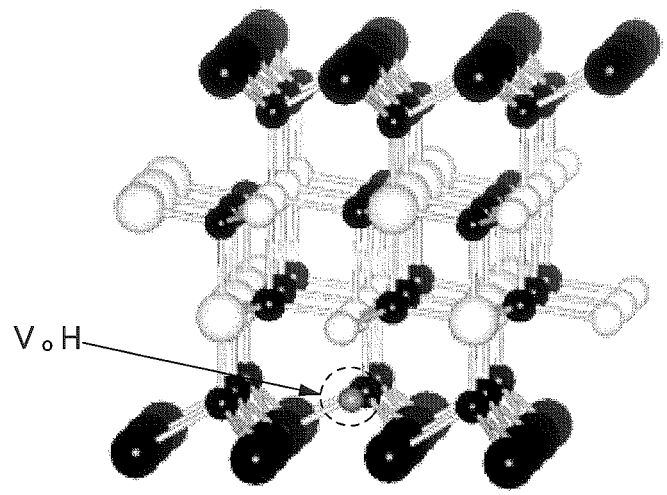
FIG. 42 Diagrams showing the initial state and the final state.
Figure 42B:
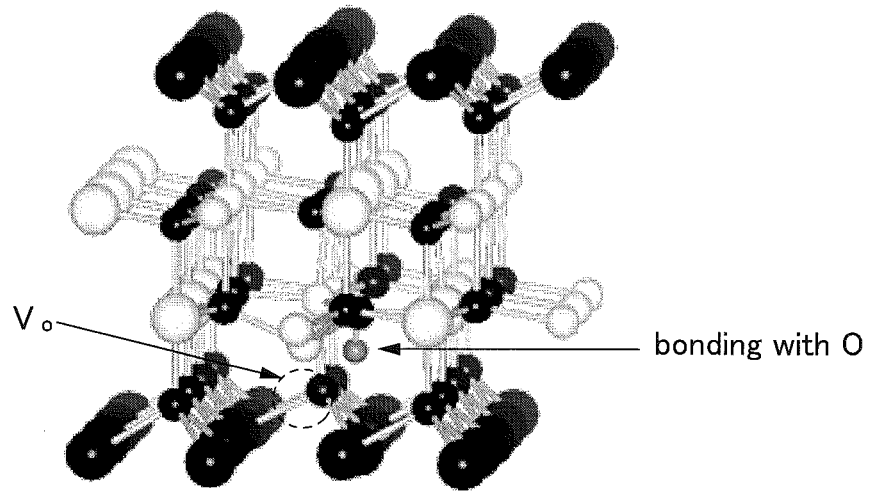
Figure 43:
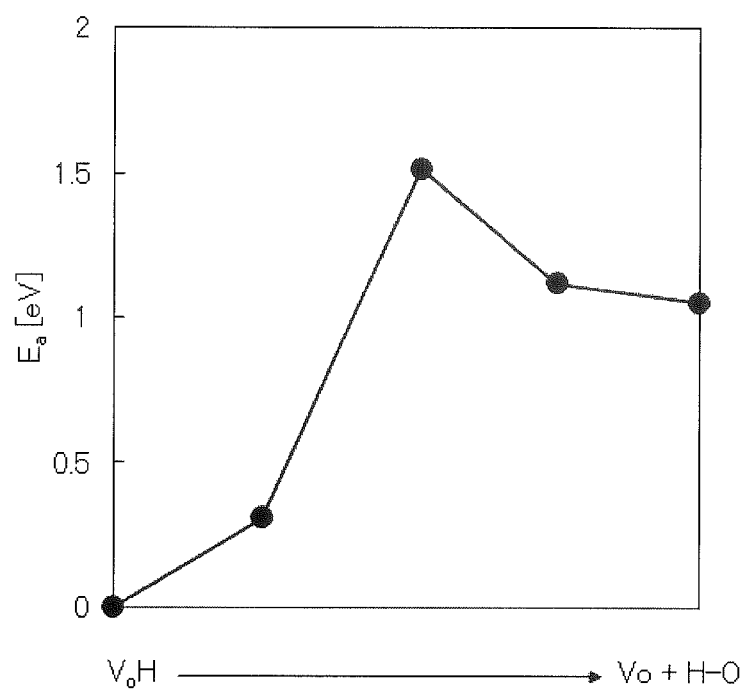
FIG. 43 A graph showing an activation barrier.

FIG. 42(A) shows a model in the initial state, and FIG. 42(B) shows a model in the final state. In addition, FIG. 43 shows the calculated activation barrier ($E_a$) in the initial state and the final state. Note that here, the initial state refers to a state in which H exists in an oxygen vacancy $V_o$ ($V_oH$), and the final state refers to a structure having an oxygen vacancy $V_o$ and a state in which H is bonded to oxygen bonded to one Ga atom and two Zn atoms (H—O).

From the calculation results, bonding of H in an oxygen vacancy $V_o$ to another oxygen atom needed an energy of about 1.52 eV, while entry of H bonded to O into an oxygen vacancy $V_o$ needed an energy of about 0.46 eV.

Reaction frequency (Γ) was calculated with use of the activation barriers ($E_a$) obtained by the calculation and Formula 10. Note that in Formula 10, $k_B$ represents the Boltzmann constant and T represents the absolute temperature.

$$\Gamma = v \exp\left(-\frac{E_a}{k_BT}\right) \qquad \text{[Formula 10]}$$

The reaction frequency at 350° C. was calculated on the assumption that the frequency factor $v=10^{13}$ [1/sec]. The frequency of H transfer from the model shown in FIG. 42(A) to the model shown in FIG. 42(B) was $5.52 \times 10^0$ [1/sec]. In addition, the frequency of H transfer from the model shown in FIG. 42(B) to the model shown in FIG. 42(A) was $1.82 \times 10^9$ [1/sec]. This suggests that H diffusing in IGZO is likely to form $V_oH$ if an oxygen vacancy $V_o$ exists in the neighborhood, and H is unlikely to be released from the oxygen vacancy $V_o$ once $V_oH$ is formed.

Next, calculation was made on the oxygen site that was bonded to one Ga atom and two Zn atoms as the oxygen site 2 in which an oxygen vacancy $V_o$ is easily formed.

Figure 44A:
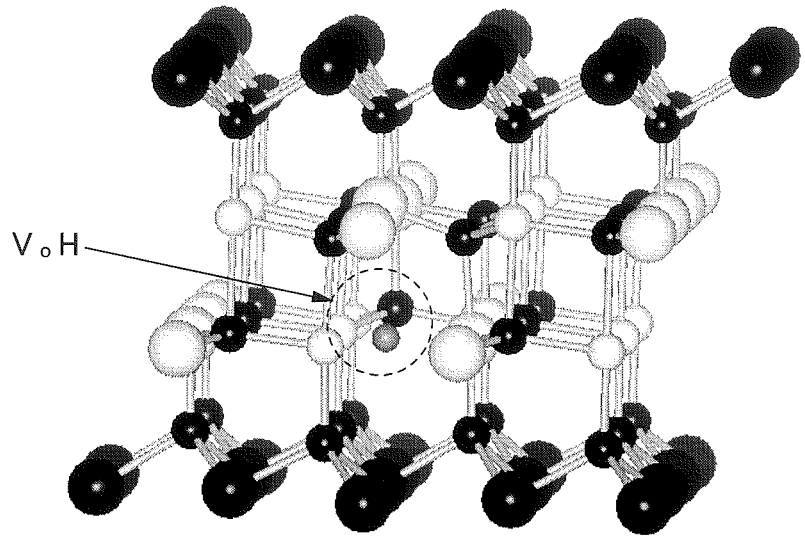
FIG. 44 Diagrams showing the initial state and the final state.
Figure 44B:
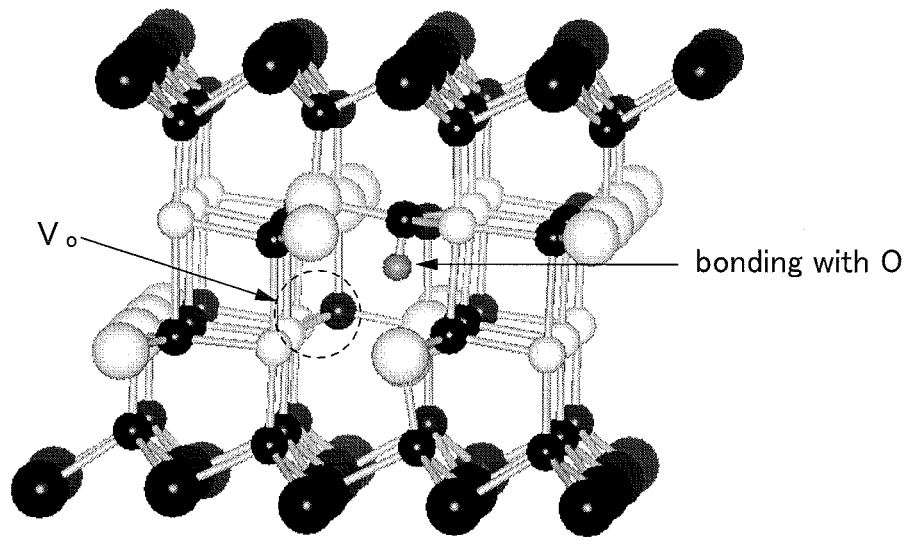
Figure 45:
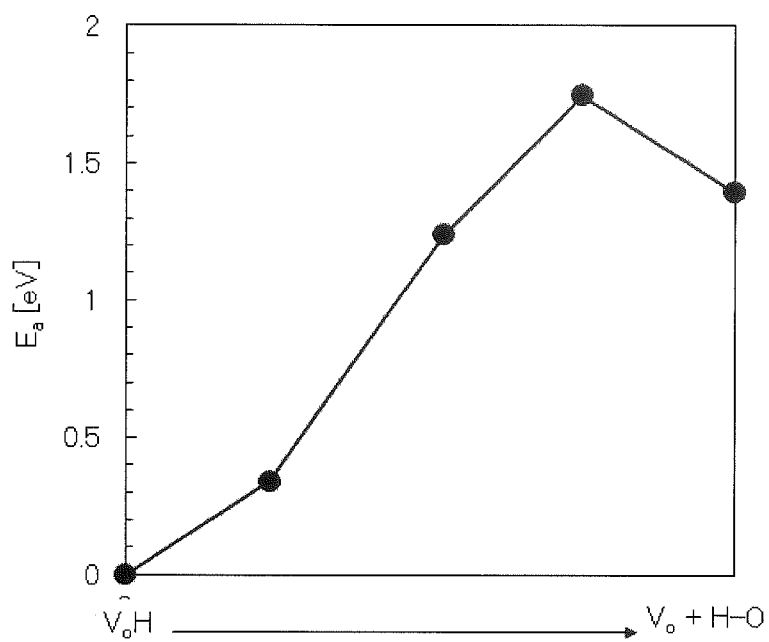
FIG. 45 A graph showing an activation barrier.

FIG. 44(A) shows a model in the initial state, and FIG. 44(B) shows a model in the final state. In addition, FIG. 45 shows the calculated activation barrier ($E_a$) in the initial state and the final state. Note that here, the initial state refers to a state in which H exists in an oxygen vacancy $V_o$ ($V_oH$), and the final state refers to a structure having an oxygen vacancy $V_o$ and a state in which H is bonded to oxygen bonded to one Ga atom and two Zn atoms (H—O).

From the calculation results, bonding of H in an oxygen vacancy $V_o$ to another oxygen atom needed an energy of about 1.75 eV, while entry of H bonded to O in an oxygen vacancy $V_o$ needed an energy of about 0.35 eV.

In addition, reaction frequency (Γ) was calculated with use of the activation barriers ($E_a$) obtained by the calculation and Formula 10.

The reaction frequency at 350° C. was calculated on the assumption that the frequency factor $v=10^{13}$ [1/sec]. The frequency of H transfer from the model shown in FIG. 44(A) to the model shown in FIG. 44(B) was $7.53\times10^{-2}$ [1/sec]. In addition, the frequency of H transfer from the model shown in FIG. 44(B) to the model shown in FIG. 44(A) was $1.44\times10^{10}$ [1/sec]. This suggests that H is unlikely to be released from the oxygen vacancy $V_o$ once $V_oH$ is formed.

From the above results, it was found that H in IGZO easily diffused in annealing and if an oxygen vacancy $V_o$ existed, H was likely to enter the oxygen vacancy $V_o$ to be $V_oH$.

<(2) Transition Level of $V_oH$>

The calculation by the NEB method, which was described in <(1) Ease of formation and stability of $V_oH$>, indicates that in the case where an oxygen vacancy $V_o$ and H exist in IGZO, the oxygen vacancy $V_o$ and H easily form $V_oH$ and further $V_oH$ is stable. Thus, to determine whether $V_oH$ is related to a carrier trap, the transition level of $V_oH$ was calculated.

The $InGaZnO_4$ crystal model (112 atoms) was used for calculation. $V_oH$ models of the oxygen sites 1 and 2 shown in FIG. 41 were made to calculate the transition levels. The calculation conditions are shown in Table 4.

TABLE 5

| Software | VASP |
| --- | --- |
| Model | $InGaZnO_4$ crystal (112 atoms) |
| Functional | HSE06 |
| Ratio of exchange terms | 0.25 |
| Pseudopotential | GGA-PBE |
| Cut-off energy | 800 eV |
| Point k | 1 × 1 × 1 |

The ratio of exchange terms was adjusted to have a band gap close to the experimental value; thus, the band gap of the $InGaZnO_4$ crystal model without defects was 3.08 eV and was close to the experimental value, 3.15 eV.

The transition level ($\in(q/q')$) of a model having defect D can be calculated by the following Formula 11. Note that $\Delta E(D^q)$ represents the formation energy of defect D at charge q, which is calculated by Formula 12.

$$\varepsilon(q/q') = \frac{\Delta E(D^q) - \Delta E(D^{q'})}{q' - q} \qquad [\text{Formula 11}]$$

$$\Delta E(D^q) = E_{tot}(D^q) - E_{tot}(\text{bulk}) + \sum_i \Delta n_i \mu_i + q(\varepsilon_{VBM} + \Delta V_q + E_F) \qquad [\text{Formula 12}]$$

In Formula 11 and Formula 12, $E_{tot}(D^q)$ represents the total energy of the model having defect D at the charge q in, $E_{tot}(\text{bulk})$ represents the total energy in a model without defects (complete crystal), $\Delta n_i$ represents a change in the number of atoms i contributing to defects, $\mu_i$ represents the chemical potential of atom i, $\varepsilon_{VBM}$ represents the energy of the valence band maximum in the model without defects, $\Delta V_q$ represents the correction term relating to the electrostatic potential, and $E_F$ represents the Fermi energy.

Figure 46:
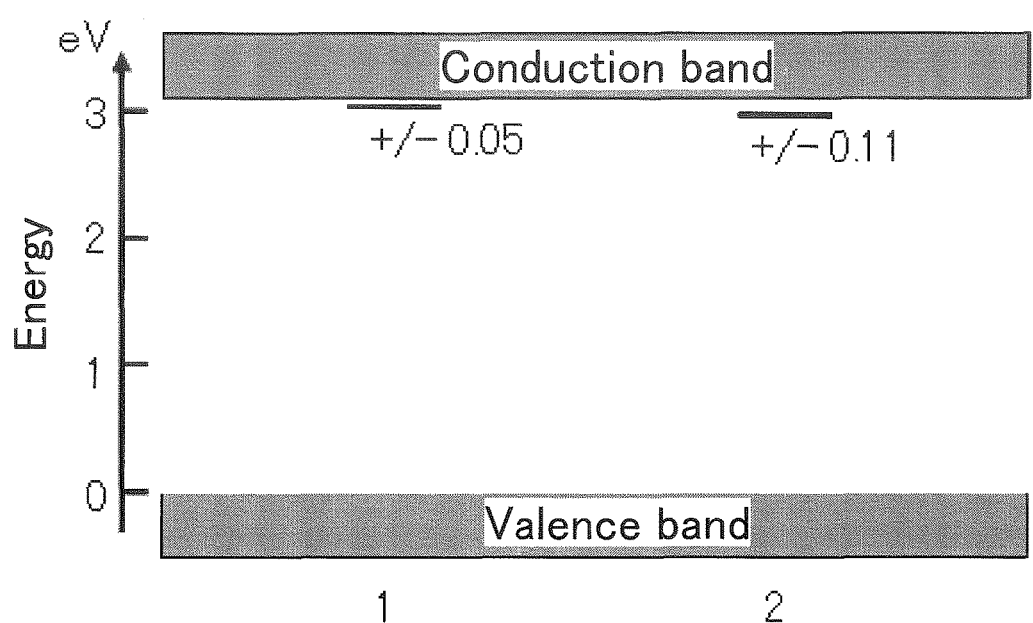
FIG. 46 A graph showing the transition levels of $V_oH$.

FIG. 46 shows the transition levels of $V_oH$ obtained from the above calculation. The numbers in FIG. 46 represent the depth from the conduction band minimum. In FIG. 46, the transition level of $V_oH$ in the oxygen site 1 is at 0.05 eV from the conduction band minimum, and the transition level of $V_oH$ in the oxygen site 2 is at 0.11 eV from the conduction band minimum; therefore, it can be thought that these $V_oH$ are related to electron traps. In other words, it is apparent that $V_oH$ behaves as a donor. Furthermore, it is apparent that IGZO having $V_oH$ has conductivity.

Note that this embodiment can be combined with the other embodiment and an example in this specification as appropriate.

(Embodiment 10)

The semiconductor device of one embodiment of the present invention can be used for display devices, personal computers, or image reproducing devices provided with recording media like and have displays for displaying the reproduced images). Besides, as electronic devices that can use the semiconductor device of one embodiment of the present invention, mobile phones, game machines including portable game consoles, portable data terminals, e-book readers, cameras such as video cameras and digital still cameras, goggle-type displays (head mounted displays), navigation systems, audio reproducing devices (car audio systems, digital audio players, and the like), copiers, facsimiles, printers, multifunction printers, automated teller machines (ATM), and vending machines. Specific examples of these electronic devices are illustrated in FIG. 47.

Figure 47A:
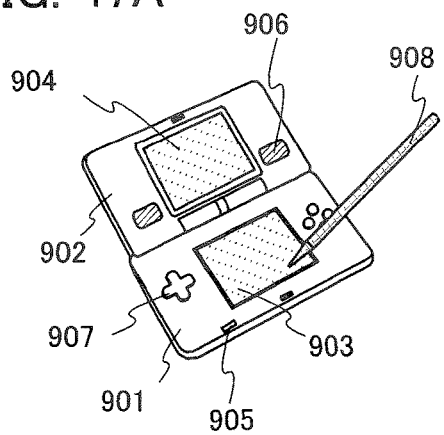
FIG. 47 Views each illustrating an electronic device.

FIG. 47(A) is a portable game console having a housing 901, a housing 902, a display portion 903, a display portion 904, a microphone 905, a speaker 906, an operation key 907, a stylus 908, and the like. Note that although the portable game machine illustrated in FIG. 47(A) has the two display portions, the display portion 903 and the display portion 904, the number of display portions included in a portable game machine is not limited to this.

Figure 47B:
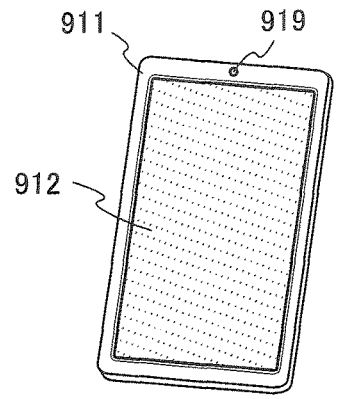

FIG. 47(B) is a portable data terminal having a first housing 911, a display portion 912, a camera 919, and the like. A touch panel function of the display portion 912 enables input of information.

Figure 47C:
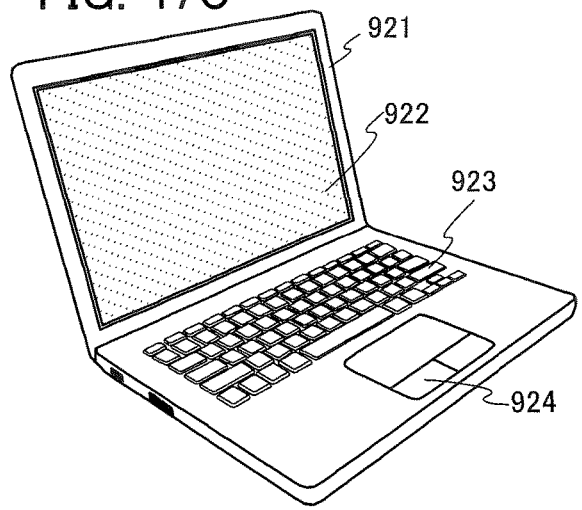

FIG. 47(C) is a laptop personal computer having a housing 921, a display portion 922, a keyboard 923, a pointing device 924, and the like.

Figure 47D:
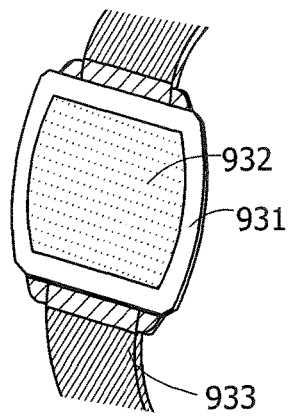

FIG. 47(D) is a wrist-watch-type information terminal having a housing 931, a display portion 932, a wristband 933, and the like. The display portion 932 may be a touch panel.

Figure 47E:
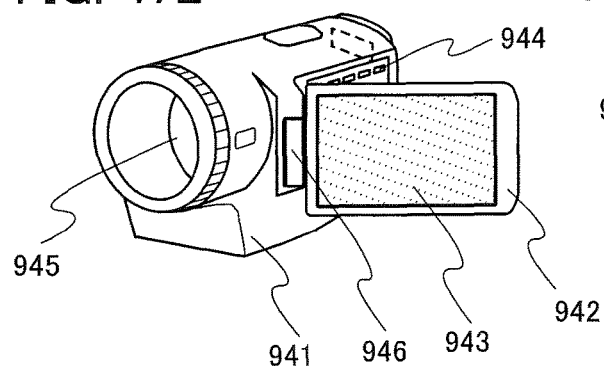

FIG. 47(E) is a video camera having a first housing 941, a second housing 942, a display portion 943, operation keys 944, a lens 945, a joint 946, and the like. The operation keys 944 and the lens 945 are provided for the first housing 941, and the display portion 943 is provided for the second housing 942. Then, the first housing 941 and the second housing 942 are connected to each other with the joint 946, and the angle between the first housing 941 and the second housing 942 can be changed with the joint 946. A structure in which images displayed on the display portion 943 is switched in accordance with the angle at the joint 946 between the first housing 941 and the second housing 942 may be employed.

Figure 47F:
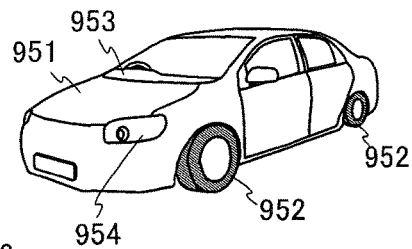

FIG. 47(F) is an ordinary car having a car body 951, wheels 952, a dashboard 953, lights 954, and the like.

Note that content (or may be part of the content) described in one embodiment may be applied to, combined with, or replaced by different content (or may be part of the different content) described in the embodiment and/or content (or may be part of the content) described in one or more different embodiments.

Note that in each embodiment, content described in the embodiment is content described with reference to a variety of diagrams or content described with a text described in the specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in another embodiment or other embodiments, much more diagrams can be formed.

Note that as for content that is not specified in any drawing or text in the specification, it is possible to constitute one embodiment of the present invention that specifies exclusion of the content. Alternatively, when the range of a value that is shown by the maximum and minimum values is described, the range is narrowed freely or part of the range is removed, so that it is possible to constitute one embodiment of the invention excluding part of the range. In this manner, it is possible to specify that a conventional technology is excluded from the technical scope of one embodiment of the present invention, for example.

As a specific example, a circuit diagram of a circuit using first to fifth transistors is illustrated. In that case, it is possible to specify as the invention that the circuit does not have a sixth transistor. Alternatively, it is possible to specify as the invention that the circuit does not have a capacitor. Furthermore, it is possible to constitute the invention by specifying that the circuit does not have a sixth transistor with a particular connection. Alternatively, it is possible to constitute the invention by specifying that the circuit does not have a capacitor with a particular connection. For example, it is possible to specify the invention that the circuit does not have a sixth transistor whose gate is connected to a gate of the third transistor. Alternatively, for example, it is possible to specify the invention that the circuit does not have a capacitor whose first electrode is connected to the gate of the third transistor.

As another specific example, the expression "voltage is preferably higher than or equal to 3 V and lower than or equal to 10 V" is used to describe a given value, for example. In that case, for example, it is possible to specify one embodiment of the present invention that the case where the voltage is higher than or equal to −2 V and lower than or equal to 1 V is excluded. Alternatively, for example, it is possible to specify one embodiment of the present invention that the case where the voltage is higher than or equal to 13 V is excluded. Note that, for example, it is possible to specify the invention that the voltage is higher than or equal to 5 V and lower than or equal to 8 V. Note that for example, it is also possible to specify the invention that the voltage is about 9 V. Note that for example, it is also possible to specify the invention that the case where the voltage is 9 V is excluded, though the voltage is higher than or equal to 3 V and lower than or equal to 10 V. Note that even when the expression "a value is preferably in a certain range", "a value preferably satisfies a certain condition", or the like is used, the value is not limited to the description. In other words, even when there is description with "preferable", "suitable", or the like, the present invention is not necessarily limited to the description.

As another specific example, the expression "voltage is preferably 10 V" is used to describe a given value, for example. In that case, for example, it is possible to specify one embodiment of the present invention that the case where the voltage is higher than or equal to −2 V and lower than or equal to 1 V is excluded. Alternatively, for example, it is possible to specify one embodiment of the present invention that the case where the voltage is higher than or equal to 13 V is excluded.

As another specific example, the expression "a film is an insulating film" is used to describe properties of a material, for example. In that case, for example, it is possible to specify one embodiment of the present invention that the case where the insulating film is an organic insulating film is excluded. Alternatively, for example, it is possible to specify one embodiment of the present invention that the case where the insulating film is an inorganic insulating film is excluded. Alternatively, for example, it is possible to specify one embodiment of the present invention that the case where the film is a conductive film is excluded. Alternatively, for example, it is possible to specify one embodiment of the present invention that the case where the film is a semiconductor film is excluded.

As another specific example, the expression "a film is provided between an A film and a B film" is used to describe a given stacked-layer structure, for example. In that case, for example, it is possible to specify the invention that the case where the film is a stacked film of four or more layers is excluded. Alternatively, for example, it is possible to specify the invention that the case where a conductive film is provided between the A film and the film is excluded.

Note that various people can implement one embodiment of the invention described in this specification and the like. However, different people may be involved in the implementation of the invention. For example, in the case of a transmission/reception system, the following case is possible: Company A manufactures and sells transmitting devices, and Company B manufactures and sells receiving devices. As another example, in the case of a light-emitting device having a TFT and a light-emitting element, the following case is possible: Company A manufactures and sells semiconductor devices where TFTs are formed. Then, Company B purchases the semiconductor devices, deposit light-emitting elements over the semiconductor devices, and completes light-emitting devices.

In such a case, one embodiment of the invention can be constituted so that a patent infringement can be claimed against either Company A or Company B. In other words, one embodiment of the invention can be constituted so that only Company A implements the embodiment, and another embodiment of the invention can be constituted so that only Company B implements the embodiment. In addition, one embodiment of the invention with which a patent infringement suit can be filed against Company A or Company B is clear and can be regarded as being described in this specification or the like. For example, in the case of a transmission/reception system, even when the case where a transmitting device is used alone or the case where a receiving device is used alone is not described in this specification or the like, one embodiment of the invention can be constituted by only the transmitting device and another embodiment of the invention can be constituted by only the receiving device, and those embodiments of the invention are clear and can be regarded as being described in this specification or the like. Another example is as follows: in the case of a light-emitting device including a TFT and a light-emitting element, even when the case where a semiconductor device where the TFT is formed is used alone or the case where a light-emitting device having the light-emitting element is used alone is described in this specification or the like, one embodiment of the invention can be constituted by only the semiconductor device where the TFT is formed and another embodiment of the invention can be constituted by only the light-emitting device having the light-emitting element, and those embodiments of the invention are clear and can be regarded as being described in this specification or the like.

Note that in this specification and the like, it might be possible for those skilled in the art to constitute one embodiment of the invention even when portions to which all the terminals of an active element (a transistor, a diode, or the like), a passive element (a capacitor, a resistor, or the like), or the like are connected are not specified. In other words, one embodiment of the invention is clear even when connection portions are not specified. Furthermore, in the case where the content of a specified connection portion is described in this specification and the like, it can be determined that one embodiment of the invention in which a connection portion is not specified is disclosed in this specification and the like, in some cases. In particular, in the case where the number of portions to which the terminal is connected is plural, it is not necessary to specify the portions to which the terminal is connected. Therefore, it is possible in some cases to constitute one embodiment of the invention by specifying only portions to which some of terminals of an active element (a transistor, a diode, or the like), a passive element (a capacitor, a resistor, or the like), or the like are connected.

Note that in this specification and the like, it is possible in some cases for those skilled in the art to specify the invention when at least the connection portion of a circuit is specified. Alternatively, it is possible in some cases for those skilled in the art to specify the invention when at least the function of a circuit is specified. In other words, one embodiment of the present invention is clear when the function of a circuit is specified. Furthermore, it can be determined that one embodiment of the present invention in which a function is specified is described in this specification and the like in some cases. Thus, when the connection portion of a circuit is specified, the circuit is disclosed as one embodiment of the invention even if a function is not specified, and one embodiment of the invention can be constituted. Alternatively, when the function of a circuit is specified, the circuit is disclosed as one embodiment of the invention even when a connection portion is not specified, and one embodiment of the invention can be constituted.

Note that in this specification and the like, in a diagram or a text described in one embodiment, part of the diagram or the text is taken out, and one embodiment of the invention can be constituted. Thus, in the case where a diagram or a text related to a certain portion is described, the context taken out from part of the diagram or the text is also disclosed as one embodiment of the invention, and one embodiment of the invention can be constituted. Then, one embodiment of the invention is clear. Therefore, for example, in a diagram or a text in which one or more active elements (transistors, diodes, or the like), wirings, passive elements (capacitors, resistors, or the like), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, M circuit elements (transistors, capacitors, or the like) (M is an integer, where M<N) are taken out from a circuit diagram in which N circuit elements (transistors, capacitors, or the like) (N is an integer) are provided, and one embodiment of the invention can be constituted. As another example, M layers (M is an integer, where M<N) are taken out from a cross-sectional view in which N layers (N is an integer) are provided, and one embodiment of the invention can be constituted. As another example, M elements (M is an integer, where M<N) are taken out from a flow chart in which N elements (N is an integer) are provided, and one embodiment of the invention can be constituted. As another example, it is possible to take out some given elements from a sentence "A includes B, C, D, E, or F" and constitute one embodiment of the invention such as "A includes B and E", "A includes E and F", "A includes C, E, and F", or "A includes B, C, D, and E".

Note that in this specification and the like, in a diagram or a text described in one embodiment, in the case where at least one specific example is described, it will be readily appreciated by those skilled in the art that a broader concept of the specific example can be derived. Thus, in the diagram or the text described in one embodiment, in the case where at least one specific example is described, a broader concept of the specific example is disclosed as one embodiment of the invention, and one embodiment of the invention can be constituted. Then, one embodiment of the invention is clear.

Note that in this specification and the like, content described in at least a diagram (or may be part of the diagram) is disclosed as one embodiment of the invention, and one embodiment of the invention can be constituted. Thus, when certain content is described in a diagram, the content is disclosed as one embodiment of the invention even when the content is not described with a text, and one embodiment of the invention can be constituted. Similarly, part of a diagram that is taken out from the diagram is disclosed as one embodiment of the invention, and one embodiment of the invention can be constituted. Then, one embodiment of the invention is clear.

Note that this embodiment can be combined with the other embodiment and an example in this specification as appropriate.

EXAMPLE 1

In this example, the results of examination on channel length dependence of field-effect mobility of an S-channel type transistor in which a CAAC-IGZO film is used as an active layer will be described.

Figure 48:
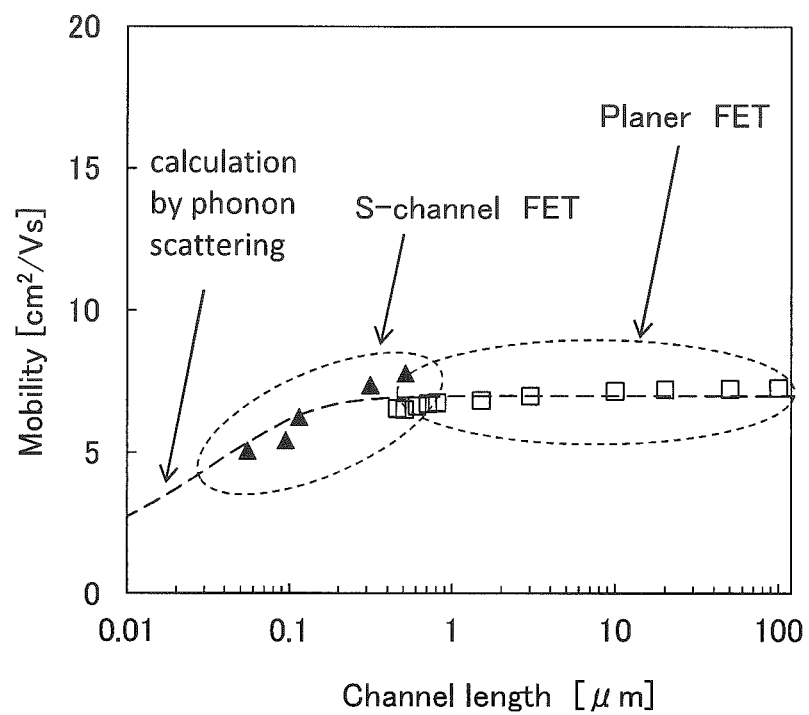
FIG. 48 A graph showing calculated values of channel length dependence of mobility of an OS transistor.

It is necessary to miniaturize a transistor to increase the degree of integration of a circuit and achieve high speed operation. While field-effect mobility ($\mu_{FE}$) is reduced as the channel length (L) gets shorter in a Si transistor, $\mu_{FE}$ of a transistor in which CAAC-IGZO is used as an active layer (hereinafter a CAAC-IGZO transistor) has a fixed value in the range of 0.45 μm to 100 μm (see FIG. 48). A CAAC- IGZO transistor having a further short channel length was fabricated and L length dependence of its $\mu_{FE}$ was examined.

Figure 49A:
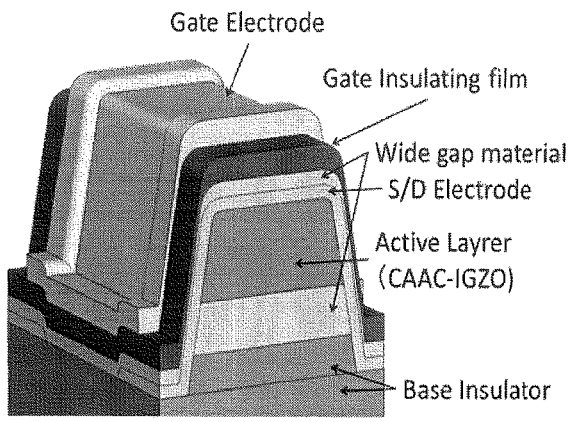
FIG. 49 Views and cross-sectional SEM photographs showing a structure of an S-channel type transistor.
Figure 49B:
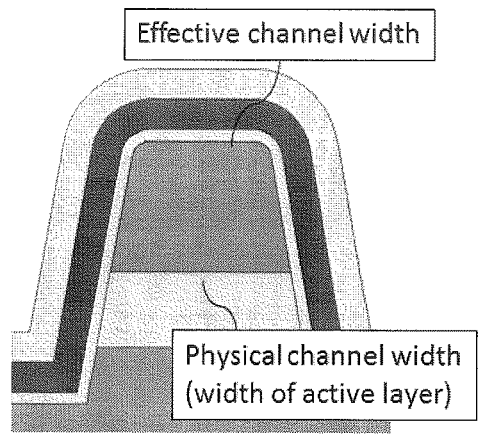
Figure 49C:
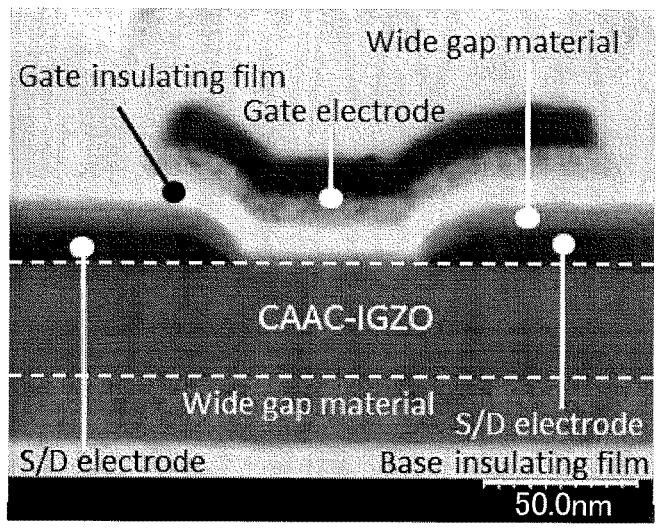
Figure 49D:
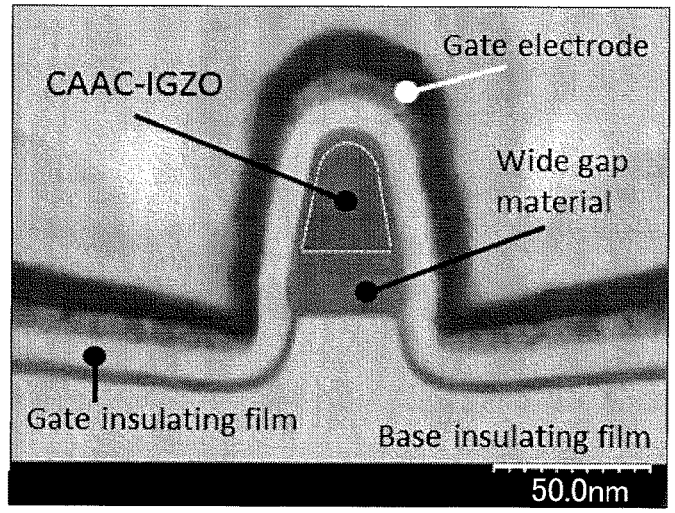

In this example, a plurality of CAAC-IGZO transistors whose widths of active layers were each 47 nm and channel lengths (L) were 55 nm to 515 nm were fabricated. The structure of the fabricated transistors is shown in FIGS. 49(A) and (B). In addition, FIG. 49(C) is a cross-sectional SEM photograph in the channel length direction, and FIG. 49(D) is a cross-sectional SEM photograph in the channel width direction.

The structure of the transistor was a top-gate top-contact structure, in which a source electrode layer and a drain electrode layer covered part of side surfaces of the active layer and its thickness was 10 nm. A gate electrode layer partly overlaps with the source electrode layer and the drain electrode layer and surrounds the active layer in a channel portion. In other words, the transistor has the structure of the S-channel type transistor described in the above embodiment. Moreover, for comparison, planar type CAAC-IGZO transistors whose channel widths were each 10 μm and channel lengths were 0.81 μm to 100 μm and Si transistors whose channel widths were each 8 μm and channel lengths were 0.3 μm to 7.95 μm were also fabricated.

The active layer was formed by performing DC sputtering on a polycrystalline IGZO target having a composition of In:Ga:Zn=1:1:1 (atomic ratio), and the thickness was set to 40 nm. In the S-channel type transistor, an effective channel width can be estimated as follows: (the width of the active layer)+(the thickness of the active layer)×2. In addition, the thickness of a gate insulating film was set to a transmissive oxide thickness (EOT) of 11 nm.

Figure 50A:
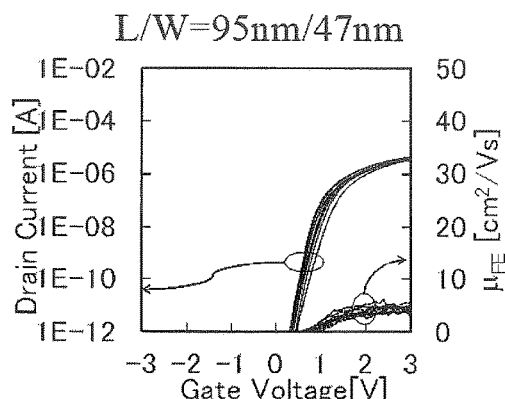
FIG. 50 Graphs showing Id-Vg characteristics of OS transistors.
Figure 50B:
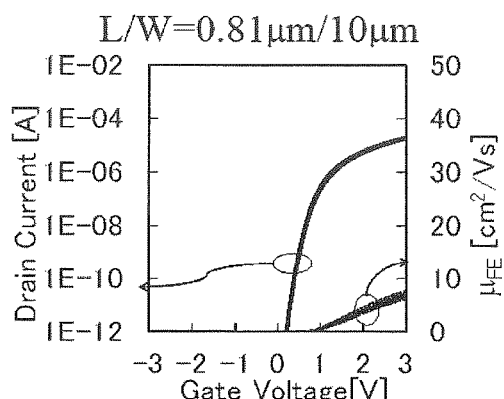
Figure 50C:
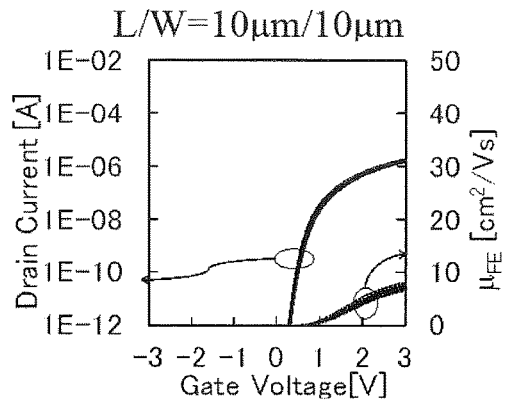
Figure 50D:
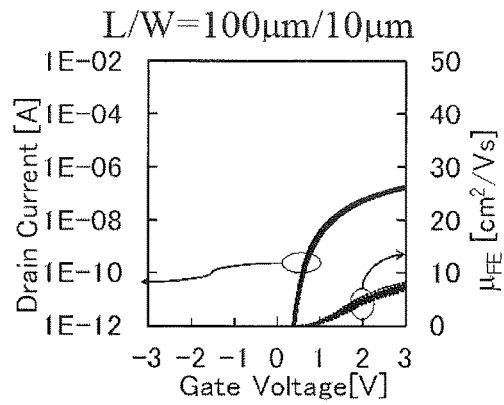

Drain current-gate voltage characteristics (Id-Vg characteristics) in which the fabricated CAAC-IGZO transistors were measured at a drain voltage of 5 V and a gate voltage ranging from 3 V to +3 V are shown in FIG. 50(A) to FIG. 50(D). FIG. 50(A) is Id-Vg characteristics of the s-channel type transistors, and FIG. 50(C) to FIG. 50(D) are Id-Vg characteristics of the planar type transistors. In addition, Id-Vg characteristics in which the fabricated Si transistors were measured at a drain voltage of 1 V and a gate voltage ranging from −6 V to +6 V are shown in FIG. 53(A) to FIG. 53(F).

Note that the field-effect mobility was calculated from Formula 13 shown below. The above-described effective channel width was used in the S-channel type CAAC-IGZO transistors for comparison with the planar type CAAC-IGZO transistors.

$$\mu_{FE} = \max\left(\frac{L}{WC_{OX}V_D}\left(\frac{\partial I_D}{\partial V_G}\right)\right) \quad \text{[Formula 13]}$$

Figure 51:
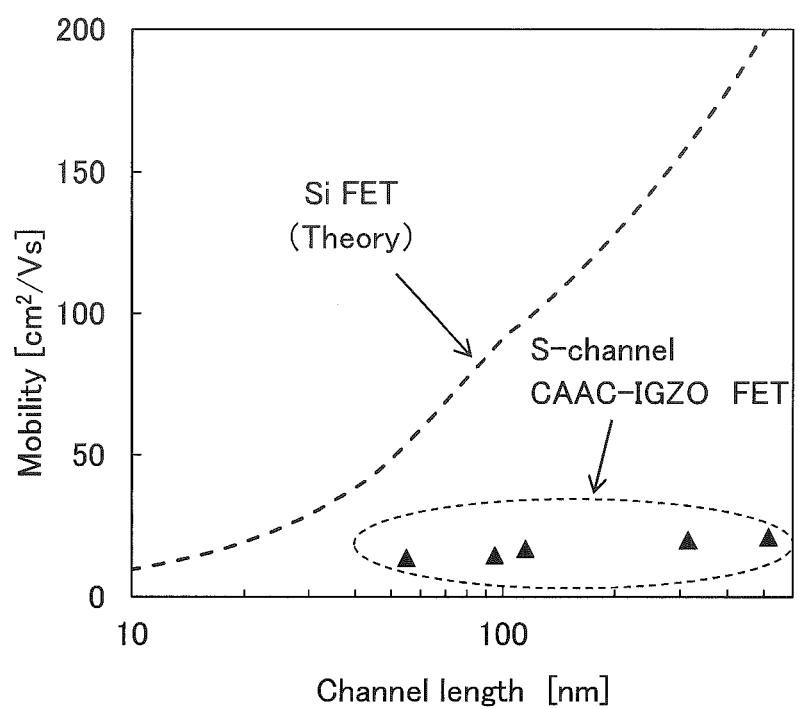

The calculated field-effect mobility of the CAAC-IGZO transistors is shown in triangular dots in FIG. 51. The transistor whose channel length was 515 nm resulted in $\mu_{FE}$=7.8 cm$^2$/Vs, and the transistor whose channel length was 55 nm resulted in $\mu_{FE}$=5.1 cm$^2$/Vs. This accords well with channel length dependence of mobility theoretically calculated. In addition, according to the theoretical values shown in FIG. 51 and the measured values shown in FIG. 53(A) to FIG. 53(F), it is found that the field-effect mobility is reduced as the channel length gets shorter in the Si transistors.

The factor of reduction in field-effect mobility by miniaturization of a transistor is phonon scattering of an electron. In a Si transistor, hot carrier is easily generated because of high electron mobility of Si, and field-effect mobility greatly decreases owing to the influence of phonon scattering of the hot carrier as a channel length gets shorter and the drain electric field intensity gets stronger (see Formula 14).

$$v_d = \min\left(\mu_0 E \cdot \sqrt{2} \cdot \left\{1 + \left[1 + \frac{3\pi}{8}\left(\frac{\mu_0 E}{C_S}\right)^2\right]^{1/2}\right\}^{-1/2}, \left(\frac{8E_P}{3\pi m_0}\right)\right) \quad \text{[Formula 14]}$$

Figure 52A:
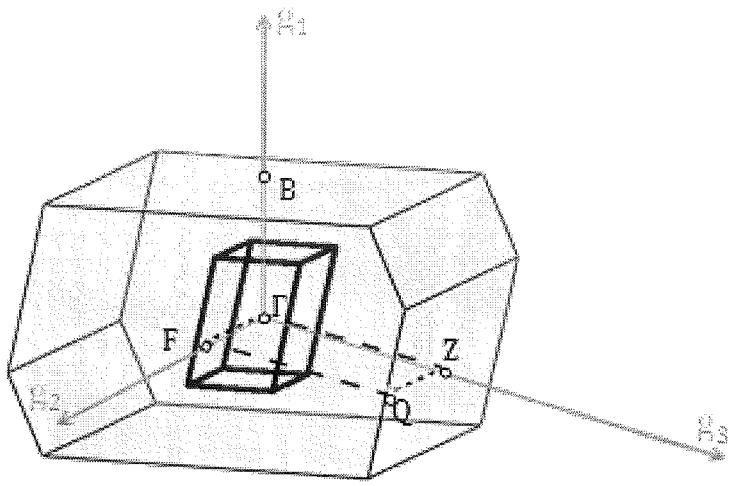
FIG. 52 A diagram showing a unit cell of single crystal IGZO and a reciprocal lattice thereof and a view showing a dispersion relation of phonon in single crystal IGZO.
Figure 52B:
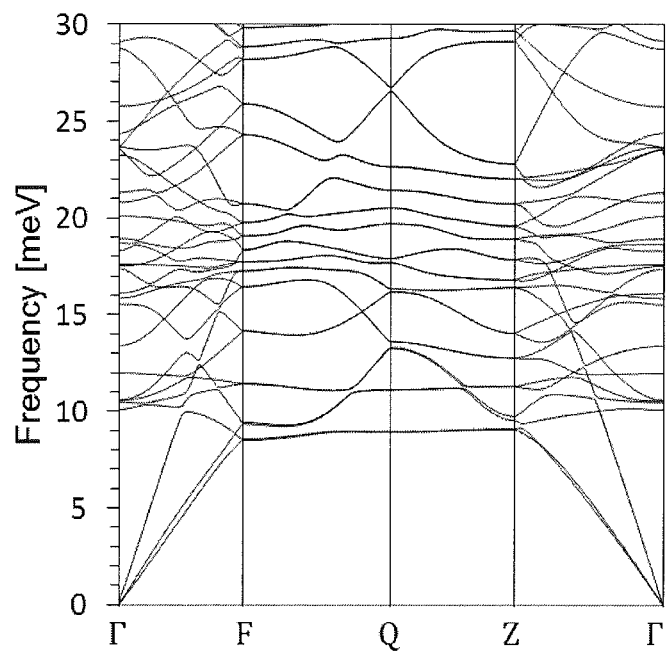
Figure 53A:
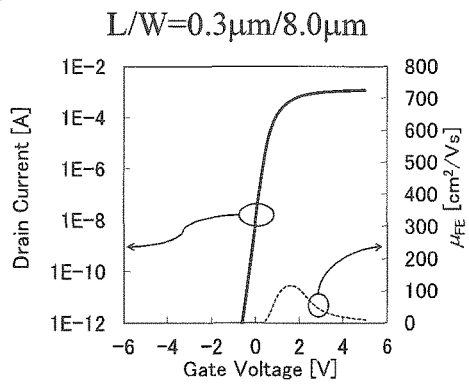
FIG. 53 Graphs showing Id-Vg characteristics of Si transistors.
Figure 53B:
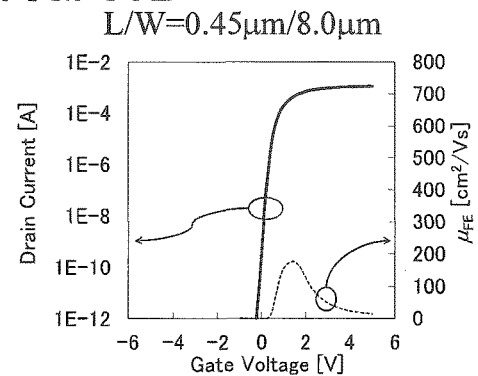
Figure 53C:
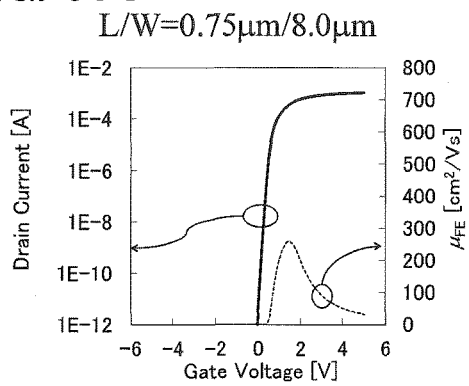
Figure 53D:
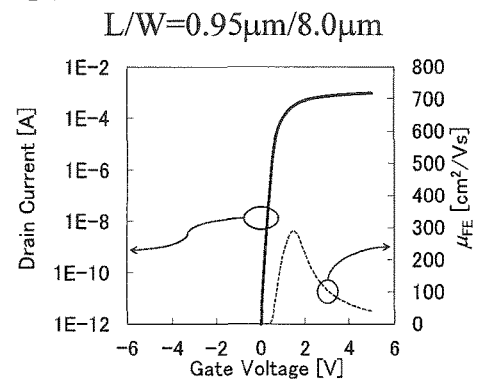
Figure 53E:
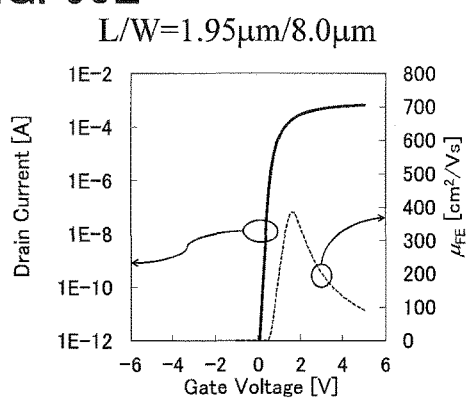
Figure 53F:
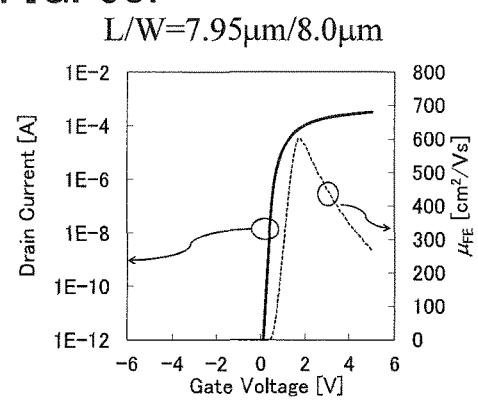

The electron mobility of CAAC-IGZO is smaller than that of Si. In contrast, it was found that, when a dispersion relation of phonon in IGZO was calculated by first-principles calculation (see FIGS. 52(A) and (B)), the sound velocity of single crystal IGZO did not greatly differ from the sound velocity of single crystal Si (see Table 6).

TABLE 6

| | Group velocity of acoustic phonon modes | |
|---|---|---|
| Mode | g1-axis direction [km/sec] | g2-axis direction [km/sec] |
| LA | 6.68 | 5.84 |
| T$_1$A | 2.74 | 3.09 |
| T$_2$A | 3.19 | 3.03 |

Therefore, in the CAAC-IGZO transistors, hot carrier is less likely to be generated even when the drain electric field intensity is increased by a short channel length. As a result, a difference between the field-effect mobility of the Si transistors and the field-effect mobility of the CAAC-IGZO transistors tends to be narrowed as the channel length gets shorter.

Field-effect mobility of a Si transistor whose channel length is 50 nm, which is theoretically calculated, is 49 cm$^2$/Vs, and a difference between the field-effect mobility of the CAAC-IGZO transistors and the field-effect mobility of the Si transistors is about a tenth.

In FIG. 51, the field-effect mobility was calculated from the effective channel width; however, when the field-effect mobility is calculated from a physical channel width, i.e., the width of the active layer, the difference between the S-channel CAAC-IGZO transistors and the Si transistors gets much smaller, which is about a quarter of the field-effect mobility of the Si transistor whose channel length is 50 nm. Moreover, the field-effect mobility can be further improved by changing the composition of CAAC-IGZO and thus the difference between both of them can be further narrowed.

Note that this embodiment can be combined with the other embodiment and an example in this specification as appropriate.

EXAMPLE 2

In this example, the results of examination on channel length dependence of field-effect mobility of an S-channel type transistor in which a CAAC-IGZO film of an advanced type is used as an active layer will be described.

Figure 65:
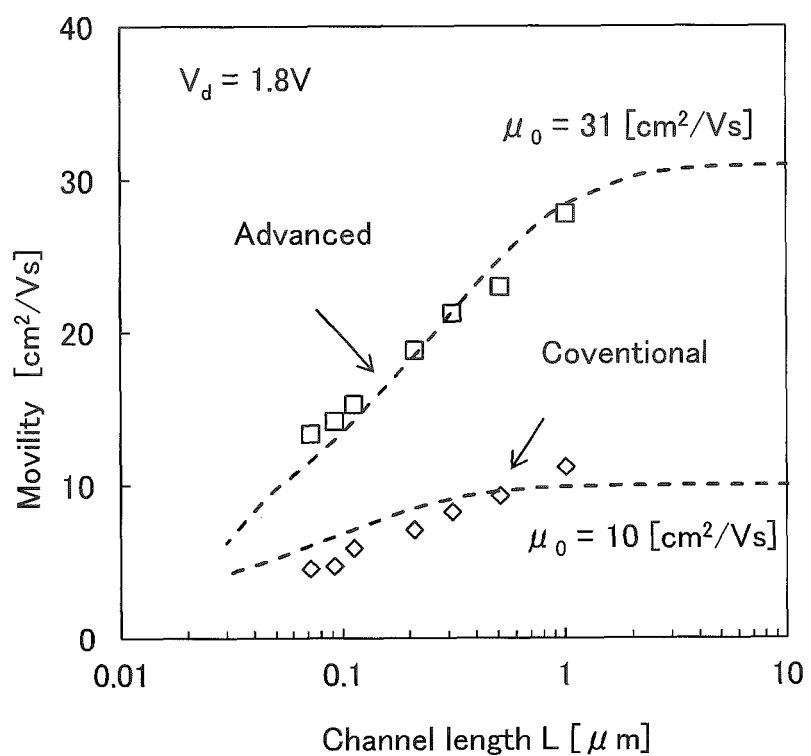
FIG. 65 A graph showing measured values and calculated values of channel length dependence of mobility of an OS transistor.

FIG. 65 is a graph in which CAAC-IGZO transistors of an advanced type (Advanced CAAC-IGZO FET) and CAAC-IGZO transistors of a conventional type (Conventional CAAC-IGZO FET) are compared in terms of channel length (L) dependence of field-effect mobility (μFE).

Note that the CAAC-IGZO transistor of a conventional type is the same as the structure described in Example 1. In addition, the CAAC-IGZO transistor of an advanced type is different from the CAAC-IGZO transistor of a conventional type in that the active layer is formed using a polycrystalline IGZO target having a composition of In:Ga:Zn=4:2:4.1 (atomic ratio).

Dots plotted in the graph are measured values, and dashed lines are L dependence of μFE, which is calculated from a theory. Note that for calculation, values obtained from first-principles calculation using single crystal IGZO having a composition of In:Ga:Zn=1:1:1 (atomic ratio) as a model are used for sound velocity Cs and minimum energy Ep of optical phonon, which are physical property values relating to phonon. Specifically, the following were used: $C_s=5.84\times 10^5$ [cm·s$^{-1}$] and Ep=9.4 [meV].

Note that as a fitting parameter, a low electric field mobility $\mu_0$ is set to 10 [cm$^2$/Vs] and 31 [cm$^2$/Vs] in the CAAC-IGZO transistors of a conventional type and the CAAC-IGZO transistors of an advanced type, respectively. The measured values and channel length (L) dependence of $\mu_{FE}$, which is estimated from a theory, well accord with each other, and it can be concluded that field-effect mobility in a short channel is rate-controlled by phonon scattering even in the advanced CAAC-IGZO transistors.

Figure 66:
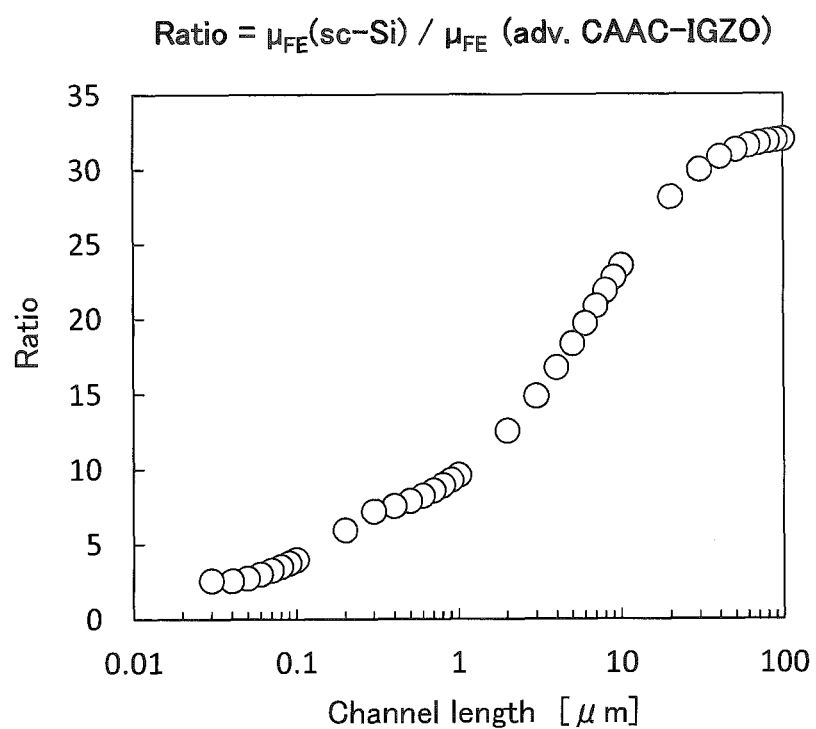
FIG. 66 A graph showing a ratio in field-effect mobility between a Si transistor and an Advanced CAAC-IGZO transistor.

FIG. 66 shows channel length (L) dependence of a ratio of field-effect mobility between a transistor fabricated using single crystal Si ($\mu_0=1000$ [cm$^2$/Vs]) and the advanced CAAC-IGZO transistor. From the discussion of velocity saturation, the ratio between both the transistors can be reduced to 4 or less when L is made smaller than 0.1 μm.

Note that this embodiment can be combined with the other embodiment and an example in this specification as appropriate.

REFERENCE NUMERALS 101 transistor
102 transistor
103 transistor
104 transistor
105 transistor
106 transistor
107 transistor
108 transistor
109 transistor
110 transistor
111 transistor
112 transistor
115 substrate
120 insulating layer
130 oxide semiconductor layer
130a oxide semiconductor layer
130A oxide semiconductor film
130b oxide semiconductor layer
130B oxide semiconductor film
130c oxide semiconductor layer
130C oxide semiconductor film
140 conductive layer
141 conductive layer
142 conductive layer
150 conductive layer
151 conductive layer
152 conductive layer
156 resist mask
160 insulating layer
160A insulating film
170 conductive layer
171 conductive layer
171A conductive film
172 conductive layer
172A conductive film
173 conductive layer
175 insulating layer
180 insulating layer
190 insulating layer
231 region
232 region
233 region
331 region
332 region
333 region
334 region
335 region
700 substrate
701 pixel portion
702 scan line driver circuit
703 scan line driver circuit
704 signal line driver circuit
710 capacitor wiring
712 gate wiring
713 gate wiring
714 data line
716 transistor
717 transistor
718 liquid crystal element
719 liquid crystal element
720 pixel
721 switching transistor
722 driver transistor
723 capacitor
724 light-emitting element
725 signal line
726 scan line
727 power supply line
728 common electrode
901 housing
902 housing
903 display portion
904 display portion
905 microphone
906 speaker
907 operation key
908 stylus
911 housing
912 display portion
919 display portion
921 housing
922 display portion
923 keyboard
924 pointing device
931 housing
932 display portion
933 wristband
941 housing
942 housing
943 display portion
944 operation key
945 lens
946 joint
951 car body
952 wheel
953 dashboard
954 light
1189 ROM interface
1190 substrate
1191 ALU 1192 ALU controller
1193 instruction decoder
1194 interrupt controller
1195 timing controller
1196 register
1197 register controller
1198 bus interface
1199 ROM
1200 memory element
1201 circuit
1202 circuit
1203 switch
1204 switch
1206 logic element
1207 capacitor
1208 capacitor
1209 transistor
1210 transistor
1213 transistor
1214 transistor
1220 circuit
2100 transistor
2200 transistor
2201 insulating layer
2202 wiring
2203 plug
2204 insulating layer
2205 wiring
2206 wiring
2207 insulating layer
2208 blocking layer
2211 semiconductor substrate
2212 insulating layer
2213 gate electrode layer
2214 gate insulating layer
2215 drain region
3001 wiring
3002 wiring
3003 wiring
3004 wiring
3005 wiring
3200 transistor
3300 transistor
3400 capacitor
5100 pellet
5100a pellet
5100b pellet
5101 ion
5120 substrate
5130 target
5161 region

The invention claimed is:

1. A semiconductor device comprising:
a plurality of transistors with different channel lengths,
wherein active layers of the plurality of transistors are each an oxide semiconductor,
wherein in the plurality of transistors, field-effect mobility of a transistor whose channel length is maximum and field-effect mobility of a transistor whose channel length is minimum are substantially constant,
wherein field-effect mobility of the plurality of transistors are measured at a same drain voltage,
wherein the field-effect mobility of the transistor whose channel length is minimum is not influenced by acoustic phonon in the oxide semiconductor, and
wherein, in each of the oxide semiconductor of the plurality of transistors, a concentration of silicon is less than $1 \times 10^{19}$ atoms/cm$^3$.

2. A semiconductor device comprising:
a plurality of transistors with different channel lengths,
wherein active layers of the plurality of transistors are each an oxide semiconductor, and when channel lengths of the plurality of transistors are 0.01 μm to 100 μm, a reduction in field-effect mobility of a transistor whose channel length is minimum with respect to field-effect mobility of a transistor whose channel length is maximum is less than or equal to 70%,
wherein field-effect mobility of the plurality of transistors are measured at a same drain voltage,
wherein each of the field-effect mobility of the plurality of transistors when each of channel lengths of the plurality of transistors are 0.45 μm to 100 μm is not substantially influenced by acoustic phonon in the oxide semiconductor, and
wherein in each of the plurality of transistors, a gate electrode faces a first side surface in a channel width direction of the oxide semiconductor and a second side surface in the channel width direction of the oxide semiconductor.

3. A semiconductor device comprising:
a plurality of transistors whose channel lengths ranges from 0.01 μm to 10 μm,
wherein the plurality of transistors includes a plurality of transistors whose active layers are each an oxide semiconductor and a plurality of transistors whose active layers are each silicon,
wherein a ratio of field-effect mobility of a transistor whose channel length is maximum, which is included in the plurality of transistors whose active layers are each an oxide semiconductor, to field-effect mobility of a transistor whose channel length is minimum, which is included in the plurality of transistors whose active layers are each silicon, is greater than or equal to a thirtieth,
wherein field-effect mobility of the plurality of transistors are measured at a same drain voltage, and
wherein field-effect mobility of the plurality of transistors whose active layers are each an oxide semiconductor is less influenced by acoustic phonon than filed-effect mobility of the plurality of transistors whose active layers are each silicon.

4. The semiconductor device according to claim 1, wherein the oxide semiconductor has In, Zn, and M (M is Al, Ti, Ga, Y, Zr, La, Ce, Nd, or Hf).

5. The semiconductor device according to claim 1, wherein the oxide semiconductor has a region with a hydrogen concentration of less than or equal to $2 \times 10^{20}$ atoms/cm$^3$.

6. The semiconductor device according to claim 1, wherein the oxide semiconductor has a region with a nitrogen concentration of less than $5 \times 10^{19}$ atoms/cm$^3$.

7. The semiconductor device according to claim 1, wherein the oxide semiconductor has a region with a silicon concentration of less than $1 \times 10^{19}$ atoms/cm$^3$.

8. The semiconductor device according to claim 2, wherein the oxide semiconductor has In, Zn, and M (M is Al, Ti, Ga, Y, Zr, La, Ce, Nd, or Hf).

9. The semiconductor device according to claim 2, wherein the oxide semiconductor has a region with a hydrogen concentration of less than or equal to $2 \times 10^{20}$ atoms/cm$^3$.

10. The semiconductor device according to claim 2, wherein the oxide semiconductor has a region with a nitrogen concentration of less than $5 \times 10^{19}$ atoms/cm$^3$.

11. The semiconductor device according to claim 2, wherein the oxide semiconductor has a region with a silicon concentration of less than $1\times10^{19}$ atoms/cm$^3$.

12. The semiconductor device according to claim 3, wherein the oxide semiconductor has In, Zn, and M (M is Al, Ti, Ga, Y, Zr, La, Ce, Nd, or Hf).

13. The semiconductor device according to claim 3, wherein the oxide semiconductor has a region with a hydrogen concentration of less than or equal to $2\times10^{20}$ atoms/cm$^3$.

14. The semiconductor device according to claim 3, wherein the oxide semiconductor has a region with a nitrogen concentration of less than $5\times10^{19}$ atoms/cm$^3$.

15. The semiconductor device according to claim 3, wherein the oxide semiconductor has a region with a silicon concentration of less than $1\times10^{19}$ atoms/cm$^3$.

16. The semiconductor device according to claim 1, wherein each of the channel length of the plurality of transistors are greater than or equal to 0.45 μm.

* * * * *